United States Patent
Kawamura et al.

[11] Patent Number: 6,077,027
[45] Date of Patent: Jun. 20, 2000

[54] SEMICONDUCTOR MANUFACTURING APPARATUS FOR TRANSFERRING ARTICLES WITH A BEARING-LESS JOINT AND METHOD FOR MANUFACTURING SEMICONDUCTOR DEVICE

[75] Inventors: Yoshio Kawamura, Kokubunji; Hideo Kashima, Kodaira; Shigeo Moriyama, Tama, all of Japan

[73] Assignee: Hitachi, Ltd., Tokyo, Japan

[21] Appl. No.: 09/289,677

[22] Filed: Apr. 12, 1999

Related U.S. Application Data

[63] Continuation of application No. 08/795,858, Feb. 6, 1997, Pat. No. 5,971,701.

[30] Foreign Application Priority Data

Feb. 9, 1996 [JP] Japan .................................. 8-023663

[51] Int. Cl.⁷ .................................................. B25J 17/00
[52] U.S. Cl. ................................... 414/744.5; 74/490.05; 901/28
[58] Field of Search ................................ 414/744.5, 939, 414/805, 806, 807, 808, 217; 901/15, 21, 23, 28, 29; 74/490.05, 490.04

[56] References Cited

U.S. PATENT DOCUMENTS

| | | |
|---|---|---|
| 4,730,967 | 3/1988 | Davis et al. . |
| 4,951,601 | 8/1990 | Maydan et al. . |
| 5,147,175 | 9/1992 | Tada . |
| 5,186,718 | 2/1993 | Tepman et al. . |
| 5,227,708 | 7/1993 | Lowrance . |
| 5,288,199 | 2/1994 | Enomoto . |
| 5,447,409 | 9/1995 | Grunes et al. . |
| 5,570,994 | 11/1996 | Somekh et al. . |
| 5,636,963 | 6/1997 | Haraguchi et al. . |
| 5,697,749 | 12/1997 | Iwabuchi et al. . |

FOREIGN PATENT DOCUMENTS

| | | |
|---|---|---|
| 60-183736 | 9/1985 | Japan . |
| 60-184678 | 9/1985 | Japan . |
| 61-87351 | 5/1986 | Japan . |
| 61-161608 | 7/1986 | Japan . |
| 61-278149 | 12/1986 | Japan . |
| 63-28047 | 2/1988 | Japan . |
| 63-252439 | 10/1988 | Japan . |
| 3-19252 | 1/1991 | Japan . |
| 3-234494 | 10/1991 | Japan . |
| 3-234495 | 10/1991 | Japan . |
| 4-87785 | 3/1992 | Japan . |
| 4-206547 | 7/1992 | Japan . |
| 4-279043 | 10/1992 | Japan . |
| 4-294984 | 10/1992 | Japan . |
| 6-15592 | 1/1994 | Japan . |
| 6-50402 | 2/1994 | Japan . |
| 6-132380 | 5/1994 | Japan . |
| 6-323332 | 11/1994 | Japan . |
| 7-1375 | 1/1995 | Japan . |

OTHER PUBLICATIONS

Y. Kawamura et al "A Wafer–Handling Interface That Operates Under Process Chamber Ambient Conditions", ISSM'96, Oct. 1996, pp. 117–120.

*Primary Examiner*—Donald W. Underwood
*Attorney, Agent, or Firm*—Beall Law Offices

[57] ABSTRACT

In order to manufacture a semiconductor device of high performance a small-sized transfer arm mechanism, capable of retaining a predetermined transfer stroke, is put to practical use without any increase in the height of the arm mechanism. The transfer arm includes arcuate portions having center axes different from each other, and restraint generating means for generating restraints in directions where the individual center axes are attracted. This way, a plurality of arms are joined by joints having a structure for transmitting rolling motions to the arcuate portions contacting each other to thereby control the drive shaft of the arcuate portions rotationally and thereby move the arms. This transfer arm mechanism is used in various environments including semiconductor manufacturing, such as DRAMs.

17 Claims, 29 Drawing Sheets

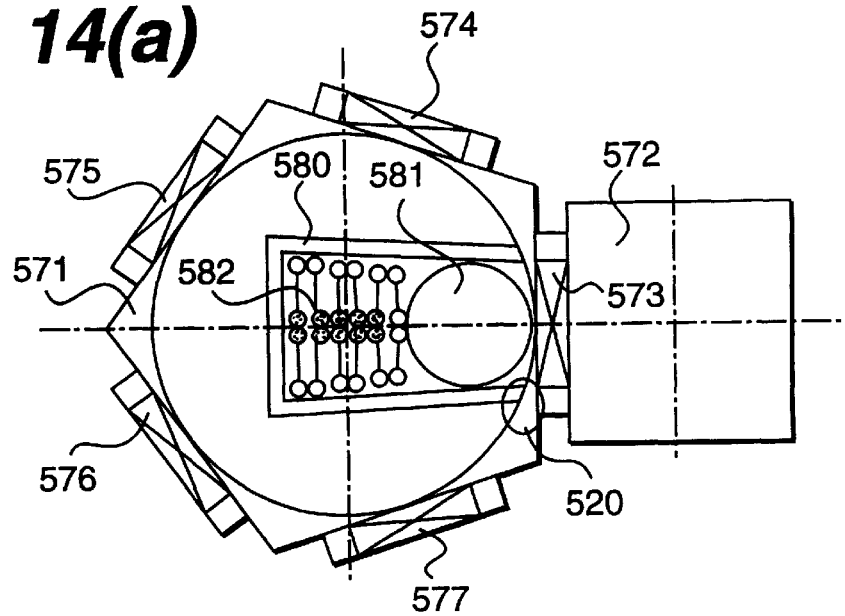
FIG. 14(a)
FIG. 14(b)
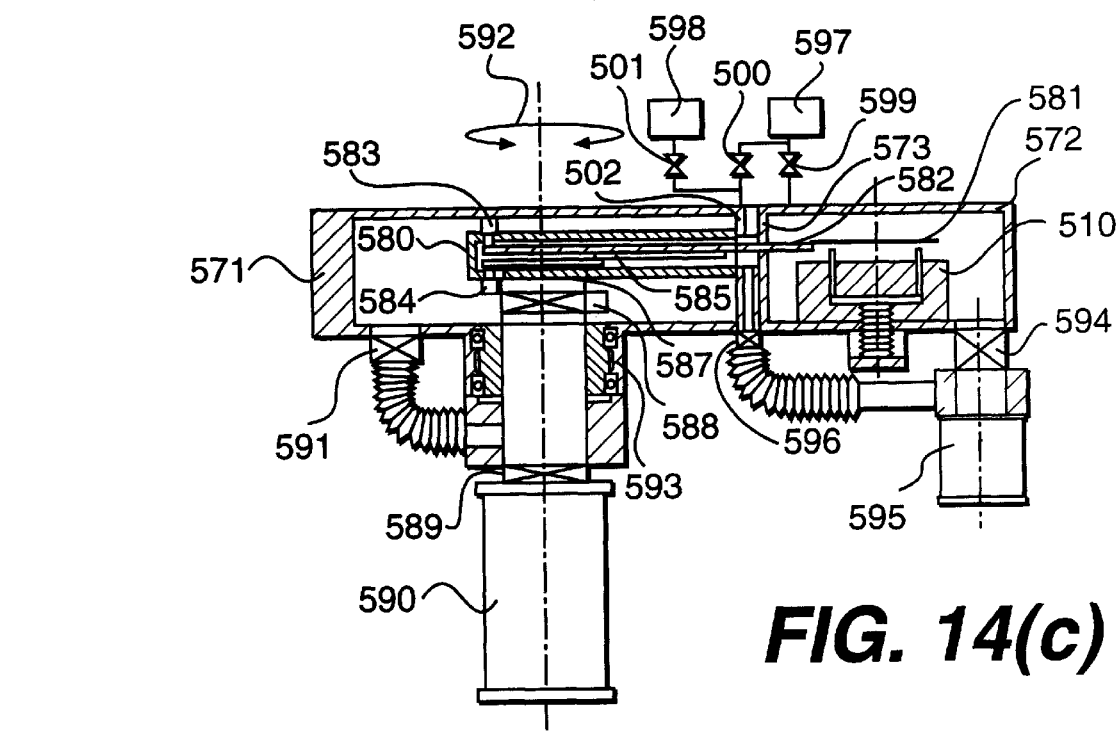
FIG. 14(c)

SEMICONDUCTOR MANUFACTURING APPARATUS FOR TRANSFERRING ARTICLES WITH A BEARING-LESS JOINT AND METHOD FOR MANUFACTURING SEMICONDUCTOR DEVICE

This is a continuation application of U.S. Ser. No. 08/795,858, filed Feb. 6, 1997, now U.S. Pat. No. 5,971,701.

FIELD OF THE INVENTION

The present invention relates to a method for manufacturing a semiconductor device and, more particularly, to a semiconductor manufacturing apparatus provided with a transfer chamber for connecting a plurality of process chambers under different kinds of ambient conditions. The present invention also relates to a method and apparatus for transferring substrates between the insides of the transfer chamber and the process chambers. A motion transmitting method and an articulated mechanism for realizing the transfer apparatus are also taught by the present invention.

BACKGROUND OF THE INVENTION

In semiconductor device manufacturing apparatuses which form patterns on the order of sub-microns, it is necessary to reduce the amount of dust, the amount of contamination and the size (or capacity) of the apparatuses. This is because the major cause of device defects results from the dust discharged from the apparatus and its periphery. Thus, the manufacturing apparatus is placed in a clean room, thereby resulting in higher cost of construction and maintenance.

It is known in the prior art that mechanisms are needed to transfer a substrate between a plurality of process chambers of the semiconductor manufacturing apparatus, which are connected under different kinds of ambient conditions. One such example is disclosed in Japanese Published Application No. 19252 (1991). This semiconductor manufacturing apparatus is constructed of first and second vacuum chambers having transfer arms therein, process chambers communicating individually with the vacuum chambers, and a plurality of vacuum process chambers. This transfer mechanism technique has multiple built-up arms and is mounted in an vacuum isolation type apparatus which is designed to have evacuating means for establishing a vacuum pressure gradient in those chambers.

On the other hand, Japanese Published Application No. 252439 (1988) discloses a multi-stage transfer mechanism disposed in a multi-process chamber system, which includes a central transfer chamber having an R-θ transfer arm, and in which different wafers are subjected simultaneously to the processes of chemical gas etching, chemical gas deposition, physical sputtering and rapid thermal treatment. Alternatively, similar wafers are subjected to various treatments in order in a plurality of process chambers adjacent to the central transfer chamber and having a uniaxial receiving transfer arm.

Japanese Published Application No. 87785 (1992) discloses a transfer mechanism technique having a multi-stage built-up structure using geared belts and pulleys as a central transfer arm of a multi-chamber treatment apparatus.

Japanese Published Application No. 28047 (1988) discloses a technique for transferring substrates by using movable portable chambers and extending/contracting the arms of a multi-stage structure. The arms of the multi-stage structure are built-up with their joints coaxially intersecting. Transfer ports of common specifications are connected to each other.

Japanese Published Application Nos. 161608 (1987) and 87351 (1986) disclose a transfer mechanism technique of using "frogger" arms which are driven by a pair of coaxial joints and timing belts.

Japanese Published Application Nos. 278149 (1986) disclose another technique of using "frogger" arms which have a pair of coaxial joints.

Japanese Published Application No. 183736 (1985) discloses a transfer mechanism technique which uses a handler having a pair of coaxial joints and a gear-driven arm.

Japanese Published Application No. 294984 (1992) discloses a transfer mechanism technique which uses elastic arms made of band-shaped spring members but does not have any slide portion.

Japanese Published Application No. 206547 (1992) discloses a transfer mechanism technique which transfers substrates without breaking a sealed state of the ambient in a sealed enclosure by connecting the sealed enclosure with a common port and then by opening/closing the gate valves of the common port.

Japanese Published Application No. 15592 (1994) discloses a transfer mechanism technique using "frogger" arms having coaxial rotary joints at the leading ends of a set of arms. The arms are capable of extending/contracting in opposite directions and are capable of being mounted with two substrates.

Japanese Published Application No. 184678 (1985) discloses a transfer mechanism technique for a vacuum process apparatus composed of process dedicated stationary vacuum enclosures and transfer dedicated movable vacuum enclosures so as to transfer substrates by connecting the process dedicated vacuum enclosures to each other through a common control gate and by moving the transfer dedicated vacuum enclosures linearly or rotationally.

SUMMARY OF THE INVENTION

In arriving at the present invention, the inventors recognized numerous problems with prior art methods and apparatuses. For example, in order to transfer the substrates between the process chambers, or the like, of the semiconductor manufacturing apparatus described above, transfer arms are extended/contracted to transfer substrates. The transfer arms of the prior art have a multi-stage joint structure in which the joints of the arms are coaxially built-up and intersected. This structure of built-up arms raises a first technical problem that the total height of the entire transfer arms cannot be reduced. Hence there further arises a second technical problem that there is limit to the reduction of the height of the insides of the process chambers or the vacuum enclosures, which is desirable in order to reduce the size of the semiconductor manufacturing apparatus.

Additionally, a suitable clearance, i.e. backlash, is necessary in order to use bearings to coaxially guide the joints of the transfer arms to be driven in a special ambient. Also, lubrication is necessary for such a special ambient. As a result, there arises a third technical problem in that the accuracy in positioning the leading ends of the transfer arms is reduced.

Furthermore, a lot of time is necessary in order to maintain, replace and adjust bearings, which are formed of very precisely. This raises a fourth technical problem in that the throughput of the semiconductor manufacturing apparatus decreases.

Moreover, since there is no convenience transfer system, the treated substrates cannot be cleanly transferred in a short time between the process chambers without being contaminated with various molecules and atoms, thereby degrading the performance of the semiconductor device. This raises a fifth technical problem in that production yield is lowered.

Specifically, the prior art basically has a structure such as that shown in FIG. 15. The rotational drive force from a drive source 106 to drive arms 102 is transmitted through a pair of coaxial joints 101 to driven arms 103 so that a substrate 105 mounted on a leading end arm 104 may be moved and transferred. Two different positions are shown in FIGS. 15(a) and 15(b). As shown in FIG. 15(c), the drive arms 102 and the driven arms 103 constitute a built-up structure through the coaxial joints 101. The total height h from the bottom of the initial arms to the top of the final arms is the sum of the heights of the individual arms and the clearances for allowing the joints to turn.

If each of the arms has a height t and if all the clearances between the jointed arms have a value d, the total height h is given by (2×t+d). In order to increase the transfer stroke, a plurality of or n driven arms are combined to construct a manipulator of multi-stage structure. In this multi-stage manipulator, the total height h is [n×t+(n−1)×d]. This raises the aforementioned first and second technical problems in that it is extremely difficult to reduce the overall size of the transfer mechanism.

On the other hand, as shown in FIGS. 16(a) and 16(b), a conventional cluster type vacuum process apparatus has a process chamber 213 and a plurality of other process chambers (not shown) arranged around a transfer chamber 202 having a transfer arm 201 capable of extending through a plurality of gate valves 203 to 210. This transfer arm 201 has a basic structure in which the rotational drive force from a drive source 226 is transmitted to drive arms 222 through a pair of concentric joints 221 to driven arms 223 thereby to move and transfer a substrate 225 mounted on a leading end arm 224. Different substrate positions are illustrated in FIGS. 16(a) and 16(b), respectively. The drive arms 222 and the driven arms 223 constitute a built-up structure having concentric joints 221 so that the total height h from the bottom of the initial arm to the top of the final arm is the sum of the heights of the individual arms and the clearances for turning the joints.

If each of the arms has a height t and if the joints have a clearance d, the total height h is given by (2×t+d). In order to provide a stroke L (i.e., the length the communication passage to the wafer mounting tables of a process chamber, including the gate valve width, or about three times the wafer diameter D, that is, L≧3×D) to the inside of the process chamber, the individual arms have to have at least a length no less than L/2 (about ≧3×D/2). As a result, the transfer chambers have a radius no less than L/2 (about the internal diameter of the transfer chamber ≧3×D). This raises a sixth technical problem that it is extremely difficult to reduce the size, i.e., the footprint (floor area), of the semiconductor manufacturing apparatus for handling a wafer or liquid crystal substrate, whose sizes have been increasing.

A transfer arm that has no coaxial joint, so as to avoid such multi-stage type of arm structure, uses an elastic arm composed of a band-shaped spring member, but has no joint. This type of structure is used for reducing the deflection of the arm composed of a long band-shaped spring member so that the band-shaped spring member has to be widened. As a result, the total height of the arm composed of the band-shaped spring member cannot be made lower than that of the transfer arms having concentric joints, thereby raising a seventh technical problem in that it is extremely difficult to reduce the size of the semiconductor manufacturing apparatus. Because of this structure, in which the support is provided by using the long spring member, the transverse rigidity is lowered, thereby increasing the setting time period of the leading end of the transfer arm after being moved and raising an eighth technical problem that the overall throughput is lowered.

By using any of the transfer arms of the prior art, as described above, it is not easy to reduce the size of the semiconductor manufacturing apparatus in order to increase the capacities of the process chambers and the transfer chambers. As a result, it takes a long time to evacuate the chambers, to exhaust the special ambient gas and to reset the processing ambient for repeating the various treatments of the wafers or substrates, thereby raising a ninth technical problem in that the throughput is lowered.

There is also the fear that the aforementioned third technical problem will occur in that the positioning accuracy or the position setting characteristics are lowered due to the backlash of the bearings used in the concentric joints. Also, there is a tenth technical problem in that the positioning accuracy and the position setting characteristics are lowered due to the drop in the rigidity due to the long belt drive as well as the contamination caused by dust. As a result, maintenance for retaining reliability is frequently required, and the time required for maintenance is long, thereby raising an eleventh technical problem in that it is difficult to raise the throughput of the semiconductor manufacturing process.

The present invention has been developed to solve the above-specified various technical problems and has an object to provide a method for manufacturing a semiconductor device by transferring a substrate with a high throughput, without contaminating the substrate or wafer, between transfer chambers and process chambers under different ambient conditions, a semiconductor manufacturing apparatus therefor, a method and apparatus for transferring the substrate, a motion transmitting method and an articulated mechanism, and a semiconductor device of high performance at a low cost.

In order to achieve the above-specified object of the present invention, a motion transmitting method is provided in which the individual center axes of two or four arcuate portions are arranged not linearly but in parallel with one another. A second arcuate portion is circumscribed about a first arcuate portion, and the contacting arcuate portions are rotatable in a reversible manner with each other by creating restraint for causing the contacting arcuate portions to attract to each other in a direction perpendicular to the center axes thereof.

There is further provided an articulated mechanism for transmitting the turning motion of a first arm to the turning motion of at least one second arm and for holding the center axes of the joints of the individual arms in parallel, wherein the joints of the individual arms are concentrically constructed of arcuate portions and cylindrical portions. The arcuate portion of the joint of the second arm is circumscribed about the arcuate portion of the joint of the first arm. Winding components extend in a cross shape appearance in the direction of a tangent which touches the cylindrical portions between the cylindrical portions of the joints and are securedly wound around the individual cylindrical portions. The turning motion of the joint of the first arm on the center axis is transmitted to the reverse turning motion of the second arm contacting at the arcuate portions with the first arm by using the winding components as transmission media.

There is further provided a transfer method using a transfer apparatus having an articulated mechanism for transmitting the turning motion of one arm to the turning motion of at least one of the other arms and for holding the turning center axes of the joints of the individual arms in parallel. The articulated mechanism including joints of individual arms composed concentrically of arcuate portions and cylindrical portions. The arcuate portion of the joint of one arm and the arcuate portion of the joint of at least one of the other arms are circumscribed by each other, and winding components extend in a cross shape appearance in the direction of a tangent which touches the cylindrical portions between the cylindrical portions of the joints of the arms contacting at the arcuate portions with each other. The winding components are securedly wound around the individual cylindrical portions. One end of a first arm is joined to one end of a second arm by the articulated mechanism. The other end of the first arm is joined to one end of a third arm by the articulated mechanism. The other end of the second arm is joined to one end of a fourth arm by the articulated mechanism. The other end of the third arm is joined to the other end of the fourth arm by the articulated mechanism. A leading arm, mounted with an article to be transferred, is joined to the joint between said third arm and said fourth arm. The transfer method using this transfer mechanism comprises the steps of driving a drive shaft disposed at the center of the joint of one end of the first arm by a drive source, rotatingly holding a drive shaft disposed at the center of the joint of one end of the second arm in a predetermined position, and interlockingly moving the individual arms by rotating the drive shaft so as to move the leading end arm mounted with a substrate to be transferred.

There is further provided a transfer apparatus wherein an articulated mechanism for transmitting the turning motion of one arm to the turning motion of at least one of the other arms and for holding the turning center axes of the joints of the individual arms in parallel includes the following: the joints of the individual arms made concentrically of arcuate portions and cylindrical portions, the arcuate portion of the joint of one arm being circumscribed by the arcuate portion of the joint of at least one of the other arms; and winding components extending in a cross shape appearance in the direction of the tangent which touches the cylindrical portions between the cylindrical portions of the joints of said arms contacting at said arcuate portions with each other, and securedly wound around the individual cylindrical portions from the contact positions, said arms acting as a plurality of components being joined by said articulated mechanism, said transfer apparatus comprising:

a first arm and a second arm jointed at their one ends to each other by said articulated mechanism; a drive shaft disposed at the center of the joint on one end side of said first arm and said second arm; a drive source for driving said drive shaft; a third arm joined at its one end to the other end of said first arm by said articulated mechanism; a fourth arm joined at its one end to the other end of said second arm by said articulated mechanism, the other ends of said third arm and said fourth arm being joined by said articulated mechanism; and a leading end arm joined to said joint portion and mounted with a substrate to be transferred.

There is further provided a transfer apparatus wherein an articulated mechanism for transmitting the turning motion of one arm to the turning motion of at least one of the other arms and for holding the turning center axes of the joints of the individual arms in parallel includes the following: the joints of the individual arms constructed concentrically of arcuate portions and cylindrical portions, the arcuate portion of the joint of one arm being circumscribed by the arcuate portion of the joint of at least one of the other arms; and winding components extending in a cross shape appearance in the direction of the tangent which touches the cylindrical portions between the cylindrical portions of the joints of said arms contacting at said arcuate portions with each other, and securedly wound around the individual cylindrical portions, said arms acting as a plurality of components being jointed by said articulated mechanism, wherein said transfer apparatus comprises:

a first arm and a second arm joined at their one ends to each other by said articulated mechanism;

a drive shaft disposed at the center of the joint on one end side of said first arm and said second arm;

a drive source for driving said drive shaft; a third arm joined at its one end to the other end of said first arm by said articulated mechanism;

a fourth arm joined at its one end to the other end of said second arm by said articulated mechanism, the other ends of said third arm and said fourth arm being joined by said articulated mechanism;

a fifth arm joined at its one end to the other end of said third arm by said articulated mechanism; a sixth arm joined at its one end to the other end of said fourth arm by said articulated mechanism, the one ends of said fifth arm and said sixth arm being joined by said articulated mechanism; a seventh arm joined at its one end to the other end of said fifth arm by said articulated mechanism; an eighth arm joined at its one end to the other end of said sixth arm by said articulated mechanism, the other ends of said seventh arm and said eighth arm being joined by said articulated mechanism; and a leading end arm joined to said joint portion and mounted with a substrate to be transferred.

There is further provided a method for manufacturing a semiconductor device, featured as follows: a process chamber for treating a semiconductor wafer and a transfer chamber connected to said process chamber are provided; said transfer chamber is connected to a desired one of said process chamber while being isolated from the external ambient; and said semiconductor wafer is transferred into or out of said process chamber by using a transfer robot arm disposed in said transfer chamber and having a bearing-less articulation.

There is further provided a method for manufacturing a semiconductor device, featured as follows: a process chamber is provided for treating a semiconductor wafer and a transfer chamber connected to said process chamber; a movable buffer chamber is provided in said transfer chamber; a transfer robot arm composed of a bearing-less articulation is disposed in said buffer chamber; and said buffer chamber is moved to a desired process chamber and positioned in a confronting position; and said semiconductor wafer is transfer into or out of said process chamber by using said transfer robot arm.

There is further provided a manufacturing method including the step of transferring a substrate sequentially from one process chamber to another by repeating the step of moving a leading end arm portion mounted with the substrate, the step of transferring the substrate to dispose it in the process chamber confronting a buffer chamber thereby to subject said substrate to a predetermined treatment, and the step of transfer the processed substrate from said process chamber to another process chamber thereby to subject said substrate to a predetermined treatment, by a motion transmitting method in which the individual center axes of two to four arcuate portions are arranged in a transfer chamber not in line but in parallel with one another, a second arcuate portion circumscribed about a first arcuate portion, and a motion is transmitted to an articulation in a manner that the contacting arcuate portions can roll reversely of each other by producing restraint for causing the contacting arcuate portions to attract each other in a direction perpendicular to the center axes thereof.

There is further provided a semiconductor manufacturing apparatus having one or more process chambers adjacent to each other under different ambient conditions and a transfer chamber, comprising: arcuate means including two to four arcuate portions having their individual center axes not in line but in parallel, at least the second arcuate portion being circumscribed about the first arcuate portion; restraint means for producing restraints for causing the contacting arcuate portions to attract each other in a direction perpendicular to the center axes thereof; and substrate transfer means having a motion transmission mechanism for rolling the contacting arcuate portions in the reverse directions.

There is further provided a manufacturing method including a step of repeating the process for adding functions of a semiconductor device by transmitting a motion to transfer a substrate sequentially from a process chamber to another, while maintaining the ambient of the individual process chambers and the ambient of a transfer chamber independently of each other, in a manner to roll in a reverse manner with respect to each other, in such a way that the intersections of winding components which are made concentric with each other when viewed in the direction of the center axes of said joints, contact with the portions of the side faces of said cylindrical portions having a smaller radius than that of said arcuate portions, and have a shape of letter S appearance generally symmetric in the opposite directions substantially coincide with the mutually circumscribed portions of said arcuate portions.

There is further provided a liquid crystal panel manufactured by a method including at least a thin film transistor preparing step of subjecting a substrate to at least two treatments of a plasma cleaning process and a forming process of silicon-nitride, amorphous-silicon, doped amorphous-silicon, silicon dioxide and oxide-nitride, by transmitting a motion to convey a substrate sequentially from a process chamber to another, while maintaining the ambient of the individual process chambers and the ambient of a process chamber independently of each other, in a manner to roll in a reverse manner with respect to each other, in such a way that the intersections of winding components which are made concentric with each other when viewed in the direction of the center axes of said joints, contact with the portions of the side faces of said cylindrical portions having a smaller radius than that of said arcuate portions, and have a shape of letter S appearance generally symmetric in the opposite directions substantially coincide with the mutually circumscribed portions of said arcuate portions.

There is further provided an engineering material manufactured by a method including a step of imparting a material characteristic gradient to a composite material containing at least two components such as metal and resin, by transmitting a motion to transfer a substrate sequentially from a process chamber to another, in such a way that the intersections of winding components which are made concentric with each other when viewed in the direction of the center axes of said joints, contact with the portions of the side faces of said cylindrical portions having a smaller radius than that of said arcuate portions, and have a shape of letter S appearance generally symmetric in the opposite directions substantially coincide with the mutually circumscribed portions of said arcuate portions.

The following functions are achieved by the present invention which solves the above-identified problems.

Because of the motion transmitting method in which the individual center axes of two or four arcuate portions are arranged not linearly but in parallel with one another, a second arcuate portion is circumscribed about a first arcuate portion, and a motion is transmitted to an articulation in a manner that the contacting arcuate portions can roll in a reverse manner with respect to each other, by establishing restraints for causing the contacting arcuate portions to attract each other in a direction perpendicular to the center axes thereof, a plurality of arms can be jointed to each other without being built-up, so that the total height of all the arms can be equalized to the height of one arm. As a result, a transfer arm movable by a desired stroke and having a minimum height can be designed and put to practical use.

Moreover, since the total height is not increased even if a plurality of arms are connected, it is possible to realize a transfer arm mechanism which is constructed by connecting a number of short arms but has a long transfer stroke. As a result, the internal diameter of the transfer chamber having the transfer arms therein can be easily reduced.

Additionally, the arcuate portions are allowed to roll in contact with each other by the restraints attracting the arcuate portions to each other in the direction perpendicular to the center axes, so that no backlash is caused in the joints of the arms. As a result, the accuracy of positioning the transfer arms can be improved, and the time period taken to set the positioning can be shortened to improve the throughput.

Furthermore, the total length of the winding components for producing the restraints attracting the arcuate portions to each other is shortened and the winding components are wound around the cylindrical portions, so that a high rigidity is achieved against the bending deformation of the arms as a whole. As a result, the setting characteristics entailed by the movement of the arms are improved to improve the positioning control characteristics of the arm leading ends, so that the throughput can be easily improved by the fast movement and the quick setting.

Because of the structure in which the arcuate portions are allowed to roll in contact with each other without slipping due to the restraints acting between the center axes, the reliability of the transfer system is improved without dusting due to the sliding abrasion, and the interval between maintenances can be increased to improve the working ratio and accordingly the throughput. At the time of adjusting the magnitude of the restraints for causing the arcuate portions to contact with each other, no special fine adjustment is required so that the maintenance can be facilitated and the time taken for the maintenance work can be short, thereby improving throughput.

As a result, it is possible to provide, at a reasonable cost, a semiconductor manufacturing apparatus capable of transferring a substrate with a high throughput between a process chamber and a treatment chamber under different ambient conditions without contaminating the substrate or wafer. It is also possible to provide a substrate transferring method for realizing the apparatus and a semiconductor device of high performance free from contamination of the substrate.

These and other objects, features and advantages of the present invention will become clearly apparent in view of the following detailed description of the preferred embodiments.

BRIEF DESCRIPTION OF THE DRAWINGS

FIGS. 14(a)–14(c) (collectively FIG. 14) are schematic diagrams showing a process apparatus according to a seventh embodiment of the present invention.

DETAILED DESCRIPTION OF THE PREFERRED EMBODIMENTS

Figure 1A:
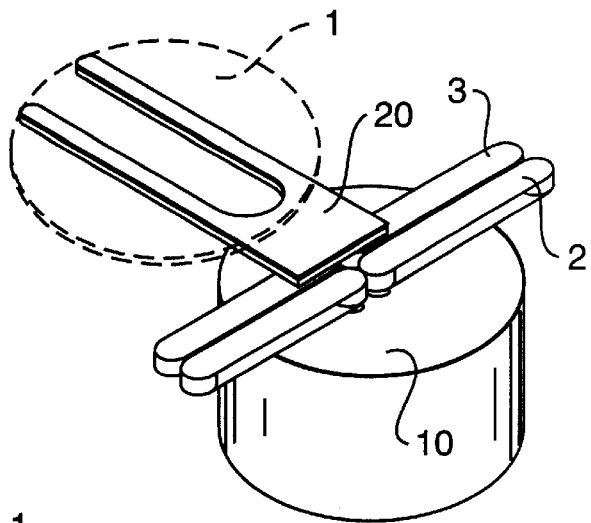
FIGS. 1(a)–1(c) (collectively FIG. 1) are schematic diagrams showing an apparatus according to a first embodiment of the present invention.

The preferred embodiments of the present invention will now be described with reference to the accompanying drawings. In the drawings, similar elements will be identified by using the same reference numerals.

Figure 1B:
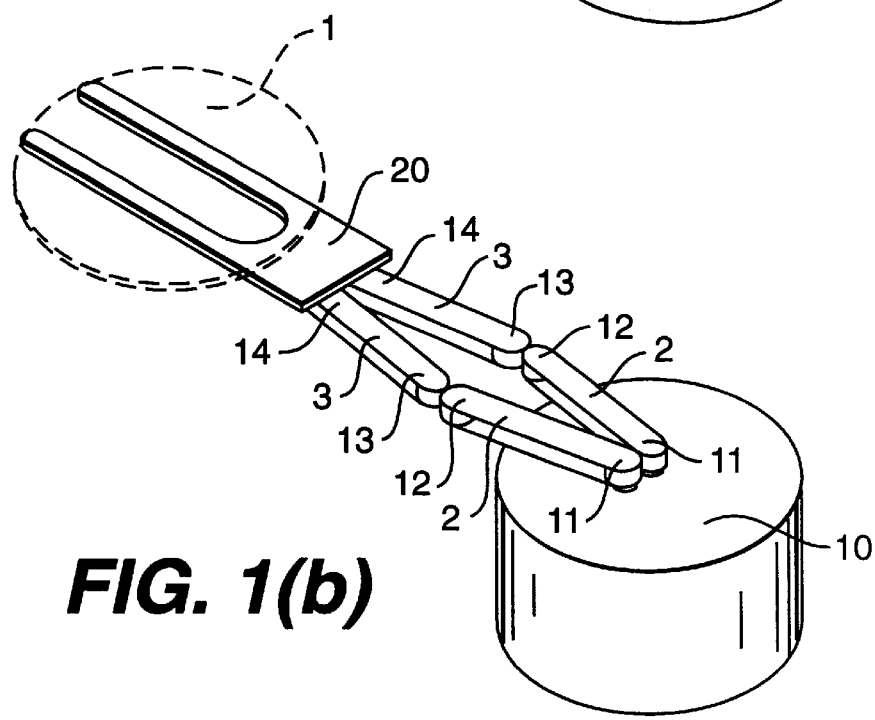
Figure 1C:
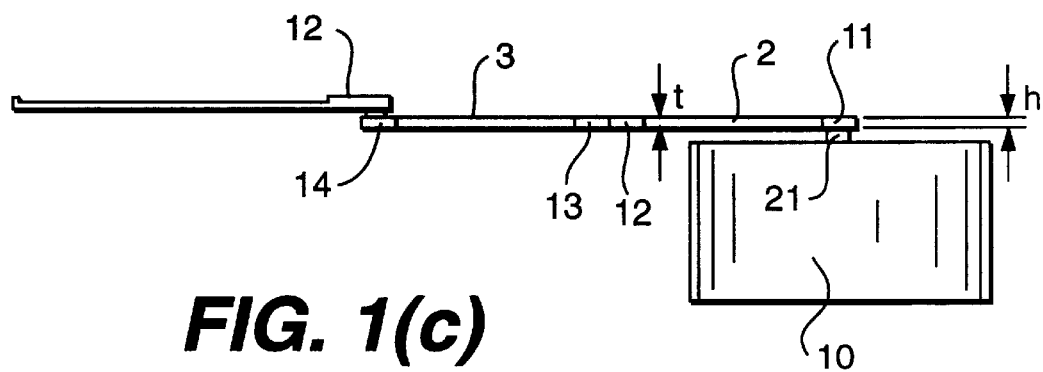

FIGS. 1(a)–1(c) illustrate schematic diagrams of one embodiment of the present invention. FIG. 1(a) is a perspective view showing a state in which the arms of a transfer arm are contracted; FIG. 1(b) is a perspective view showing a state in which the arms are extended; and FIG. 1(c) is a side elevation showing a state in which the arms are extended. These figures illustrate the following elements: a drive source 10; a pair of drive arms 2; a pair of driven arms 3; arcuate portions 11, 12, 13 and 14 joining the individual arms; and a leading end arm 20, which transfers a wafer 1 horizontally.

Figure 2A:
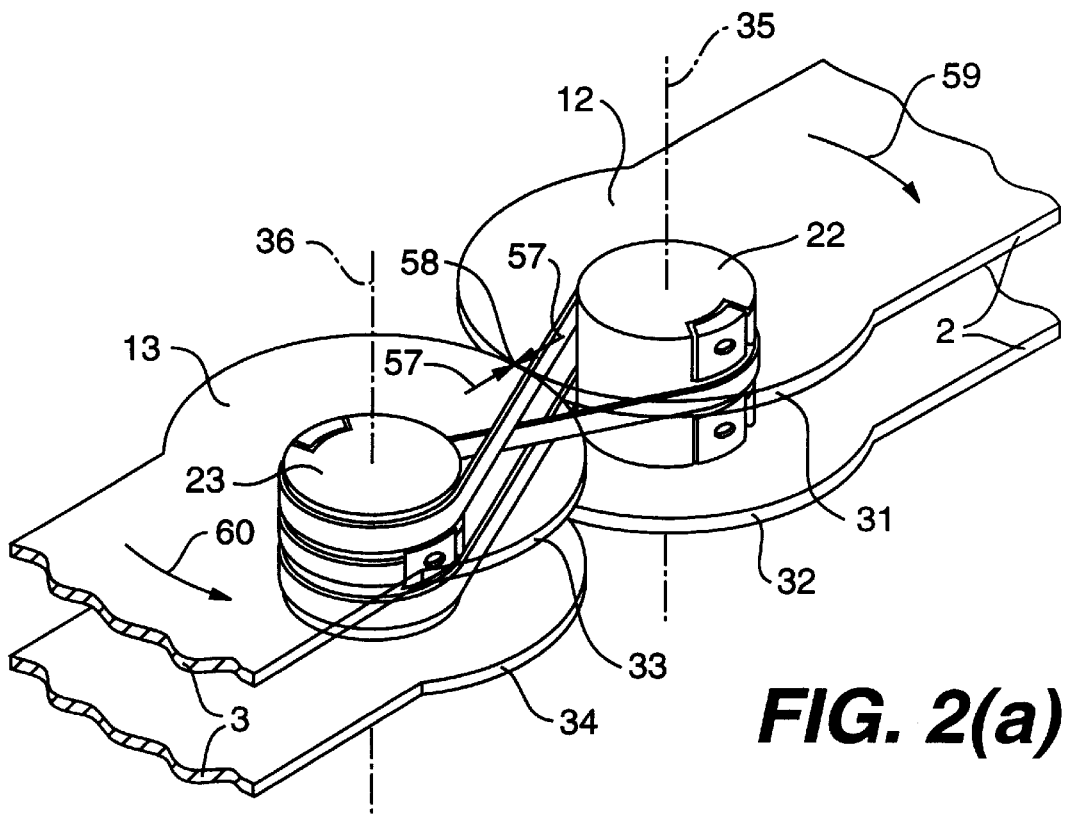
FIGS. 2(a) and 2(b) (collectively FIG. 2) are schematic perspective views showing one embodiment of the joint of the arcuate portions according to the present invention.
Figure 2B:
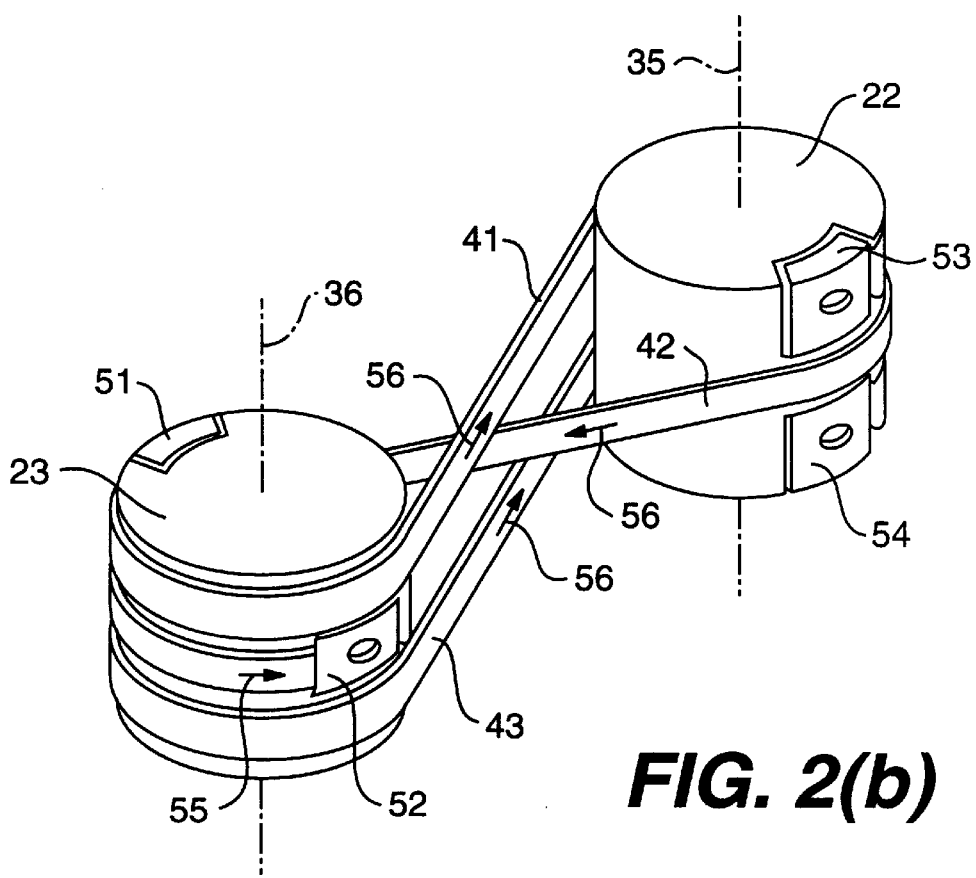

FIGS. 2(a) and 2(b) show one example of a perspective view showing an enlarged portion of the joints, in which the arcuate portions of the two ends of the individual arms come into contact with each other. In FIG. 2(a), the arcuate portion 12 having a center axis 35 located generally at one end of the arm 2 is given an articulated structure which includes: an upper arcuate portion 31, a lower arcuate portion 32, and a cylindrical portion 22 interposed between those two arcuate portions, sharing the center axis 35, and having a smaller diameter than that of the two arcuate portions. Likewise, the arcuate portion 13 having a center axis 36 located at the other end of the arm 3 is given a structure which includes an upper arcuate portion 33, a lower arcuate portion 34, and a cylindrical portion 23 interposed between the two arcuate portions, sharing the center axis 36, and having a smaller diameter than that of the two arcuate portions.

As seen from the major portions of the cylindrical portions, in FIG. 2(b), band-shaped winding components 41, 42 and 43 are alternately wound generally in the shape of letter S appearance around the cylindrical portions 22 and 23. The two ends of the individual winding components are fixed under tension on the fixing jigs 51, 52, 53 and 54 (although not completely shown) or on the portions of the near arm members (not shown). According to one method of tensioning the three winding components, the upper and lower winding components 41 and 43 are first fixed. Then, the fixing jigs are adjusted with one end of the reverse winding component 42 being fixed so that the tension is applied in the direction of arrow 55 of FIG. 2(b). As a result, a tension, as indicated by arrow 56, is applied to each winding component and the restraints which cause the center axes 35 and 36 of the arcuate portions to attract each other are applied to the arcuate portions, as indicated by arrow 57, to bring the arcuate portion 31 and the arcuate portion 33 into abutment at a circumscribing portion 58. Simultaneously, the arcuate portion 32 and the arcuate portion 34 also come into contact with each other at circumscribing portions (not shown).

Advantageously, with this structure, if the arm 2 is turned in the direction indicated by arrow 59, for example, their contacting arcuate portions roll without any slip so that the arm 3 is turned in the direction indicated by arrow 60. It is desirable in terms of rolling efficiency that the positions of those circumscribed portions and the positions at which the winding components 41 and 42 intersect and the winding components 42 and 43 intersect are all aligned with each other when viewed in the direction of the center axes of the arcuate portions. In this state, it is possible to minimize the change of the tension applied to the winding components caused by the rolling.

As a result of the motion transmitting method constructed in the manner disclosed above, a first feature of the present invention is achieved in that a transfer arm having smoothly rolling and moving arms can be provided without application of any lubricant. As a result, the transfer arms can be joined without any motion transmitting means such as bearings requiring lubrication, thereby providing a second feature of the present invention that the reliability of the vacuum and the process gas ambient can be remarkably improved.

Incidentally, the practical ambient pressure for the transfer mechanism of the prior art requiring lubrication or the like is limited to 10E−6 Torr. On the other hand, the articulated mechanism of the present invention can be used under a vacuum ambient pressure on the order of 10E−8 to 10E−10 Torr. As a result, there is attained a feature that the amount of fine particles of less than 0.1 microns, which may raise a problem in the manufacture of the semiconductor device of high performance using fine patterns, can be reduced by a factor of 1/10 to 1/10000.

Figure 3A:
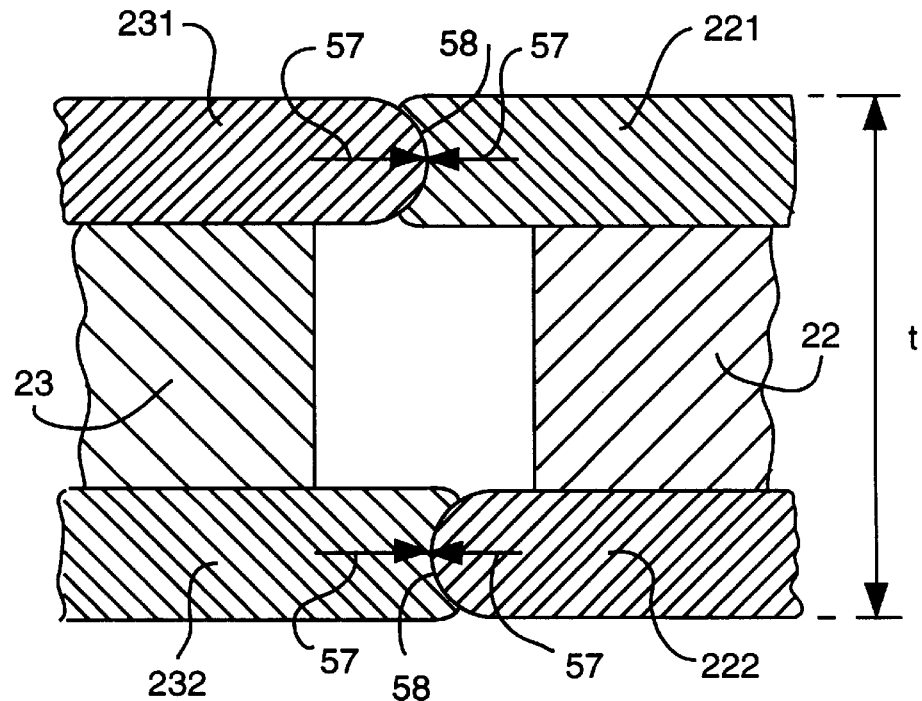
FIGS. 3(a)–3(d) (collectively FIG. 3) are schematic sections showing side faces according to different embodiments of the joint of the arcuate portion of the present invention.
Figure 3B:
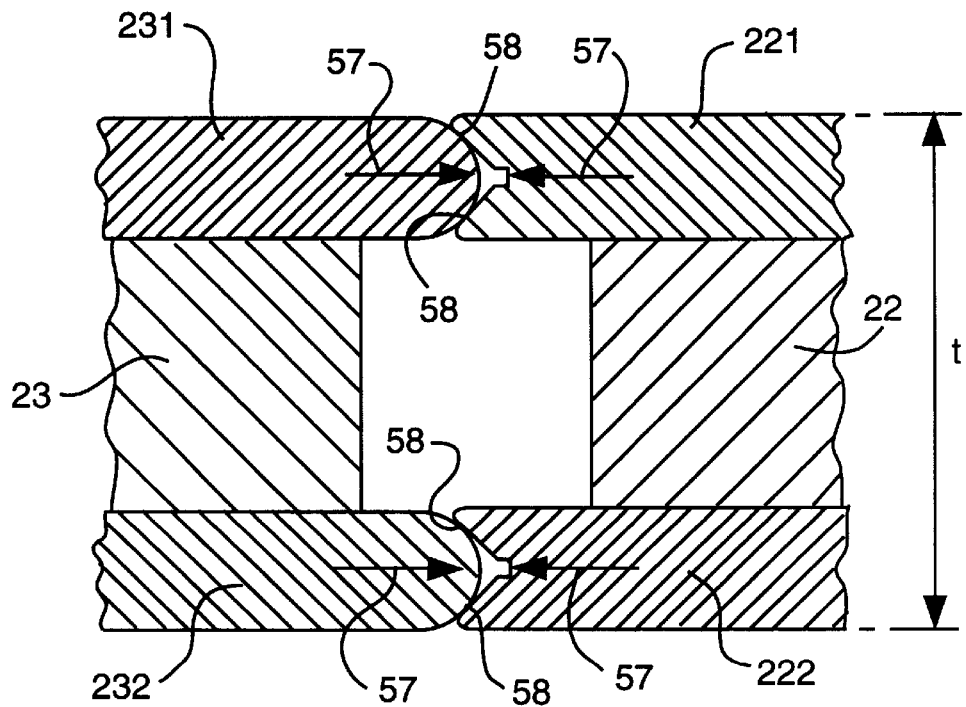

FIGS. 3(a)–3(d) show four examples, in which the side section of the joint at which the arcuate portions at the ends of the arms are in contact with each other are partially enlarged. The restraints produced by the not-shown tensioned winding components wound around the cylindrical portions 22 and 23 act, in the direction indicated by arrow 57, on arcuate portions 221 and 231 and arcuate portions 222 and 232, allowing them to roll without any slip at the circumscribed portions 58. The sectional shapes of the rolling faces of the end faces of the mutually circumscribed arcuate portions are in to form of a recess and a projection, and hence the positional displacements of the arcuate portions in the direction of the center axes, i.e., in the vertical direction can be prevented during the rolling. Thus, this provides a third feature of the present invention in that the leading end of the transfer arm can be highly accurately positioned. The recess-and-projection sectional structure is exemplified by a convex and concave structure having a semi-arcuate shape, as shown in FIG. 3(a), and by the semi-arcuate convex portions and the chamfered concave portions, as shown in FIG. 3(b). Incidentally, a combination of the sectional structure of the arcuate portions of the arms and the recess-and-projection mating may be vertically inverted, as shown in FIG. 3(a), or vertically identical, as shown in FIG. 3(b). In other words, one arm may have one recess shaped arcuate portion and one projection shaped arcuate portion. Despite of this fact, however, the radii of the circumscribed portions are preferably identical.

Figure 3C:
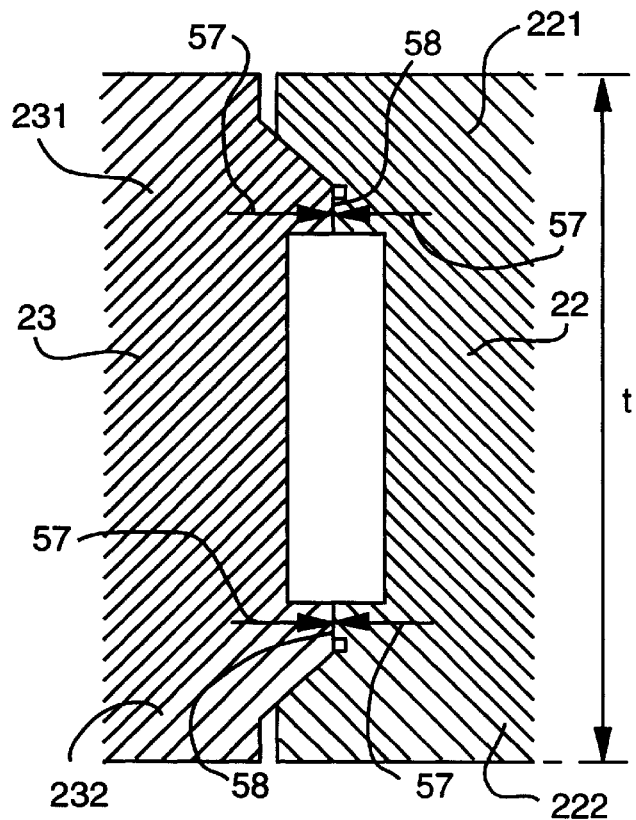
Figure 3D:
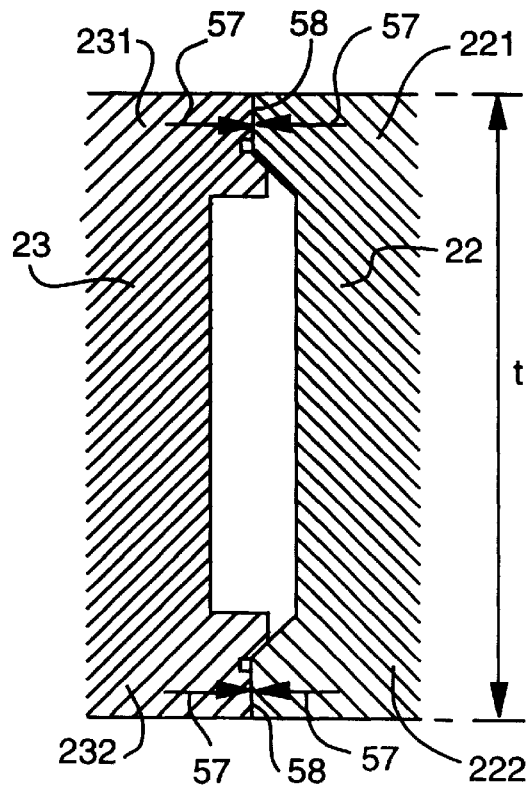

FIGS. 3(c) and 3(d) show two examples in which the side section of the joint has a tapered portion at either the outside or inside portions of the arcuate portions. Such a design may be easier to manufacture and the overall height t can be reduced. The radii of the cylindrical portions 22 and 23 are equal as are the radii of arcuate portions 222 and 232 where they touch each other. In FIG. 3(c), circumscribed portion 58 is positioned inside the tapered portion, or in other words close to the inside portions of the arcuate portions. Conversely, in FIG. 3(d), circumscribed portion 58 is positioned outside the tapered portion and thus is close to the outside of the arcuate portions. Since, circumscribed portion 58 can be designed to be as large as needed, a structure that can be strongly resistant to a bending moment can be provided. The tapered portions can easily be designed as arcuate surface portions.

Figure 15A:
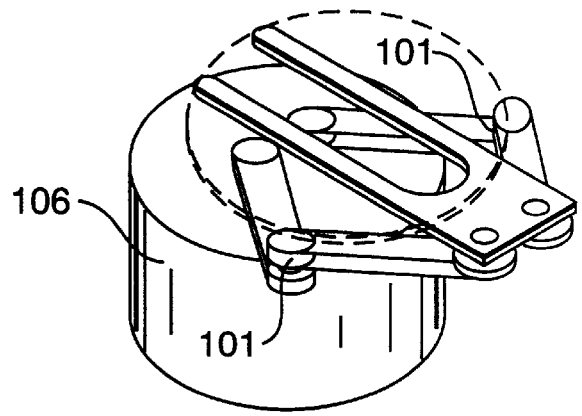
FIGS. 15(a)–15(c) (collectively FIG. 15) are schematic perspective views showing a transfer arm known in the prior art.
Figure 15B:
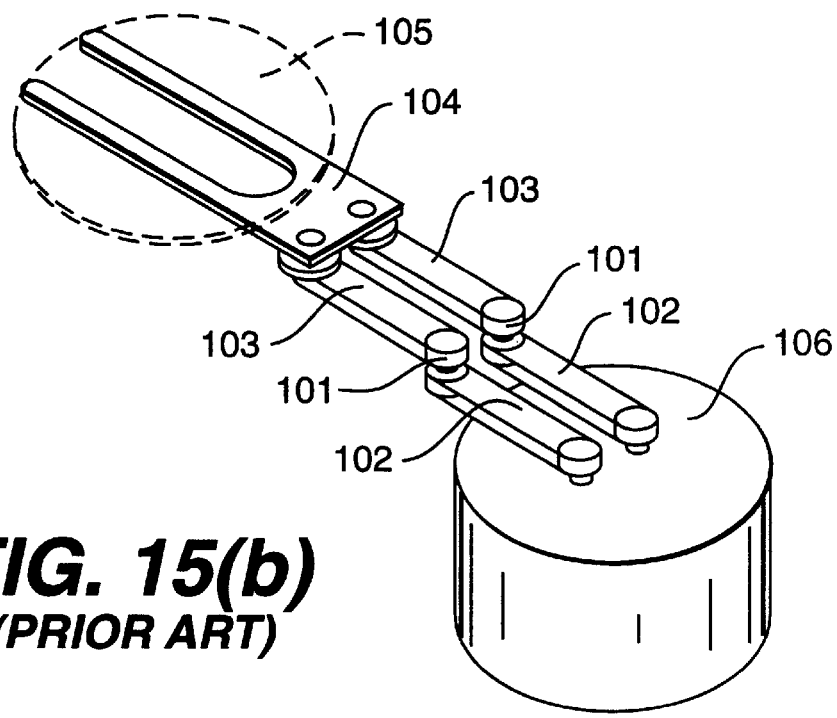
Figure 15C:
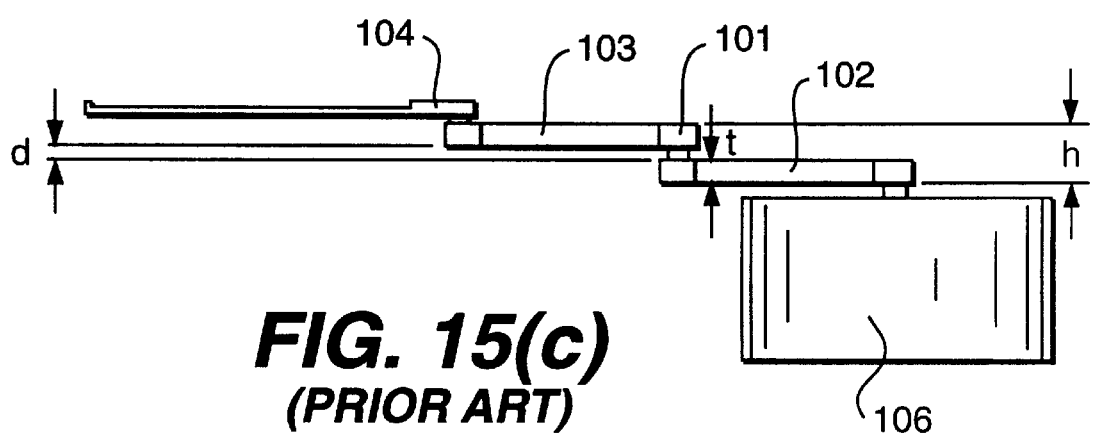

As can be seen from the discussion above, if the arm 2 and the arm 3 have a height distance t, the distance between the bottom and top of the jointed arms, i.e., the total height h is equal to the value t, as shown in FIG. 1(c). This result is smaller than the total height h=(2×t+d) of the example of the prior art, as shown in FIG. 15(c). As a result, a fourth feature of the present invention is achieved in that transfer arms in which two arcuate portions are joined as described can easily be made in a very small size.

Incidentally, the same structure as that shown in FIGS. 2 and 3 can be applied to the structure of paired arcuate portions 11, where paired arms 2 are joined, as well as the structure of paired arcuate portions 14, where paired arms 3 are joined.

Figure 4A:
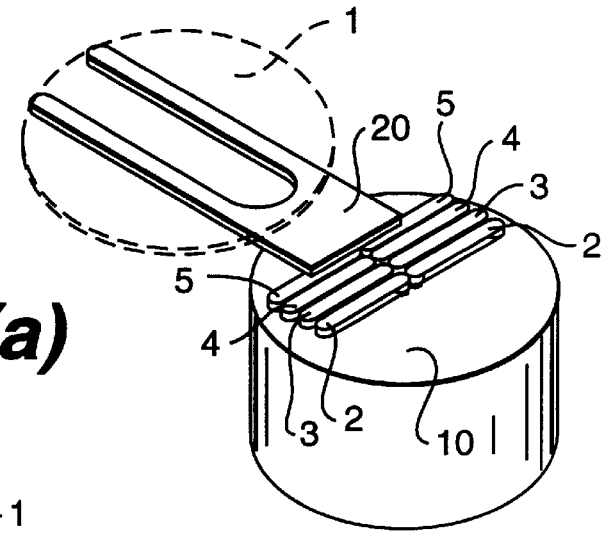
FIGS. 4(a)–4(c) (collectively FIG. 4) are schematic diagrams showing an apparatus according to a second embodiment of the present invention.
Figure 4B:
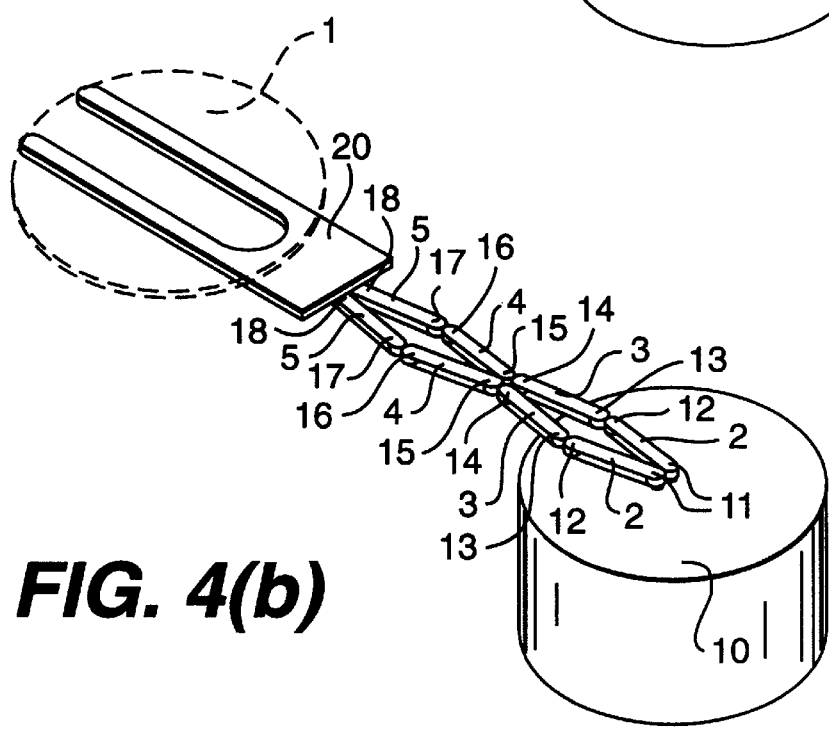
Figure 4C:
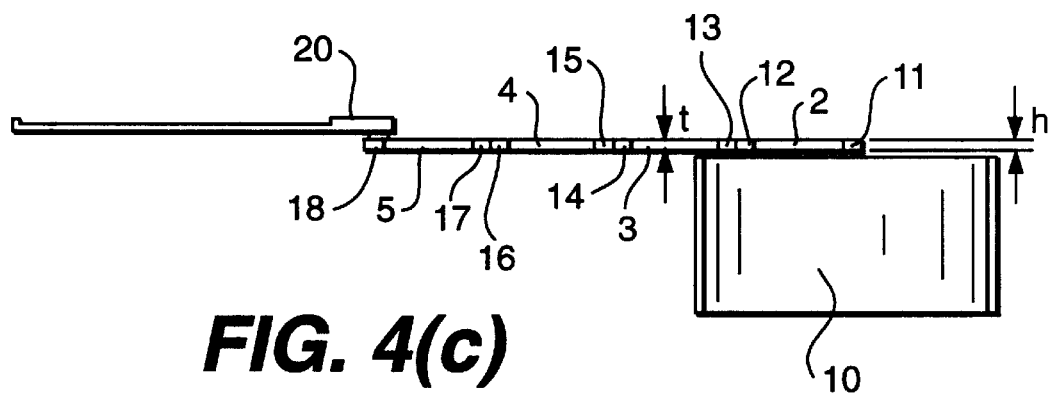

FIGS. 4(a)–4(c) are schematic diagrams showing an apparatus according to a second embodiment of the present invention. A plurality of arms each having a length of about one half of that of the first embodiment of FIG. 1 are jointed to reduce the lateral width of the transfer arm to about one half, while still achieving a transfer stroke similar to that of the first embodiment shown in FIG. 1. FIG. 4(a) is a perspective view showing a state in which the arms of the transfer arms are contracted; FIG. 4(b) is a perspective view showing a state in which the arms are extended; and FIG. 4(c) is a side elevation showing a state in which the arms are extended. This embodiment illustrates the following elements: a drive source 10, a pair of drive arms 2; a pair of driven arms 3; driven arms 4 and 5 receiving the motions of the drive arms; arcuate portions 11, 12, 13, 14, 15, 16, 17 and 18 joining the individual arms; and a leading end arm 20, so as to transfer the wafer 1 or the like horizontally. Specifically, a fifth feature of the present invention is achieved in that the width occupied transversely with respect to the advancing direction of the leading end arm can be reduced without reducing the transfer stroke of the transfer arm and without reducing the total height of the transfer arm. Incidentally, the structure of the arcuate portions 11, 12, 13, 16, 17 and 18 joined by the paired arms can be one similar to that of the embodiments shown in FIGS. 2 and 3, but the joints, at which the two pairs of arcuate portions 14 and 15 joined by the two pairs of arms 3 and arms 4 come into contact, have a structure which will be described with reference to FIG. 5.

Figure 5A:
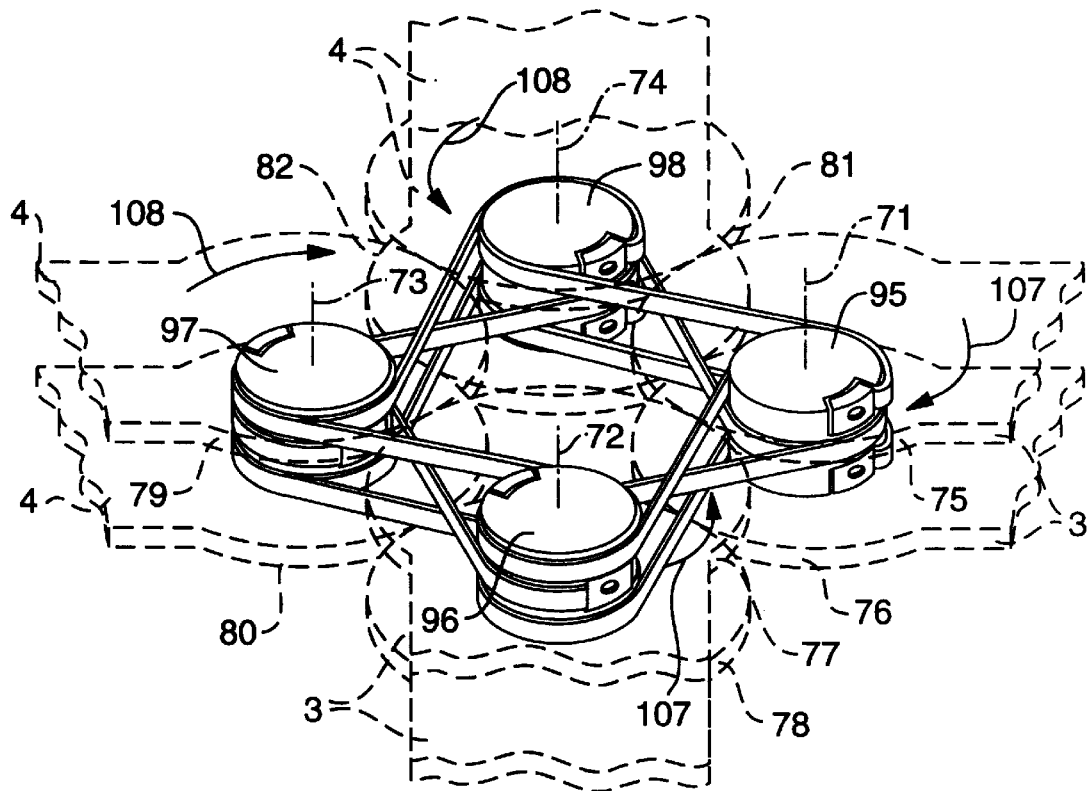
FIGS. 5(a) and 5(b) (collectively FIG. 5) are schematic perspective views showing one embodiment of a joint of an arcuate portion of the present invention.
Figure 5B:
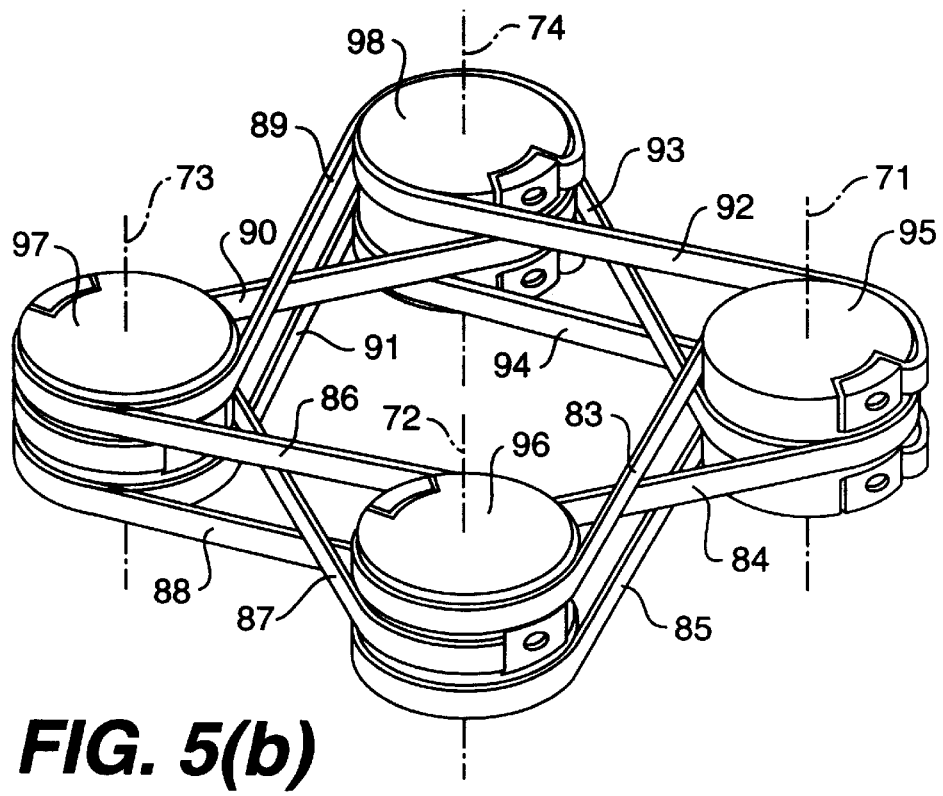

FIGS. 5(a) and 5(b) are schematic perspective views showing one embodiment of the present invention of the portion at which four arcuate portions are joined. As shown in FIG. 5(a), the arcuate portion provided at one end of the arm and having a center axis 71 is composed of an upper arcuate portion 75, a lower arcuate portion 76, and a cylindrical portion 95 which shares the center axis 71 with those two arcuate portions, has a smaller radius than that of the two arcuate portions, and is interposed between the two arcuate portions. Likewise, the arcuate portion provided at one end of the other arm 3 and having a center axis 72 is composed of an upper arcuate portion 77, a lower arcuate portion 78, and a cylindrical portion 96 which shares the center axis 72 with those two arcuate portions, has a smaller radius than that of the two arcuate portions, and is interposed between the two arcuate portions. Moreover, the arcuate portion provided at one end of the arm 4 and having a center axis 73 at one end of the arm 4 is composed of an upper arcuate portion 79, a lower arcuate portion 80, and a cylindrical portion 97 which shares the center axis 73 with those two arcuate portions, has a smaller radius than that of the two arcuate portions, and is interposed between the two arcuate portions. The arcuate portion 15 provided at one end of the other arm 4 and having a center axis 74 is composed of an upper arcuate portion 81, a lower arcuate portion 82, and a cylindrical portion 98 which shares the center axis 74 with those two arcuate portions, has a smaller radius than that of the two arcuate portions, and is interposed between the two arcuate portions.

In FIG. 5(b), which shows the essential portions of the cylindrical portions, band-shaped winding components 83, 84 and 85 alternately extend generally in the shape of letter S appearance between the cylindrical portions 95 and 96 and are so fixed at their individual two ends by fixing jigs that tensions to the wound cylindrical portions may be produced. Likewise, band-shaped winding components 86, 87 and 88 alternately extend generally in the shape of letter S appearance between the cylindrical portions 96 and 97 and are so fixed at their individual two ends by fixing jigs that tensions to the wound cylindrical portions may be produced. Moreover, band-shaped winding components 89, 90 and 91 alternately extend generally in the shape of letter S appearance between the cylindrical portions 97 and 98 and are so fixed at their individual two ends by fixing jigs that tensions to the wound cylindrical portions may be produced. Moreover, band-shaped winding components 92, 93 and 94 alternately extend generally in the shape of letter S appearance between the cylindrical portions 98 and 95 and are so fixed at their individual two ends by fixing jigs that tensions to the wound cylindrical portions may be produced.

It is noted that, in the cylinder 95, the winding components 83, 93 and 85 are overlapped on the inner sides of the winding components 92, 84 and 94, respectively. Likewise in the cylinder 96, the winding components 86, 84 and 88 are overlapped on the inner sides of the winding components 83, 87 and 85, respectively. Likewise in the cylinder 97, the winding components 89, 87 and 91 are overlapped on the inner sides of the winding components 86, 90 and 88, respectively. Likewise in the cylinder 98, the winding components 92, 90 and 94 are overlapped on the inner sides of the winding components 89, 93 and 91, respectively. Of course, the overlapped winding components can be fixed with a shift from each other in the center axis direction, but the overlapped winding is effective, as shown, in minimizing the height of the arm.

According to one method of tensioning the winding components, like the method of adjusting the tensions of the winding components shown in FIG. 2, all the winding components can be joined by fixing them under tensions by causing the upper arcuate portions 75 and 77 to come into contact with each other, by causing the arcuate portions 77 and 79 to come into contact with each other, by causing the arcuate portions 79 and 81 to come into contact with each other, by causing the arcuate portions 81 and 75 to come into contact with each other, by causing the lower arcuate portions 76 and 78 to come into contact with each other, by causing the arcuate portions 78 and 80 to contact with each other, by causing the arcuate portions 80 and 82 to come into contact with each other, and by causing the arcuate portions 82 and 76 to come into contact with each other, such that the restraints are produced individually in the direction where the center axes 71 and 72 attract each other, in the direction where the center axes 72 and 73 attract each other, in the direction where the center axes 73 and 74 attract each other and in the direction where the center axes 74 and 71 attract each other. As a result, the arcuate portions contacting with each other can roll without any slip so that the arm 4 smoothly turns in the direction indicated by arrow 108 as the arm 3 turns in the direction of arrow 107. Moreover, the change caused by the rolling motions of the tension applied to the winding components can be minimized by generally aligning the position of the circumscribed portion, at which the arcuate portions contact with each other, with the position at which the three winding components wound on the cylinders of the individual arcuate portions intersect, when viewed in the direction of the center axes of the arcuate portions. The structure of the circumscribed portions, at which the four arcuate portions contact with each other, can be made similar to that of FIG. 3. Specifically, the sectional shapes of the rolling faces of the end faces of the mutually circumscribed arcuate portions are given a recess and projection structure, as described above. Thus, the positional displacement in the center axis direction of the arcuate portions, i.e., in the vertical direction can be prevented while rolling, thus effecting the arm movement in highly accurate fashion.

On the other hand, letting the height of the arms 2, the arms 3, the arms 4 and the arms 5 be t, the distance between the bottom and top of all the jointed arms, i.e., the total height h is equal to t, as shown in FIG. 4(c). As in the case of the embodiment of FIG. 1, the transfer arm mechanism of the present invention can hold the total height h at the minimum constant value irrespective of the number of joints of the arms, thus providing the sixth feature of the present invention, in that the transfer arm having the four jointed arcuate portions can be effectively made with a small size.

One embodiment of the transfer arm capable of transferring a wafer having a diameter of 200 mm and a stroke of 453 mm will be described with reference to FIGS. 6, 7(a–e) and 8(a–e). All these Figures are the top plan views showing the loci of wafer 1, the individual arms and their arcuate portions, when viewed in the direction of the center axes, when the drive arm is turned in steps of 22 degrees from 0 degrees to 88 degrees. Only components on one side of the components axially symmetrical with respect to the direction of movement of the wafer are designated by reference numerals. Moreover, the state at the turning angle of 44 degrees is emphasized by thick solid lines. In any case, the arcuate portions 11, 12, 13 and 14, the arcuate portions 15, 16, 17 and 18 and the arcuate portions 19, 37, 38 and 39 are preferably designed to have a radius of 15 mm, and the arms joined to the individual arcuate portions are designed to have the lengths (the distances between the center axes of the arcuate portions at the two arm ends) described below. All the measurements are provided as examples only. Lengths may be varied according to the requirements of individual systems.

Figure 6:
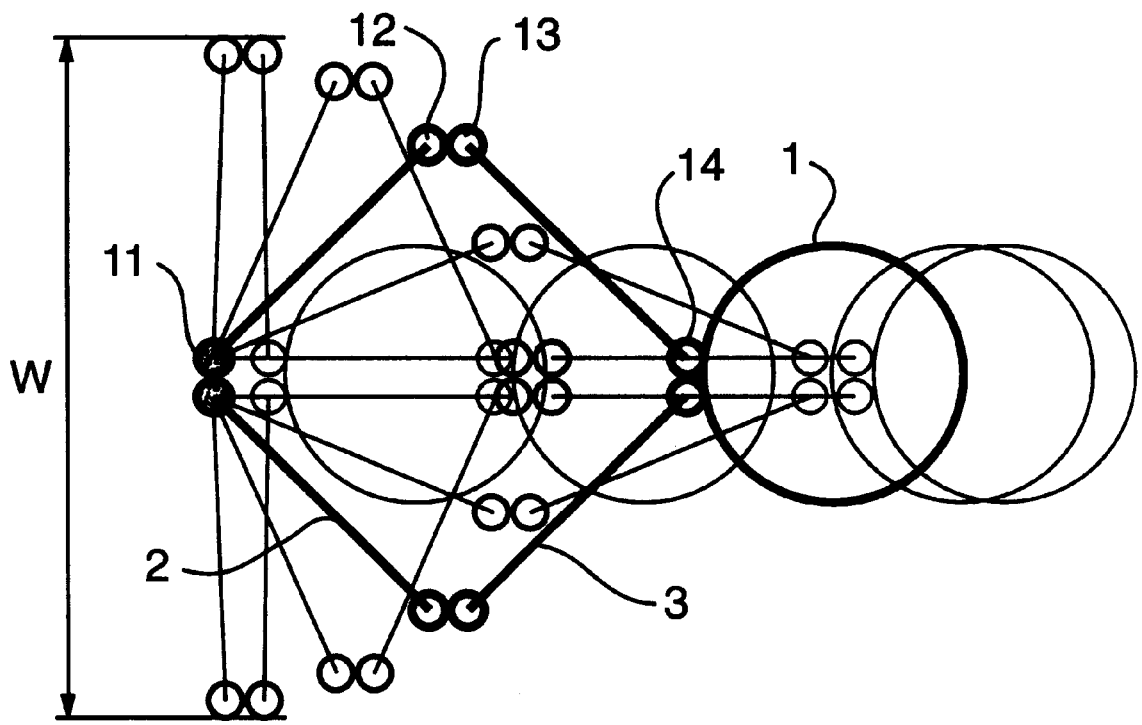
FIG. 6 is a schematic top plan view showing one embodiment of the transfer arm of the present invention.
Figure 7A:
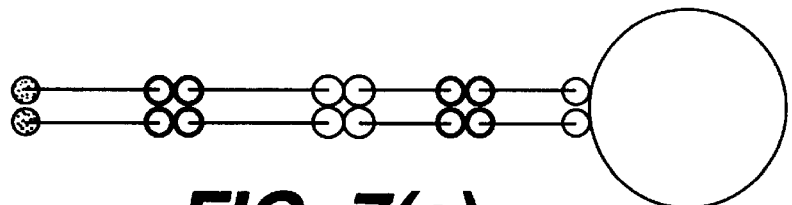
FIGS. 7(a)–7(e) (collectively FIG. 7) are schematic top plan views showing one embodiment of the transfer arm of the present invention.
Figure 7B:
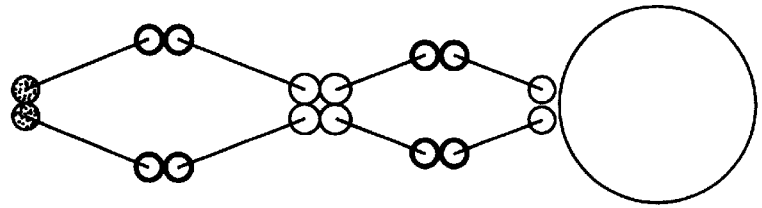
Figure 7C:
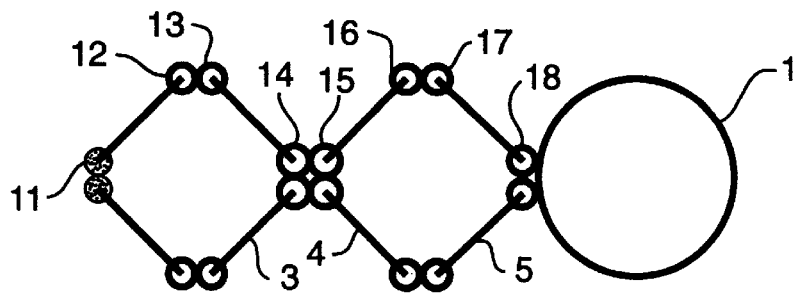
Figure 7D:
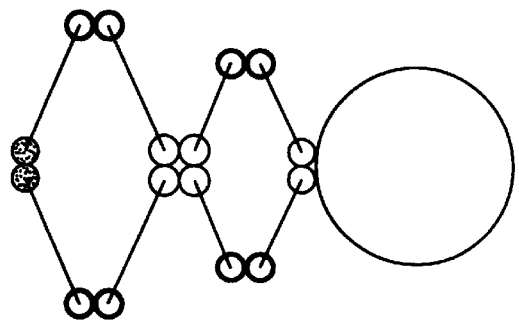
Figure 7E:
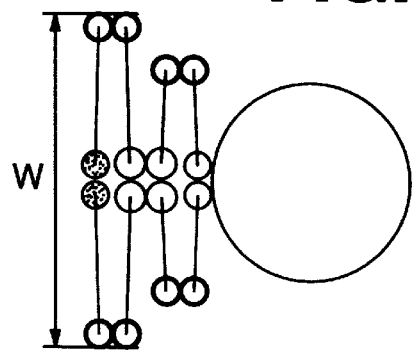
Figure 8A:
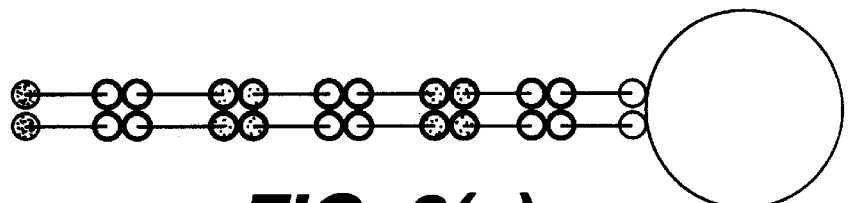
FIGS. 8(a)–8(e) (collectively FIG. 8) are schematic top plan views showing one embodiment of the transfer arm of the present invention.
Figure 8B:
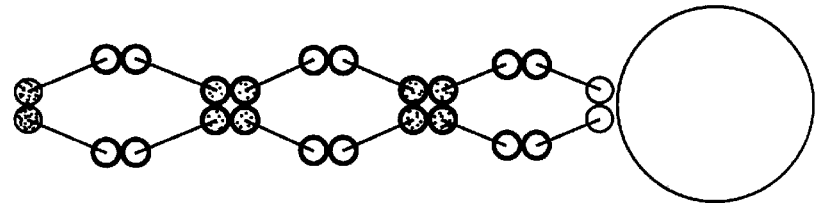
Figure 8C:
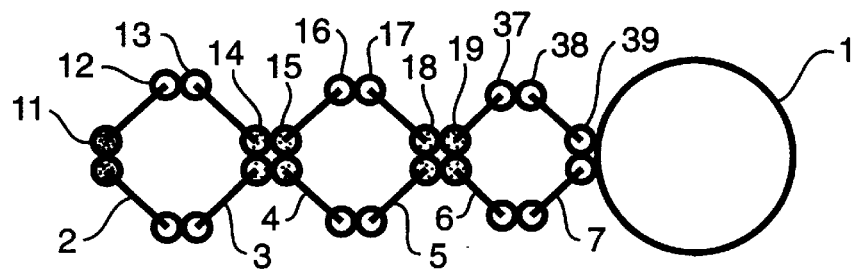
Figure 8D:
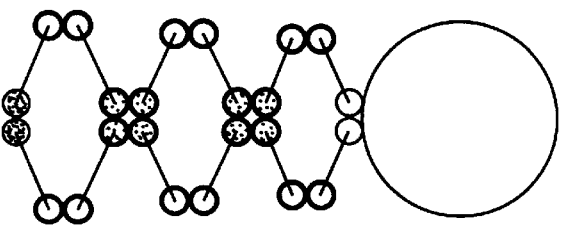
Figure 8E:
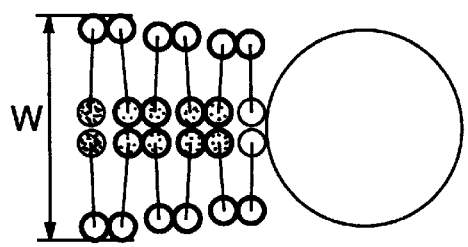

All the arcuate portions of the mechanism of FIG. 6 have the joint structure of two arcuate portions as in the embodiment of FIG. 2. The arms 2 and the arms 3 are individually given a length of 235 mm, and the maximum transverse width W is 530 mm.

In the mechanism of FIGS. 7(a–e), the arcuate portions 14 and 15 have the joint structure of the four arcuate portions as in the embodiment shown in FIG. 5, and the other arcuate portions 11, 12, 13, 16, 17 and 18 are made to have the joint structure of the two arcuate portions as in the embodiment shown in FIG. 2. The arms 2 and the arms 3 are given a length of 118 mm, the arms 4 and the arms 5 are given a length of 117 mm, and the maximum transverse width W is 296 mm.

In the mechanism of FIGS. 8(a–e), the arcuate portions 14 and 15 and the arcuate portions 18 and 19 have the joint structure of the four arcuate portions as in the embodiment shown in FIG. 5, and the other arcuate portions 11, 12, 13, 16, 17, 37, 38 and 39 have the joint structure of the two arcuate portions as in the embodiment shown in FIG. 2. The arms 2 and the arms 3 are given a length of 87 mm the arms 4 and the arms 5 are given a length of 78 mm, the arms 6 and the arms 7 are given a length of 70 mm, and the maximum transverse width W is 234 mm.

Preferably, all of the arms of FIGS. 6, 7(a–e) and 8(a–e) have the same total height h of 20 mm. From these three examples, it is possible to appreciate a seventh feature in that a mechanism having a small maximum transverse width W, i.e., a transfer arm mechanism having a small floor area can be realized by the present invention, without increasing the total height h of all the arms of the transfer arm by using the motion transmission method of the present invention.

An eighth feature of the present invention can be achieved in that the transfer arm can be linearly moved without any other guide means merely by rotationally controlling one shaft 21 (see FIG. 1) of the two center shafts of the arcuate portion 11. The shaft 21 can be designed such that it is supported only rotatably by a bearing disposed on the drive source side. Thus, the transfer arm itself is substantially bearing-less. At most, only a single bearing is used on the drive source side to impart rotation to a single shaft. As a result, all of the problems associated with the use of multiple bearings throughout the transfer arm are avoided.

In order to increase the load capacity of the article to be transferred without increasing the height of the arm, it is necessary to increase the tensions of the winding components. At this time, the thickness of the winding components can be designed to increase by increasing the radius of the cylindrical portion, considering the yield stress under the condition that the materials are repeatedly bent. It is desirable that the cylindrical portion be designed to have a diameter four to five hundreds times larger than the thickness of the winding components.

Is should be evident from the discussion above that the shapes of the joint structures and the individual size values of the arcuate portions or the like could be suitably changed in design to different values in accordance with the weight of the article to be transferred, the transfer stroke required, and the floor area allowed, etc.

Figure 9A:
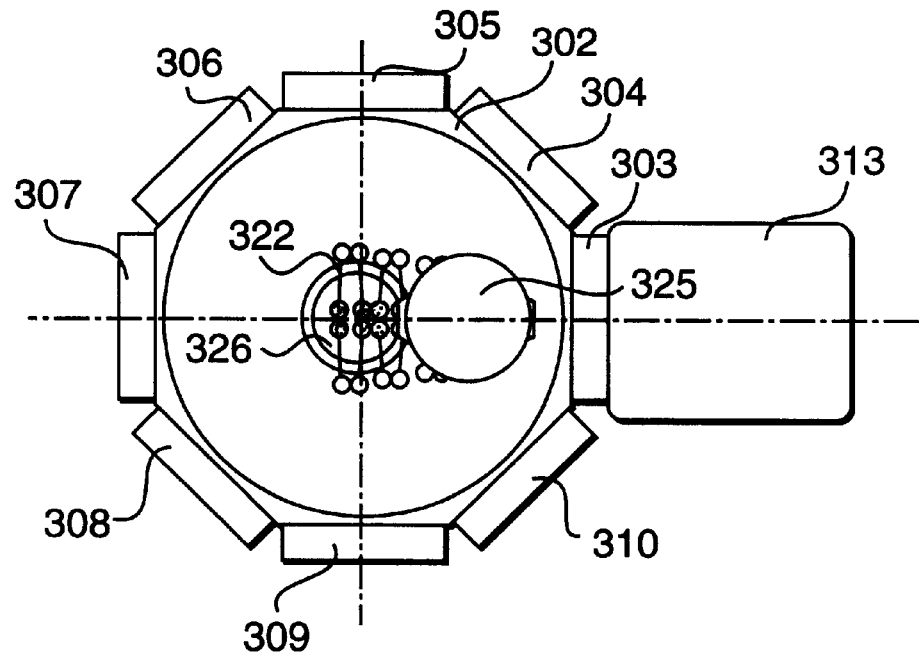
FIGS. 9(a) and 9(b) (collectively FIG. 9) are schematic diagrams showing a multi-stage vacuum process apparatus according to a third embodiment of the present invention.
Figure 9B:
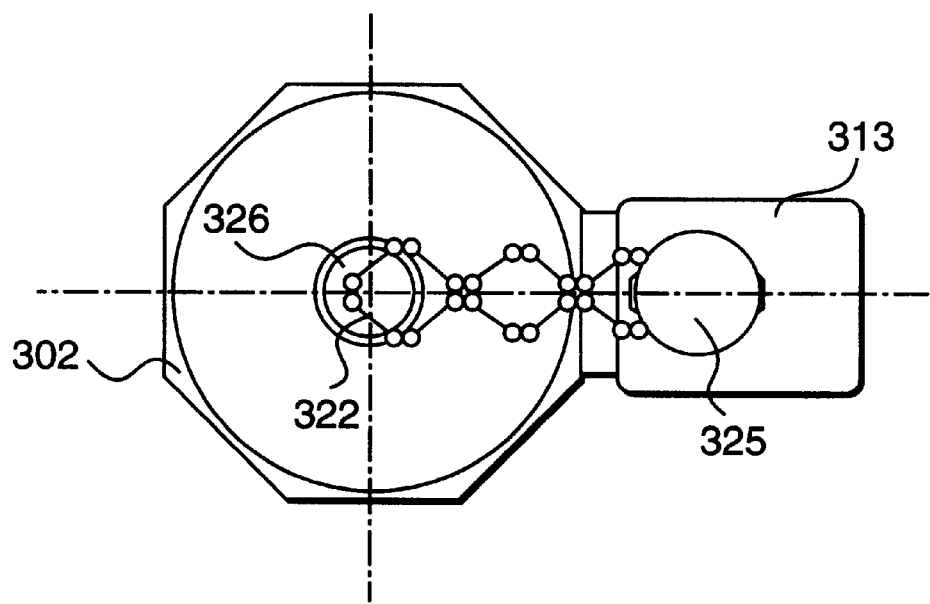

FIGS. 9(a) and 9(b) are schematic diagrams showing a multi-stage vacuum process apparatus according to a third embodiment of the present invention. This apparatus is an example of a cluster type vacuum process apparatus for treating wafers, having a diameter of 200 mm, one by one. Around a transfer chamber 302 in which is packaged a transfer arm mechanism 322 similar to that of the embodiment shown in FIG. 8, there is arranged a transfer chamber 313 and a plurality of transfer chambers (not shown) through a plurality of gate valves 303 to 310. This transfer arm is constructed to transmit the rotational drive force from a drive source 326 to the drive arm so that a substrate 325 mounted on the leading end arm may be moved and transferred.

Figure 16A:
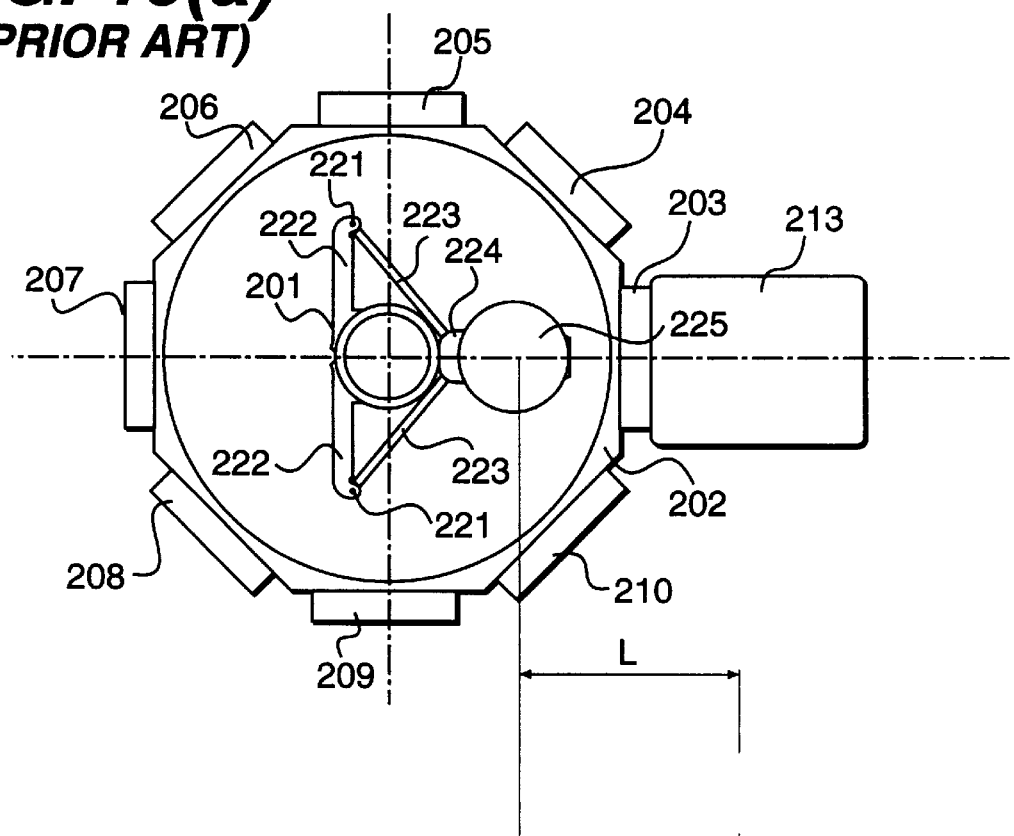
FIGS. 16(a) and 16(b) (collectively FIG. 16) are schematic top plan views showing a multi-stage vacuum process apparatus known in the prior art.
Figure 16B:
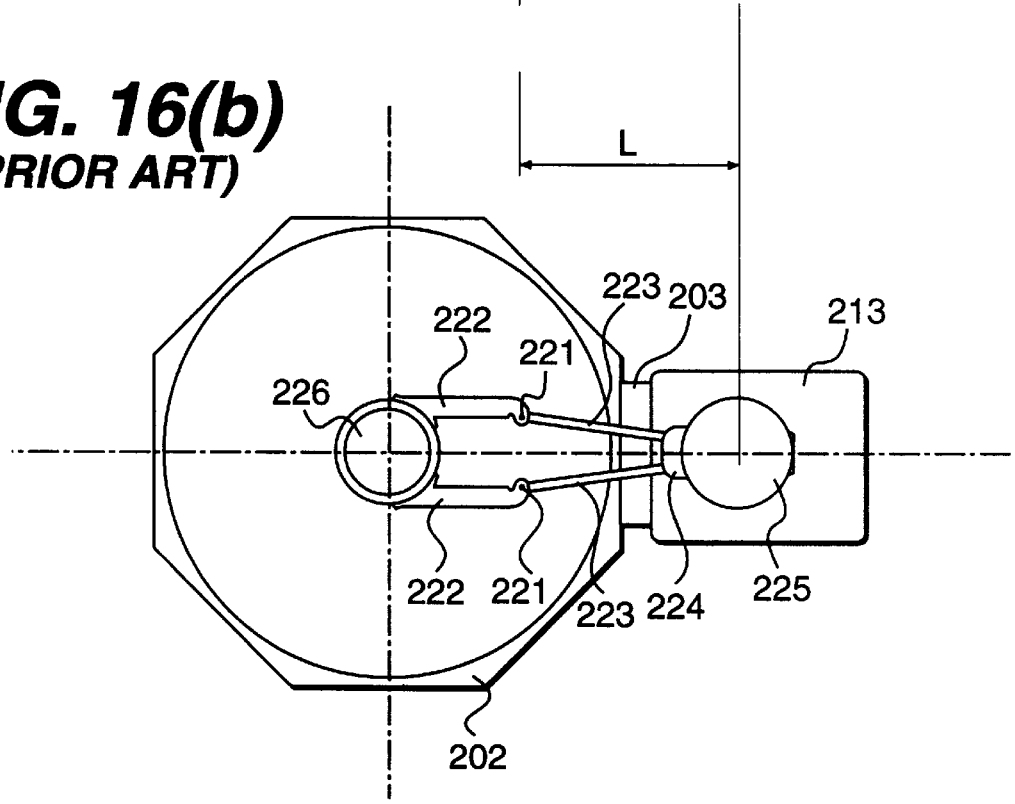

When the substrate is to be rotationally moved toward the plurality of process chambers, the drive source 326 is turned in its entirety by a turning mechanism (not shown). An internal diameter of the transfer chamber 302 of no less than 560 mm is sufficient, according to this embodiment. The internal diameter of the transfer chamber of the prior art, as shown in FIG. 16, has to be no less than 670 mm for the transfer of the same stroke. Thus, according to a ninth feature of the present invention, the floor area of the semiconductor manufacturing apparatus around the transfer chamber around which the plurality of process chambers are arranged can be drastically reduced by using the transfer mechanism according to the motion transmitting method of the present invention.

Figure 10A:
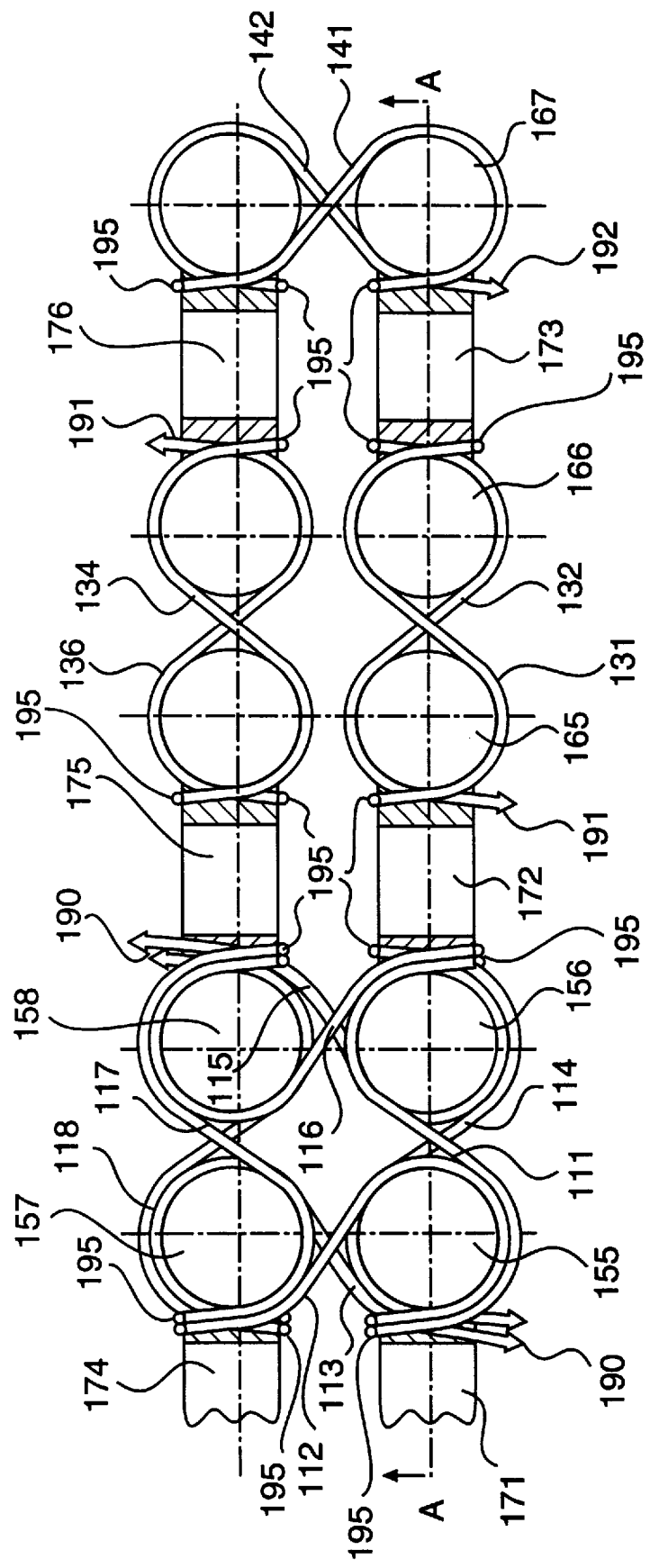
FIGS. 10(a)–10(d) (collectively FIG. 10) are schematic diagrams showing one embodiment of the joint of the arcuate portion of the present invention.
Figure 10B:
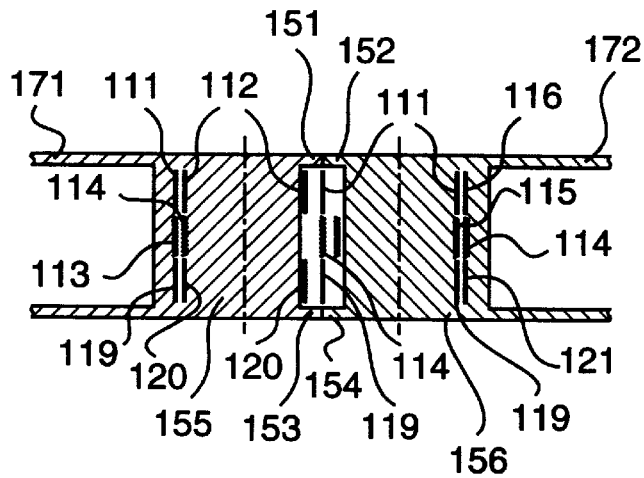
Figure 10C:
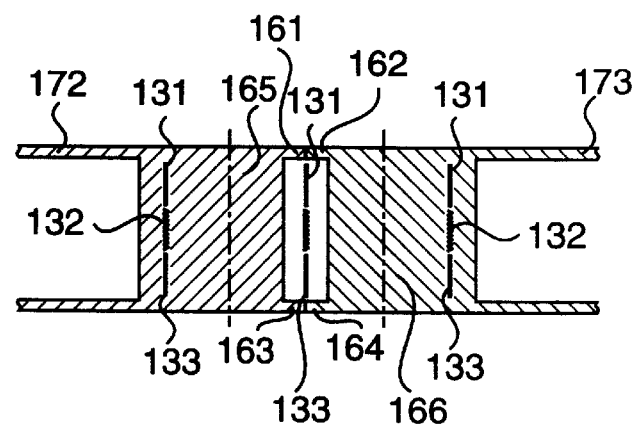
Figure 10D:
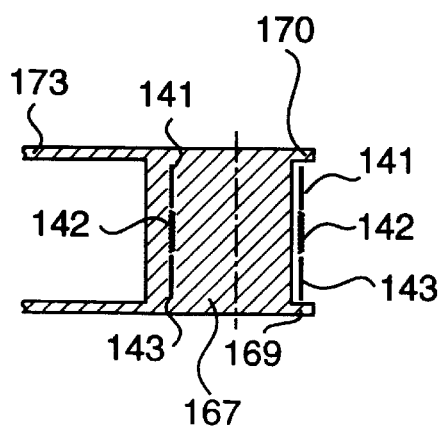

FIGS. 10(a)–10(d) are schematic diagrams showing one embodiment of the joint portion of the arcuate portions of the present invention. Illustrated are joint portions, at which the four arcuate portions contact each other, and joint portions at which the two arcuate portions contact each other. FIG. 10(a) is a schematic top plan view showing the positional relations among the cylindrical portions, the arms and the winding components, when viewed in the center axis direction of the arcuate portions, and FIGS. 10(b), 10(c) and 10(d) are sections taken along the line A—A.

First of all, here will be described the structure of the joint portions of four cylindrical portions 155, 156, 157 and 158. This structure is similar to that of the embodiment of FIG. 5. Specifically, if arms 171 and 174 are made to correspond to the arms 4 of FIG. 5 and arms 172 and 175 are made to correspond to the arms 3 of FIG. 5, winding components 111, 112, 113, 114, 115, 116, 117 and 118 correspond to the winding components 86, 89, 90, 87, 84, 83, 92 and 93 of FIG. 5, respectively. Moreover, a structure similar to that of the embodiment of FIG. 3 is adopted as the structure of the circumscribed portion of arcuate portions 151 and 152 and arcuate portion 153 and 154.

One of the ends of winding components 111 and 112 are fixed at a fixing portion 195 of arm 171, and the other end of winding component 111 is fixed at the fixing portion 195 of the arm 172 whereas the other end of winding component 112 is fixed at the fixing portion 195 of the arm 174. One of the ends of the winding components 116 and 117 are fixed at a fixing portion 195 of the arm 175, and the other end of the winding component 116 is fixed at the fixing portion 195 of the arm 172 whereas the other end of the winding component 117 is fixed at the fixing portion 195 of the arm 174.

One of the ends of the winding components 114 and 115 are fixed at the fixing portion 195 of the arm 172, and the other end of the winding component 114 is fixed at a tension adjusting portion 190 of the arm 171 whereas the other end of the winding component 115 is fixed at the tension adjusting portion 190 of the arm 175. One of the ends of the winding components 113 and 118 are fixed at the fixing portion 195 of the arm 174, and the other end of the winding component 113 is fixed at a tension adjusting portion 190 of the arm 171 whereas the other end of the winding component 118 is fixed at tension adjusting portion 190 of the arm 175.

The upper and lower winding components 111, 112, 116, 117 and so on, shown by black solid lines, are passed through the through holes of the thick portions of the arms and then are fixed on the arm members by the fixing portions 195. Then, the winding components, shown by gray solid lines, are adjusted and fixed so that they are tensed by the tension adjusting portions 190. By these adjustments, forces are created to attract the center shafts of the four cylindrical portions to each other so that the arcuate portions of the individual arms are mutually circumscribed highly accurately to provide a smoothly rolling structure.

The joints of two arcuate portions will be described in connection with the structure of the portion near cylindrical portions 165 and 166. This structure is similar to that of the example of the embodiment of FIG. 2. If the arms 172 and 173 are made to correspond to the arms 3 and 2 of FIG. 2, winding components 131 and 132 correspond to the winding components 41 and 42 of FIG. 2, respectively. A structure similar to that of the embodiment of FIG. 3 is adopted as the structure of the circumscribed portions of arcuate portion 161 and 162 and arcuate portions 163 and 164.

One of the ends of the winding components 131 and 132 are fixed at the fixing portion 195 of the arm 173, and the other end of the winding component 131 is fixed at the fixing portion 195 of the arm 172 whereas the other end of the winding component 132 is fixed at a tension adjusting portion 191 of the arm 172.

The upper and lower winding components 131, 133 and so on, shown by black solid lines, are passed through the through holes of the thick portions of the arms and then are fixed on the arm members by the fixing portions 195. Then, the winding component 132, shown by gray solid lines, are adjusted and fixed so that they are tensed by the tension adjusting portions 191. By these adjustments, forces are generated to attract the center shafts of the two cylindrical portions so that the arcuate portions of the individual arms are mutually circumscribed highly accurately to provide a smoothly rolling structure.

In the structure of the present invention, which has been described above, the tension adjusting portions can be adjusted from the outside of the paired arms (in the vertical direction of the drawing), as shown in parallel in FIG. 10(a). Thus, a tenth feature of the present invention is realized in that the assembly and maintenance of the transfer arm can be adjusted remarkably easily.

By way of example only, the following is a list of dimensions and materials preferably employed in the above-described embodiment: the arcuate portions are given a radius of 15 mm; the cylindrical portions are given a radius of 12 mm and a height of 17 mm; the band-shaped winding components are made of stainless steel and have a thickness of 0.06 mm and a width of 5 mm; and the arms are given a height t of 20 mm, and the given tension is 50 Kg. Of course, these values and materials can be suitably altered according to the tensile strength of the winding components, the weight of the article to be transferred, and the sizes of the allowed transfer spaces, etc. Moreover, adjustments of design such that the widths of the two winding components of the same winding direction are made narrower than the width of another winding component, and the width of the upper winding component to which is applied a relatively high bending moment load by the gravity is made larger are effective in reducing the size.

Figure 11A:
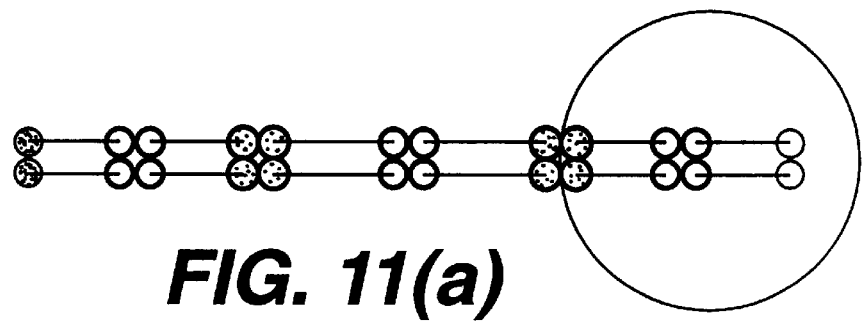
FIGS. 11(a)–11(e) (collectively FIG. 11) are schematic top plan views showing one embodiment of the transfer arm of the present invention.
Figure 11B:
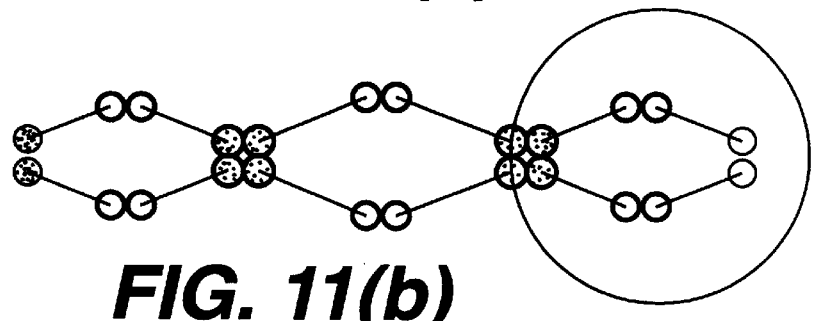
Figure 11C:
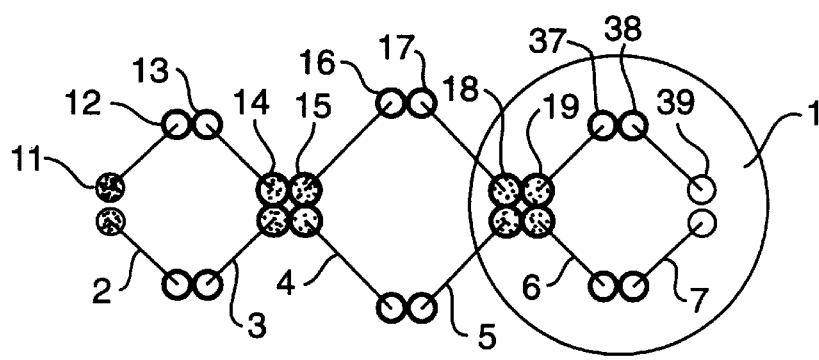
Figure 11D:
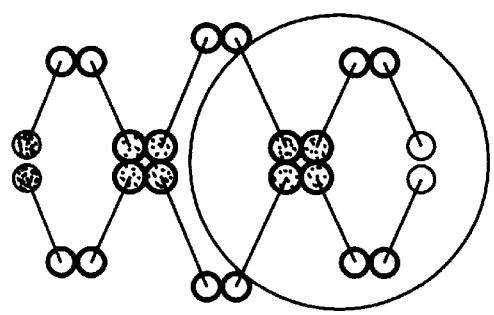
Figure 11E:
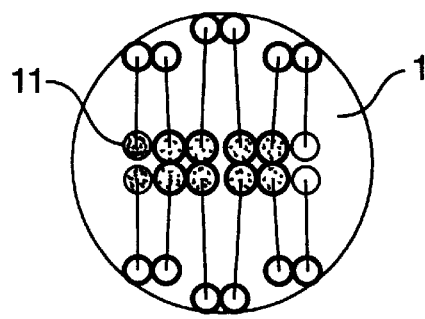

FIGS. 11(a)–11(e) are schematic top plan views showing one embodiment of the transfer arm of the present invention. In this embodiment, the area of projection when the transfer arm is contracted is within the area of projection of the wafer having a diameter of 300 mm. This is a modification of the embodiment of FIG. 8. FIG. 11(a) is a top plan view, when viewed in the direction of the center axes, of the wafer 1, the arms and the arcuate portions when the drive arms 2 are turned in steps of 22 degrees from 0 degrees to 88 degrees. Only components on one side of the components axially symmetrical with respect to the direction of movement of the wafer are designated by the reference numerals. FIG. 11(b) shows the state that the turning angle is 0 degree; FIG. 11(c) shows the state that the turning angle is 44 degrees; and FIG. 11(d) shows the state that the turning angle is 88 degrees. The arcuate portions 11, 12, 13, 14, 15, 16, 17, 18, 19, 37, 38 and 39 are designed to have a radius of 15 mm, and the lengths (distances between the center axes of the arcuate portions at the two ends of the arms) of the arms from the individual arcuate portions are designed to be 93 mm for the arms 2 and 3 and the arms 6 and 7 and 120 mm for the arms 4 and 5, so that a transfer stroke of 590 mm is achieved. As a result, an eleventh feature of the present invention results in that it is possible to realize a small-sized transfer arm mechanism having a projection area which is within substantially the same area of the substrate of a large diameter.

Figure 12A:
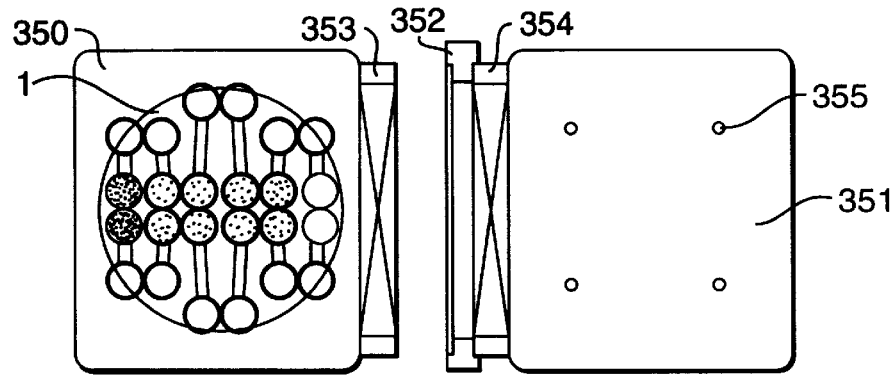
FIGS. 12(a)–12(d) (collectively FIG. 12) are schematic diagrams showing a process apparatus according to a fourth embodiment of the present invention.

FIGS. 12(a)–12(d) are schematic diagrams showing a process apparatus according to a fourth embodiment of the present invention. In particular, this schematic diagram shows one example of a small-sized transfer enclosure containing the transfer arm. This small-sized transfer enclosure can transfer the wafer, while being always kept in a predetermined clean atmosphere by isolating the ambient in the transfer enclosure from the surrounding ambient, to a treatment apparatus disposed in a different position, and can transfer the wafer after joining the transfer enclosure with a treatment chamber. FIG. 12(a) is a schematic side elevation of the inside of the enclosure in which a small-sized transfer enclosure 350 and a process chamber 351 of another process apparatus are arranged close to each other. A small-sized transfer arm is mounted in the small-sized transfer enclosure 350, and the wafer 1 having a diameter of 200 mm is mounted on the leading end arm 20. The small-sized transfer arm is one example similar to that of the embodiment of FIG. 11. The arcuate portions 11, 12, 13, 14, 15, 16, 17, 18, 19, 37, 38 and 39 are designed to have a radius of 15 mm, and the lengths (the distances between the center axes of the arcuate portions at the two ends of the arms) of the arms from the individual arcuate portions are designed to be 43 mm for the arms 2 and 3 and the arms 6 and 7 and 70 mm for the arms 4 and 5, so that a transfer stroke of 301 mm is achieved.

Figure 12B:
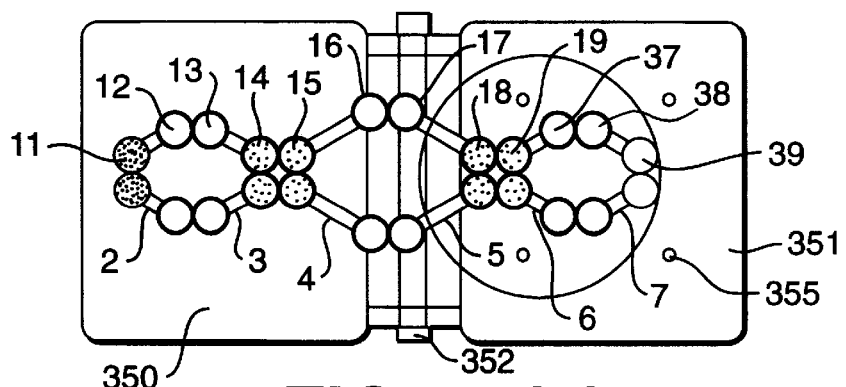
Figure 12C:
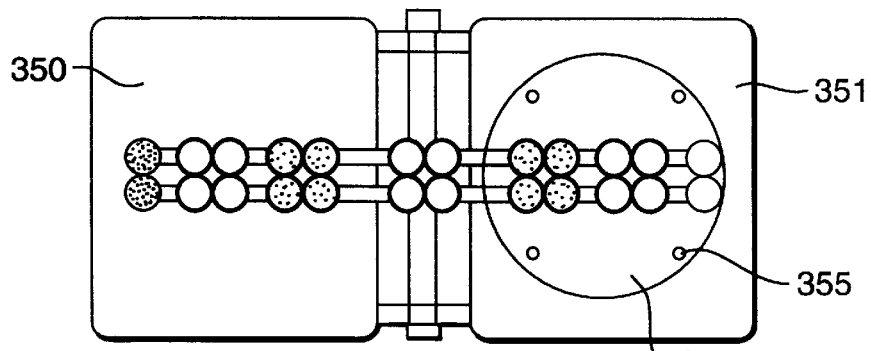
Figure 12D:
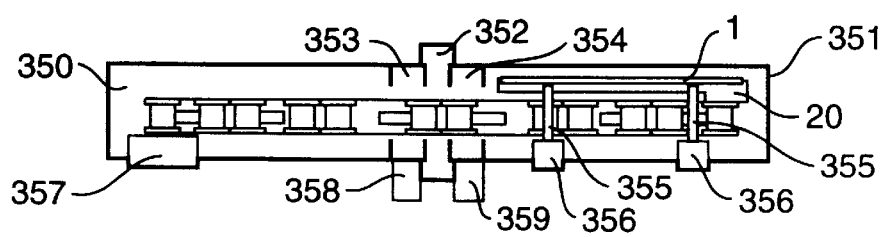

FIG. 12(a) shows the state that the drive arms 2 are turned and contracted by a turning angle of 88 degrees by drive control means 357. FIG. 12(b) shows the state that the drive arms 2 are turned by a turning angle of 44 degrees. FIG. 12(c) shows the state that the drive arms 2 are extended with a turning angle of 0 degrees. FIG. 12(d) is a perspective schematic view showing the state of FIG. 12(c), when viewed from the side. By closing a gate valve 35, as shown in FIG. 12(a), the inside of the small-sized transfer enclosure 350 can be kept in a predetermined ambient of vacuum or an inert gas by an ambient keeping means (not shown) such as a gas occlusion alloy, a small-sized vacuum pump or an inert gas pot. The inside of the process chamber 351 disposed in a different position can be kept in the predetermined ambient of the vacuum or inert gas with a gate valve 354 closed, by the ambient keeping means (not shown) such as a vacuum pump and gas supply piping. As shown in FIG. 12(b), the small-sized transfer enclosure 350 is positioned and fixed at joint means 352 located at the entrance of the process chamber 351, and the space defined by the two gate valves and the joint means is cleaned to set the predetermined ambient of the vacuum or inert gas. Then, the gate valves 353 and 354 are opened to transfer the wafer into the chamber by using opening/closing means 358 and 359.

As shown in FIGS. 12(c) and 12(d), a vertically movable susceptor 355 is disposed in the process chamber and is moved by vertical drive control means 356 to transfer the wafer 1 at the instant when the leading arm 7 of the transfer arm is transferred to a predetermined position. The transfer arm has a total height h of 15 mm, and the small-sized transfer enclosure has a height of about 50 mm, a rectangular contour of about 250 mm and an internal capacity of about 3 l.

According to the present invention, a remarkably small-sized transfer arm for holding and transfer the wafer can be provided in the small-sized transfer enclosure. Thus, a twelfth feature of the present invention is presented in that it is possible to realize a small-sized transfer enclosure which can transfer the wafer without contamination for a short time period without requiring any transfer means for transferring the wafer into a mating process apparatus or a test apparatus.

FIGS. 13(a)–13(d) are schematic diagrams showing a fifth embodiment of the present invention. This schematic diagram shows one embodiment in which the center axes of the arcuate portions are at one end of the paired drive arms on the drive source side.

Figure 13A:
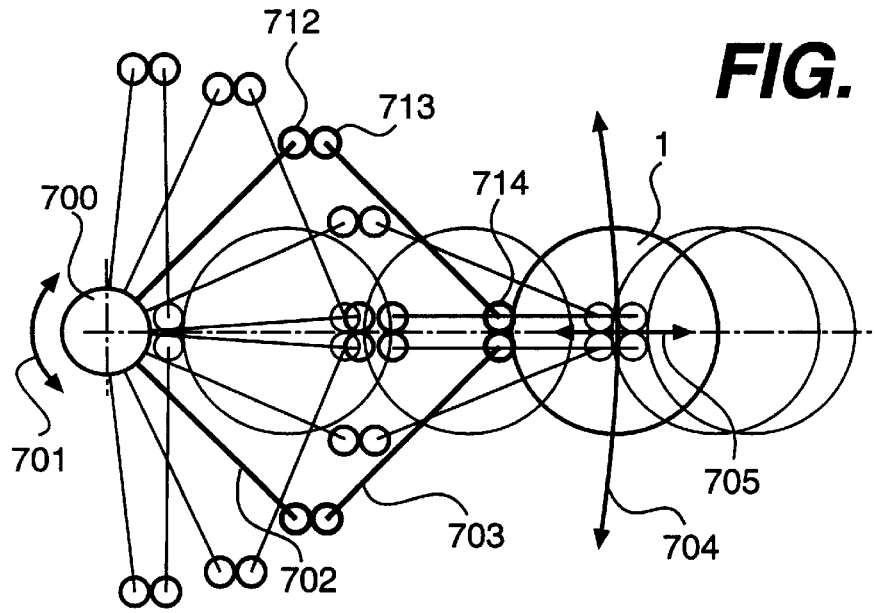
FIGS. 13(a)–13(d) (collectively FIG. 13) are schematic diagrams showing a process apparatus according to a fifth embodiment of the present invention.

FIG. 13(a) is a top plan view, when viewed in the direction of center axes, of the loci of the wafer 1, the individual arms and the arcuate portions when the drive arms is turned in steps of 22 degrees from 0 degrees to 88 degrees, and emphasizes the state when the turning angle of a drive arm 702 is 44 degrees, by thick solid lines. Only the components on one side of the components axially symmetrical with respect to the direction of movement of a wafer are designated by numerals.

Figure 13B:
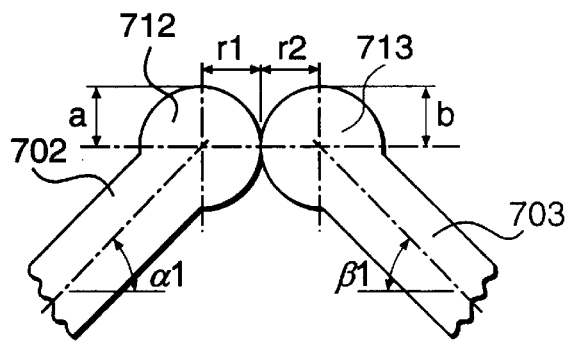
Figure 13C:
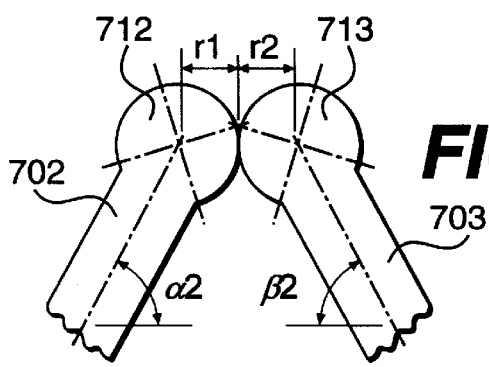
Figure 13D:
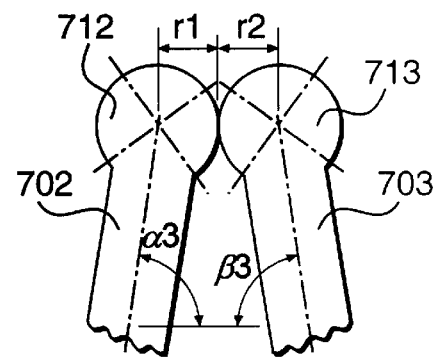

FIG. 13(b) is an enlarged top plan view of the vicinity of a joint, at which arcuate portions 712 and 713 are in contact with each other at a turning angle a1=45 degrees and a turning angle b1=45 degrees. FIGS. 13(c) and 13(d) are enlarged top plan views of the vicinity of the joint, at which the arcuate portions 712 and 713 are in contact with each other at turning angles b2=65 degrees and b3=85 degrees. Incidentally, an arcuate portion 714 has a radius of 15 mm, and an arm 703 has a length (the distance between the center axes of the arcuate portions of the two arm ends) of 235 mm.

An arcuate portion 700 can rotate on the center axis, and the paired arcuate portions can rotate independently of each other. The paired drive arms 702 are extended from the paired arcuate portions, respectively. The structure excepting the drive arms 702, the arcuate portion 700 at their one end, the arcuate portion 712 at the other end and the arcuate portion 713 at one end of the driven arm 703 is similar to that of the embodiment of FIG. 6, or the like. The distance between the centers of one end arcuate portion 700 and the other end arcuate portion 712 of the drive arms 702 is longer than the distance between the centers of the arcuate portion 713 at one end of the driven arms and the arcuate portion 714 at the other end, unlike the embodiment of FIG. 6. In order to drive the drive arms smoothly with the paired arcuate portions 714 at the other end of the arms 703 mutually circumscribed, therefore, the arcuate portions 712 and 713 are given a generally arcuate structure having a predetermined curve shape. Specifically, the arcuate portions 712 and 713 are formed into such an arcuate shape that the distance between the center axis and the circumscribed portion is gradually changed with the turning angle, with their center distance being constant.

In FIG. 13(b), for example, the distances between the centers are r1=15 mm, r2=15 mm, a=16.3 mm and b=13.7 mm, and the turning angle a1=45 degrees. In FIG. 13-c, the distances between the centers are r1=15.3 mm and r2=14.7 mm, and the turning angle a2=63 degrees. In FIG. 13-d, the distances between the centers are r1=15.5 mm and r2=14.5 mm, and the turning angle a3=81 degrees. Of course, these values should not limited to the above-specified ones but can readily be modified according to the object of use.

The transfer arm can be rotationally moved as a whole in the circumferential direction indicated by arrow 704, by turning the two drive arms 702 in the identical direction by the same turning angle through the paired arcuate portions 700 which can be rotated independently of and separately from each other in the direction indicated by arrow 701. By turning the two drive arms 702 in the opposite directions by the same turning angle through the arcuate portions 700 in the direction indicated by arrow 701, the transfer arm can be extended as a whole in the radial direction indicated by arrow 705.

By giving the aforementioned generally arcuate shapes to the arcuate portions 712 and 713, according to the present invention, a drive arm system having aligned axes of rotation results. Thus, a thirteenth feature of the present invention is presented in that the leading end arm can be positioned highly accurately at a high speed to an arbitrary position in a two-dimensional plane merely by the turning motion on one axis. A turn introducing machine using concentric magnetic couplings or a drive source 226 of the drive arms 222, of the prior art of FIG. 16, is used as the means for driving the paired drive arms from the arcuate portions 700 independently or simultaneously.

Figure 24A:
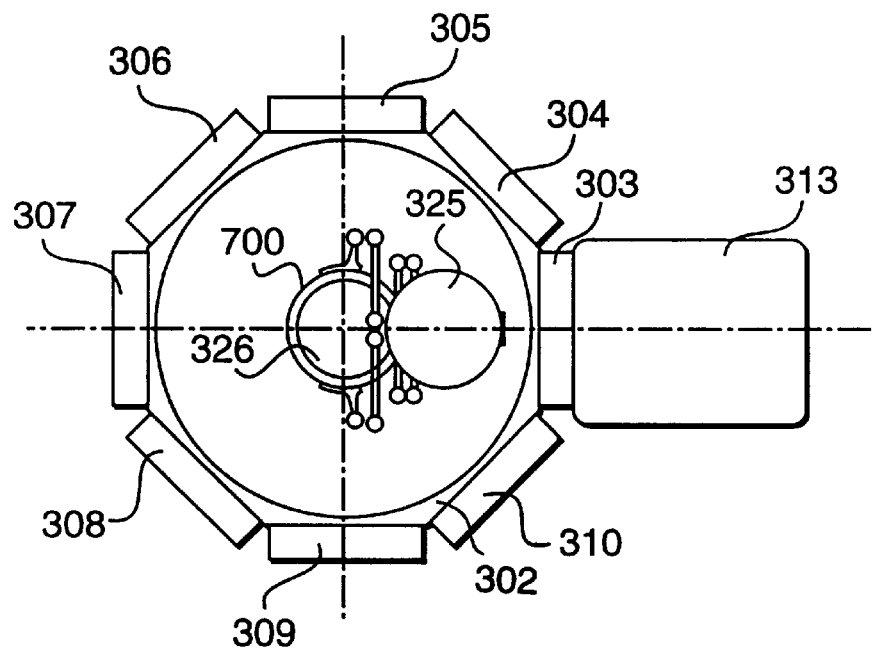
FIGS. 24(a) and 24(b) (collectively FIG. 24) are schematic diagrams showing a multi-stage type vacuum process apparatus according to a sixth embodiment of the present invention.
Figure 24B:
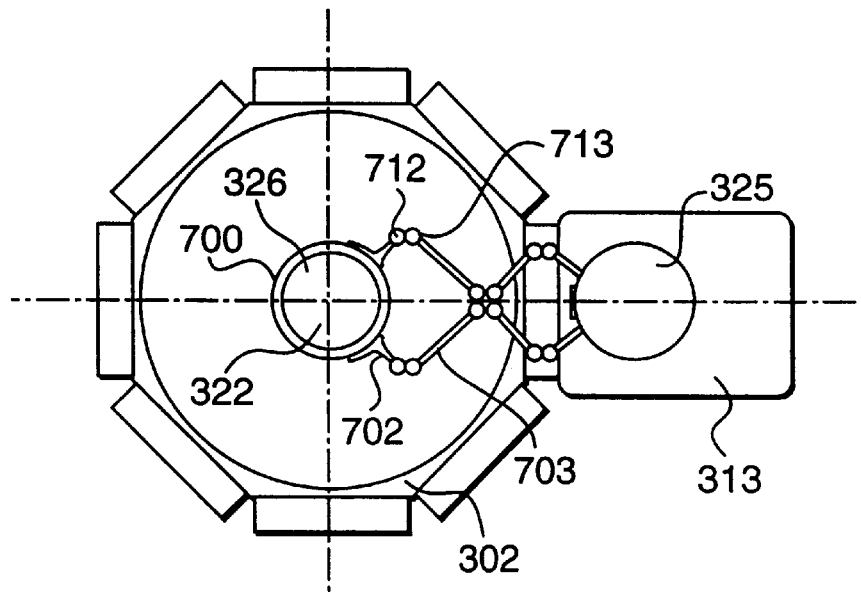

FIGS. 24(a) and 24(b) are schematic diagrams showing a multi-stage vacuum process apparatus according to a sixth embodiment of the present invention. In this embodiment, a transfer arm mechanism, whose center axes are aligned with the center axes of the arcuate portions on the drive side as in the fifth embodiment, shown in FIG. 13, is mounted as the transfer arm mechanism in the transfer chamber of the third embodiment, shown in FIG. 9. This embodiment is one example of a multi-stage vacuum process apparatus for treating a wafer, having a diameter of 200 mm, one by one. The process chamber 313 and a plurality of process chambers (not shown) are arranged around the transfer chamber 202 through the plurality of gate valves 303 to 310. This transfer arm rotationally controls the paired drive arms 702 in opposite directions from the drive source 326 through the arcuate portions 700 having the same center axis, to transmit a rotational drive force to the driven arms 703 through the generally arcuate portions 712 and 713.

The substrate 325 mounted on the leading end arm is moved and transferred, as shown in FIGS. 24(a) and 24(b). When the substrate is to be rotationally moved toward the plurality of process chambers, the paired drive arms 702 are rotationally controlled in the same direction. The internal diameter of the transfer chamber 302 of the present embodiment is sufficient if it is no less than 560 mm. In the prior art shown in FIG. 16, in order to transfer the same stroke, the transfer chamber is required to have an internal diameter of 670 mm or more. By using the transfer mechanism according to the motion transmitting method of the present invention, on the other hand, the internal diameter of the transfer chamber can be easily reduced. Thus, according to a fourteenth feature of the present invention, the floor area of the semiconductor manufacturing apparatus can be reduced.

FIGS. 14(a)–(c) are schematic diagrams showing a process apparatus according to a seventh embodiment of the present invention. FIG. 14(a) is a top plan view showing the apparatus which is constructed mainly of a pentagon-shaped transfer chamber 571, a process chamber 572, a buffer chamber 580, a substrate 581 and a transfer arm 582. FIG. 14(b) is a top plan view showing the positional relationships among the buffer chamber 580, a transfer arm 586 and the substrate 581 when the transfer arm is moved toward the process chamber 572. FIG. 14(c) is a schematic diagram showing a side section of the treatment apparatus. The process chamber 572 is connected through a gate valve 573 to the transfer chamber 571, and a variety of process chambers (not shown) are connected through other gate valves 574, 575, 576 and 577 to that transfer chamber. The number of process chambers connected should not be limited to that of this example of the present invention, but the shape of the transfer chambers, or the like, can be designed according to the desired number of the process chambers to be connected. The following is a list of preferable dimensions according to this embodiment: the substrate has a diameter of 200 mm; the transfer chamber 571 has an internal diameter of 600 mm; the process chamber has a depth of 450 mm; the transfer chamber 571 has a height of 200 mm; and the buffer chamber 580 has an internal height of 44 mm.

The transfer arm 582 is given a structure similar to that of the embodiment shown in FIG. 8 and the total height h is 17 mm. Two sets of transfer arms (582 and 585) are provided vertically in the buffer chamber 580 so that one set carries an unprocessed wafer whereas the other set takes out a treated wafer in the process chamber. The transfer arms 582, 585 receive a processed wafer already existing on susceptor means 510 in the process chamber and deliver an unprocessed wafer to the susceptor means 510. Upper transfer arm 582 is controlled by drive means 583, and the lower transfer arm 585 is controlled by drive means 584.

The inside of the buffer chamber 580 is evacuated by evacuation means 590 through an opening 587, a conductance valve 588 and a gate valve 589. On the other hand, the inside of the transfer chamber 571 is evacuated independently of the inside of the buffer chamber 580 by the evacuation means 590 through a gate valve 591. The buffer chamber 580 can be rotationally moved in the direction indicated by arrow 592, by the drive means (not shown) so that it confronts a desired process chamber in the transfer chamber 571. The buffer chamber 580 can be rotationally moved to confront an arbitrary process chamber while shielding the inside of the transfer chamber from the atmosphere by guide means 593 using a magnetic fluid seal. Incidentally, the inside of the process chamber 572 is isolated from the inside of the transfer chamber by closing the gate valve 573 when the wafer is not transferred.

The inside of the process chamber 572 can be evacuated through a gate valve 594 by evacuation means 595. To insure that the inside of the buffer chamber may be evacuated after the same gas ambient as that of the process chamber is created therein, it can be evacuated by the evacuation means 595 through a gate valve 596. Moreover, the insides of the process chamber 572 and the buffer chamber 580 can be supplied with a desired gas at a desired flow rate from predetermined gas supply means 597 through flow control means 599 and 500 so that they may be kept in desired treating ambients.

Also, the inside of the buffer chamber 580 can be fed with an inert gas from inert gas supply means 598 through flow control means 501 so that it may be cleaned. By blowing a highly pure nitrogen gas pressurized and controlled from the inert gas supply means 598 into the buffer chamber from blow port means 502 formed in the upper ceiling of the opening of the transfer chamber on the upstream side of the buffer chamber, so that a turbulent flow toward the opening 587 leading to the downstream evacuation means may be established, the dust adhering to the wall surface of the inside of the buffer chamber or the surfaces of the transfer arms can be physically removed and discharged. A fluorine gas such as $CF_4$, $CHF_3$ or $SF_4$ can be used to chemically clean the inside of the buffer chamber in advance. At this time, the wall surfaces of the buffer chamber can be thermally controlled to promote the degassing.

Additionally, the buffer chamber whose pressure has been reduced by the discharge can be efficiently kept in a clean state for a long time by jetting various gases utilizing the relatively increased pressure difference and by cleaning the inside of the buffer chamber physically and chemically with the jet flow. Thus, the inside of the buffer chamber can be cleaned at any desired time in such a way that, gas is jetted at a high pressure into a chamber having a small capacity, to thereby move the foreign substances with the gas flow. Thus, a fifteenth feature of the present invention is presented in that no foreign matter is accumulated on the transfer arms or the inside of the buffer chamber.

The cleaning effect of the inside of the buffer chamber can be further enhanced by releasing the gas components or fine particles from the wall surfaces of the chamber inside or the surfaces of the transfer arms by changing the gas into a plasma or causing photoexcitation of the gas in the buffer chamber, or by using resistance heating or radiation heating in combination, so that the fine particles can be guided into the main flow of the gas flow from the boundary layer located in the vicinity of the wall surface and flowing slowly, by Brownian motion, the electrostatic action or the electrophoretic action of gas molecules. Thus, a sixteenth feature of the present invention is presented in that the cleaning step utilizing the flow can be done in a short time at a low gas flow rate because of the small capacity of the inside of the buffer chamber.

The cleaning step can be controlled so that the gas injection rate, flow rate and exhaust rate are adjusted optimally by grasping the particle diameter distribution of the fine particles by a particle monitor (not shown) disposed in the exhaust port on the downstream side of the buffer chamber, or by grasping the partial gas pressure by a mass spectrometer. As a result, a seventeenth feature of the present invention is presented in that waste time due to excess cleaning or damage of the apparatus can be prevented in order to improve the working ratio of the semiconductor manufacturing apparatus. Accordingly, an eighteenth feature of the present invention is presented in that a semiconductor device of high performance can be easily manufactured by the process apparatus having a buffer chamber containing the small-sized transfer arm.

By controlling the pulse motor of the drive means according to the signal coming from an origin sensor of the transfer arms, a simple and highly reliable drive control mechanism can be constructed without any special feedback system so that a wafer can be transferred highly accurately by the transfer arms. Of course, a suitable feedback control system can be combined, if necessary, to optimize the acceleration/deceleration of the velocity of movements to thereby further shorten the transfer time.

The wafer is usually transferred by the transfer arms, with its function-added face up. However, there can be a method of transferring a wafer with its function-added face upside-down or upright in relation to the process chamber or the like.

When wafers having an especially large diameter are handled one by one, a system in which wafers are transferred and processed upright is used, thus producing an effect that the floor area of the apparatus can be reduced.

Figure 17:
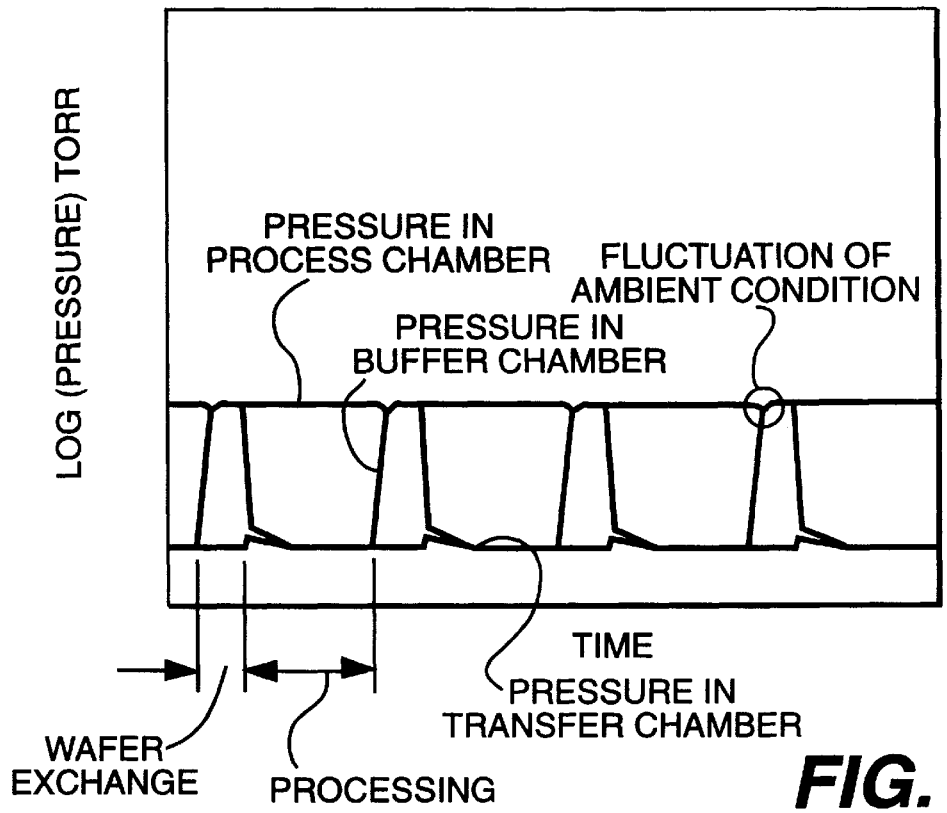
FIG. 17 is a schematic diagram showing in-chamber pressure characteristics of a process apparatus according to one embodiment of the present invention.
Figure 18:
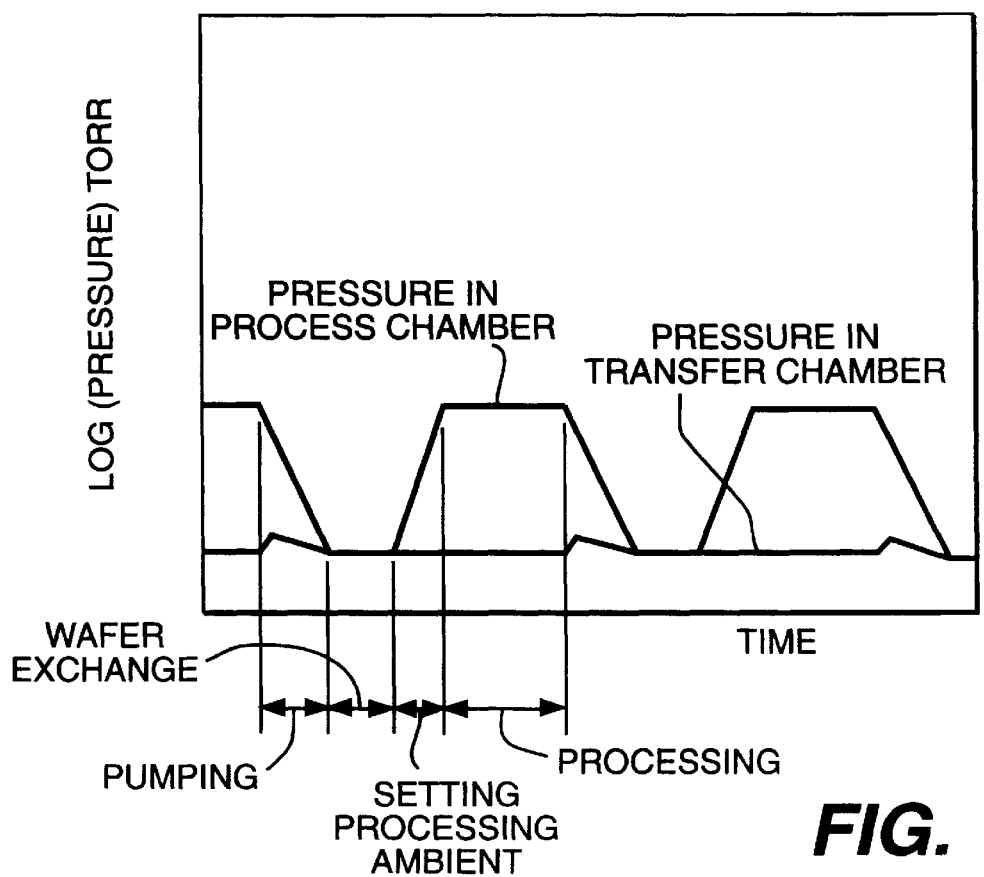
FIG. 18 is a schematic diagram showing the in-chamber pressure characteristics of a semiconductor manufacturing apparatus known in the prior art.

The description of the features of the seventh embodiment, as shown in FIG. 14, will be supplemented with reference to FIGS. 17 and 18. FIG. 17 is a graph showing one example of the measurement results of the pressure characteristics of the insides of the transfer chamber, the process chamber and the buffer chamber of the process apparatus of the embodiment shown in FIG. 14. The graph shows one example of the result of the changes with time of the pressure (e.g., 50 Torr on average) in the inside of the process chamber, the pressure (e.g., 10E–6 Torr on average) in the inside of the transfer chamber and the pressure in the buffer chamber. In FIGS. 17 and 18, the abscissas indicate the time, and the ordinates indicate the pressure in a logarithmic expression.

The wafer is transferred in and out before and after repeated treatments, and the pressure in the buffer chamber is controlled. As a result, the pressures in the process chamber and the transfer chamber fluctuate within an allowable range. In particular, the fluctuation of the ambient condition in the process chamber is 2% or less of the average pressure in the process chamber. This presents a nineteenth feature of the present invention in that the ambient condition in the process chamber can be maintained highly accurately with a cross contamination of 10 ppb (parts per billion) or less.

For comparison, there is shown in FIG. 18 one measurement example of the in-chamber pressure characteristics of the prior art, namely the pressure (10E–6 Torr on average) in the transfer chamber and the pressure in the process chamber. Before and after the repeated treatments, a wafer is transferred in and out while including the time periods taken to exhaust the inside of the process chamber and to set the ambient pressure, so that the pressure in the process chamber greatly changes. Comparing FIGS. 17 and 18, it can be seen that the time period taken to transfer a wafer subjected to the same treatment is shorter according to the present invention, the fluctuation of the ambient pressure in the process chamber is remarkably small and the ambient pressure is stable in the present invention.

For example, in the present invention the wafer exchange step does not encounter the pressure variations of the prior art, as shown in FIGS. 17 and 18. In FIG. 18, it can be seen that steps of pumping, wafer exchanging and setting processing ambient are required. On the other hand, only a wafer exchange step is needed in the present invention as shown in FIG. 17.

Figure 19:
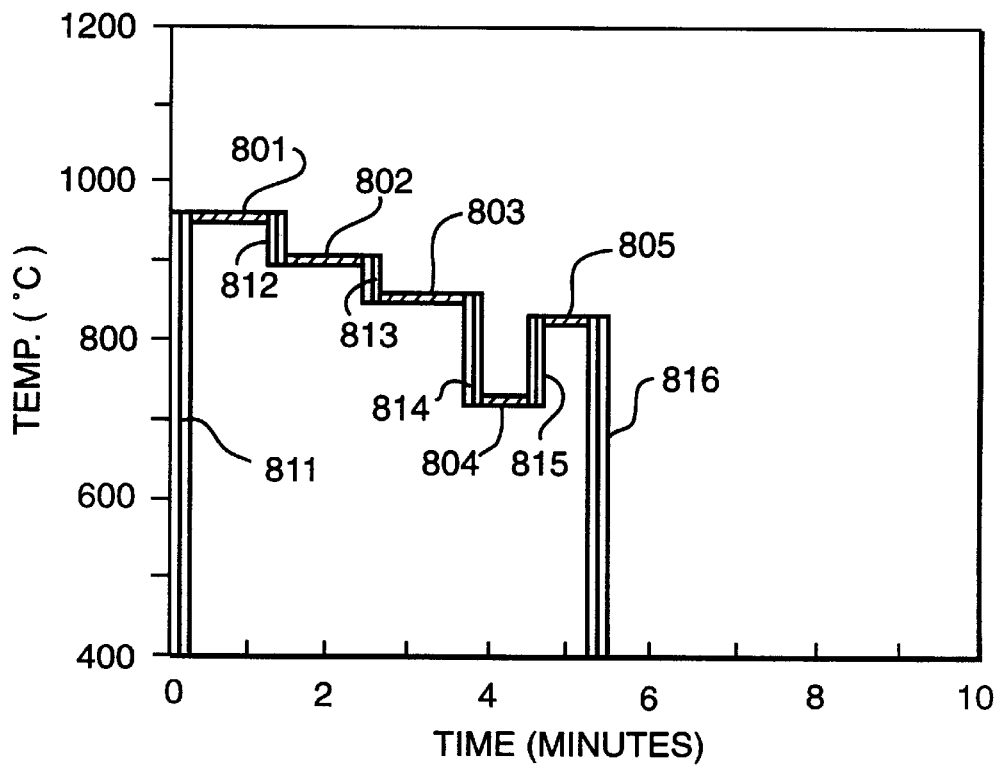
FIG. 19 is a schematic diagram showing the treatment characteristics of the process apparatus according to one embodiment of the present invention.

FIG. 19 shows one example of the measurement result of the characteristics of the case that a high temperature treatment is performed by a process apparatus of the seventh embodiment of the present invention, as shown in FIG. 14. This is an example of a step of forming an extremely thin silicon-nitride film having an excellent oxidation resistance by eliminating the phenomenon that a natural oxide film is formed on the treated wafer surface. This step is takes five minutes and thirty seconds by performing an H2 treatment 801 at a temperature of 950° C. and at an atmosphere pressure of 50 Torr, a heat nitriding treatment 802 at 900° C. under 10 Torr, a treatment 803 with $SiH_4$ and $NH_3$ at 850° C. and under 1.5 Torr, a treatment 804 with $SiH_4$ at 720° C. and under 5 Torr, and a treatment 805 with $SiH_4$ at 830° C. under 2 Torr in the independent process chambers, and by performing the wafer transfers 811, 812, 813, 814, 815 and 816 at the individual process chambers.

Figure 20:
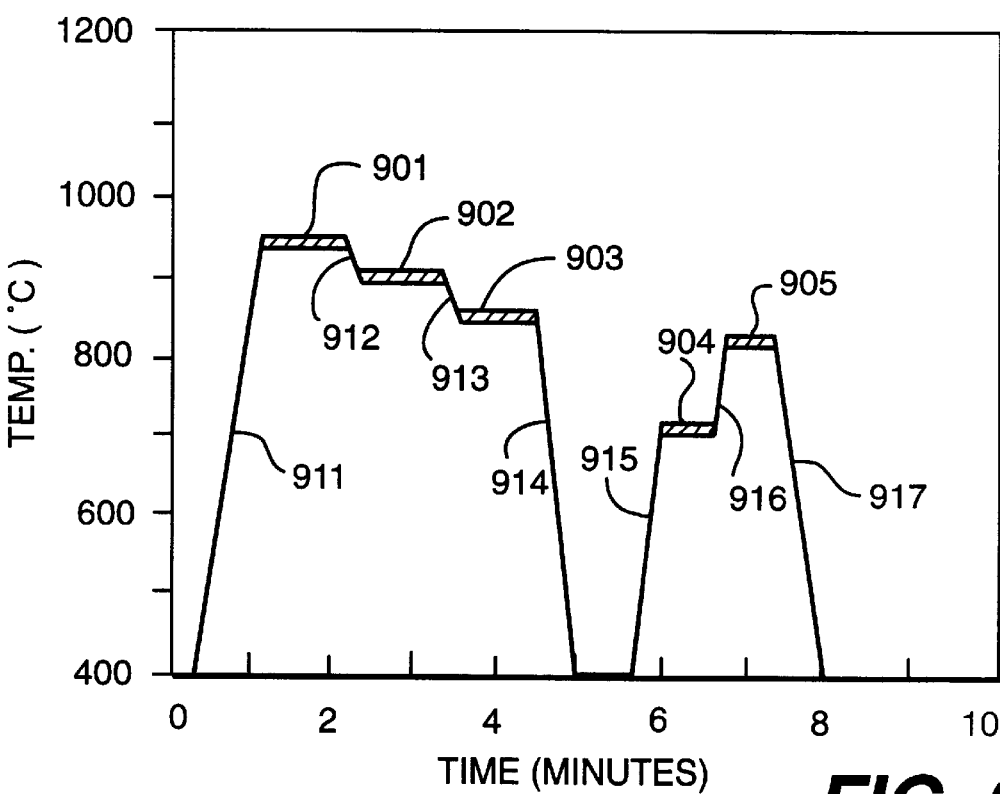
FIG. 20 is a schematic diagram showing the treatment characteristics of a process apparatus known in the prior art.

By comparison, FIG. 20 illustrates an example of the high temperature treatment characteristics of the prior art. These results come from the same treatments as those of FIG. 19. A treatment 901 with $H_2$ at a temperature of 950° C. under an ambient pressure of 50 Torr, a heat nitriding treatment 902 at a temperature of 900° C. under an ambient pressure of 10 Torr, a treatment 903 with $SiH_4$ and $NH_3$ at a temperature of 850° C. under an ambient pressure of 1.5 Torr, a treatment 904 with $SiH_4$ at a temperature of 720° C. under an atmosphere pressure of 5 Torr, and a treatment 905 with $SiH_4$ at a temperature of 830° C. under an ambient pressure of 2 Torr are executed in two process chambers. The treatments 901, 902 and 903 and the treatments 904 and 905 are executed in other process chambers. In the same process chamber, the settings 912, 913 and 916 of ambient conditions such as the temperature and the gas have to be repeated. The settings 911, 914, 915 and 917 of the ambient conditions take a long time for transfer a wafer to a different process chamber. As a result, this step takes eight minutes and twenty seconds in total.

By comparing the characteristic examples of the high temperature treatment steps of FIGS. 19 and 20, one can arrive at a twentieth feature of the present invention in that the effect of shortening the working time is remarkable on the continuous treatment under different conditions of temperature and gaseous ambient.

When a thin film of high density and performance is manufactured by repeating the treatment steps in atmospheres having a large temperature difference, the prior art needs a sample stage with a large heat capacity and a long time is taken to exhaust the process chambers and to set the pressure, etc. This makes it impossible to subjecting the substrate to an abrupt temperature change in a short time period. According to the present invention, however, the substrate can be taken out into the buffer chamber while maintaining the temperature and ambient of the process chamber and can be in a short time transferred into and treated in the process chamber which is set to another temperature and ambient. As a result, a twenty-first feature of the present invention is realized in that the surface of the wafer can be controlled more highly accurately to produce a semiconductor device with higher performance capabilities and with high reproducibility of the substrate.

Figure 21:
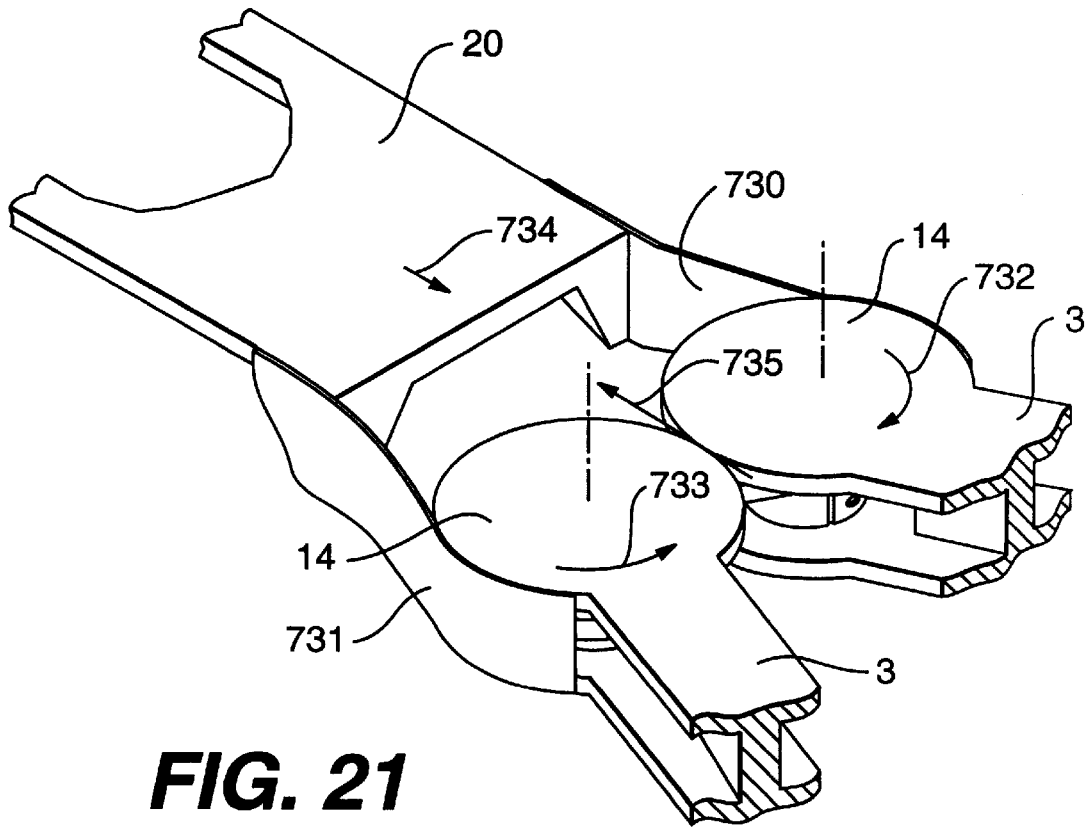
FIG. 21 is a schematic perspective view showing one embodiment of the leading end arm of the present invention.

FIG. 21 is a schematic perspective view showing one embodiment of the leading end arm of the present invention. Band-shaped spring members 730 and 731 are partially fixed along the outer circumferential portion of the arcuate portion 14 at the other end of the paired drive arms 3 such that their individual other ends are fixed on the leading end arm 20. When the drive arms 3 are turned in the directions indicated by arrows 732 and 733 so that the transfer arm is moved in the radial direction indicated by arrow 735, the spring members 730 and 731 are wound along the outer circumferences of the arcuate portions 14 so that the leading end arm 20 is finely moved in the radial direction indicated by arrow 734 and made to approach the arcuate portions 14. By this approaching action, the leading end arm can be supported with high rigidity even if the spring members used have a relatively small thickness. If this structure is employed, the leading end arm is prevented from protruding upward from the driven arms. As a result, the leading end arm mounted with the wafer can be easily designed in a range of the total height of the arms so that it is prevented from protruding upward from the drive arms, thus presenting a twenty-second feature of the present invention in that the transfer arm can be smaller.

By using the spring members 730 and 731 of a material which has been subjected to a curl treatment for producing winding forces in the direction indicated by arrows 732 and 733, a twenty-third feature of the present invention is realized in that a "jack-knife" phenomenon is prevented when the frogger arm mechanism is contracted. Specifically, as the transfer arm mechanism is contracted, the angle between the arms 3 increases and the restoring forces of the spring members 730 and 731 are restored. As a result, the component in the direction indicated by arrow 735 can be generated in the transfer arm mechanism, thus preventing the unstable "jack-knife" phenomenon which might cause the backward motion.

Figure 22:
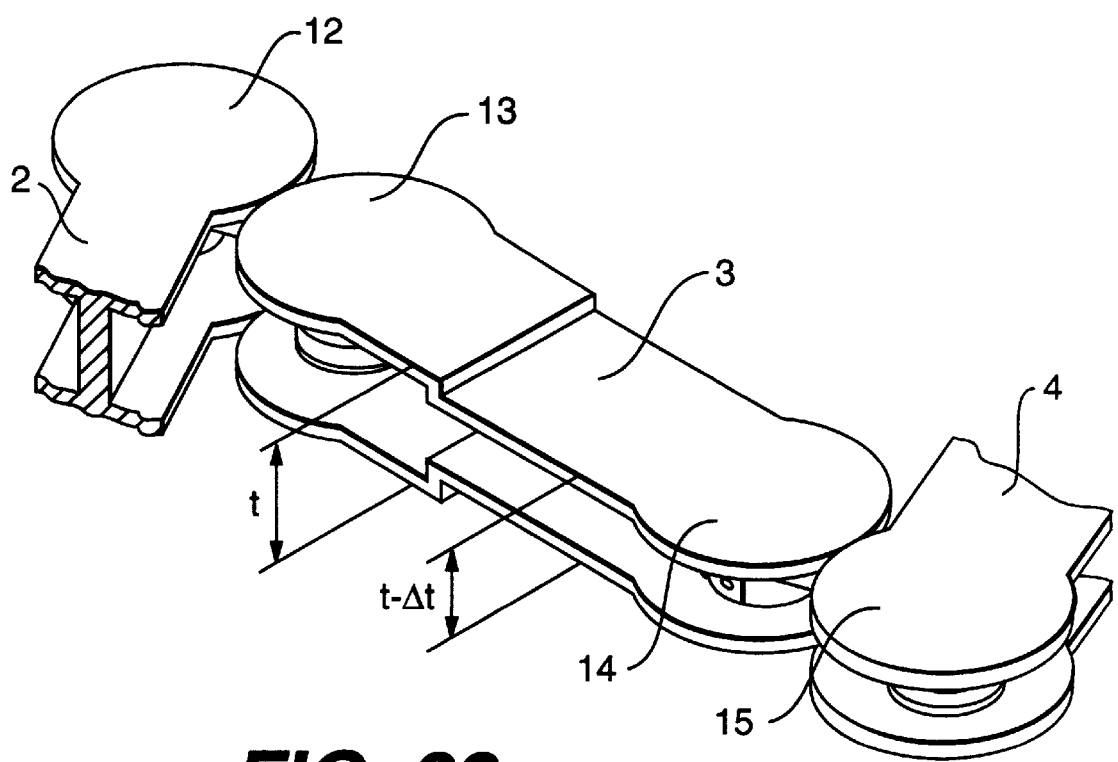
FIG. 22 is a schematic perspective view showing one embodiment of the joint of the arcuate portion of the present invention.
Figure 23A:
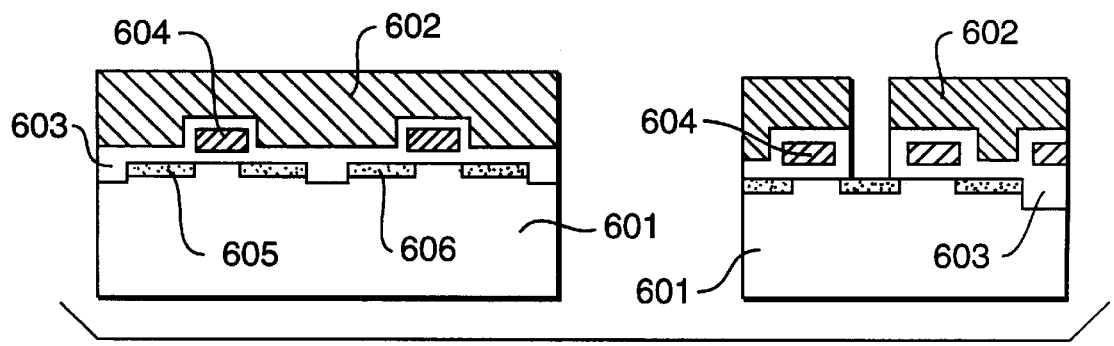
FIGS. 23(a)–23(g) (collectively FIG. 23) are schematic sections showing one embodiment of a method for manufacturing a semiconductor device according to the present invention.
Figure 23B:
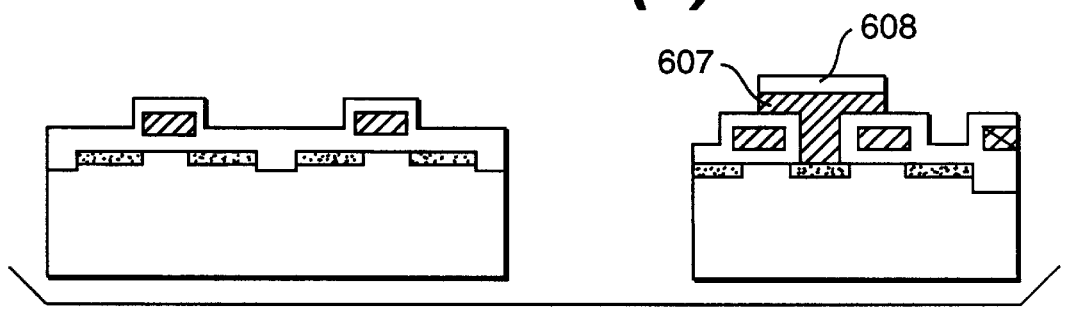
Figure 23C:
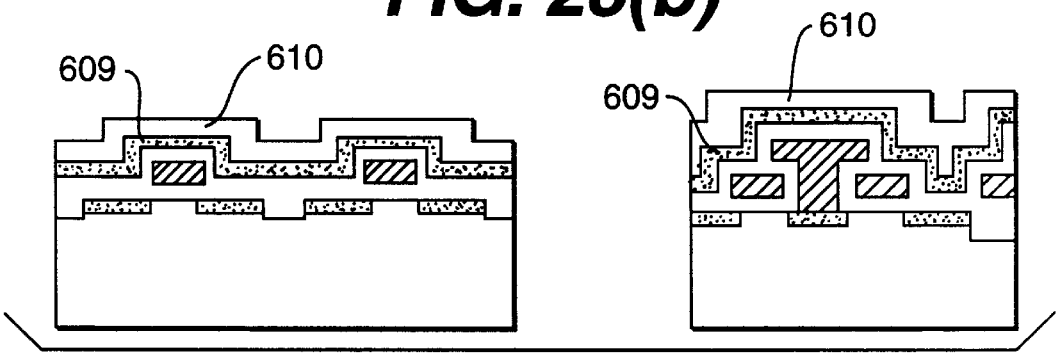
Figure 23D:
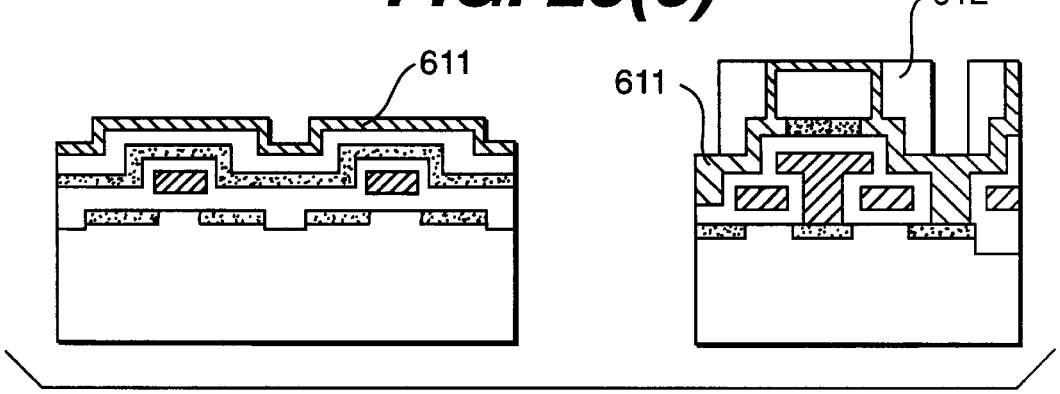
Figure 23E:
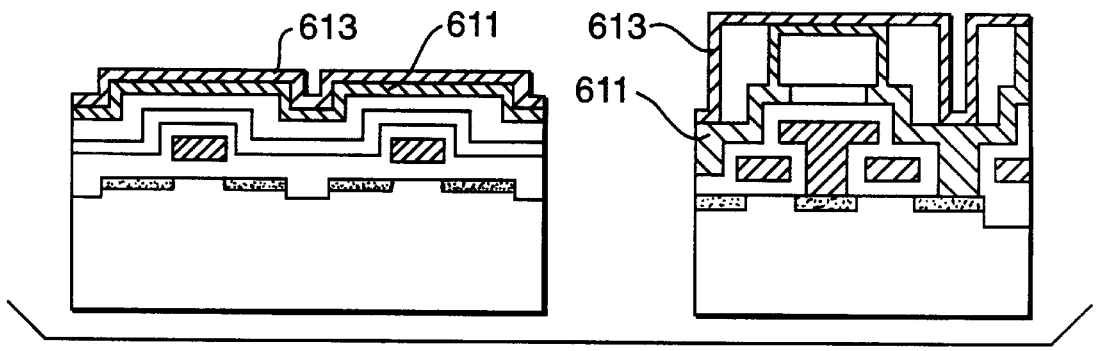
Figure 23F:
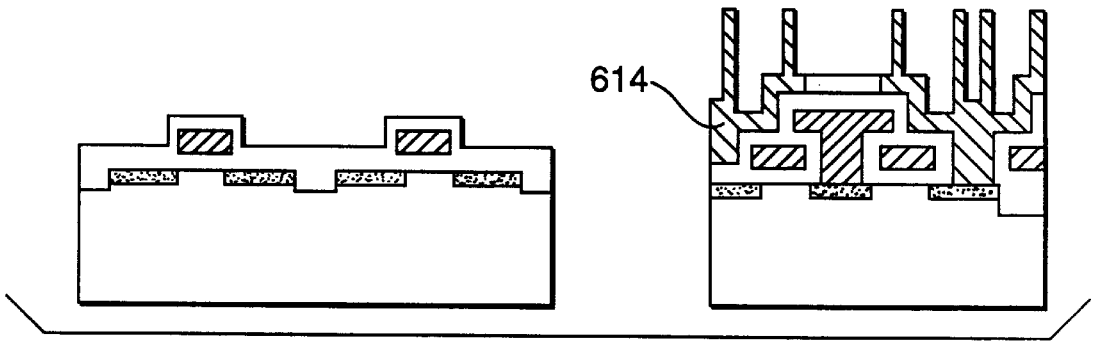
Figure 23G:
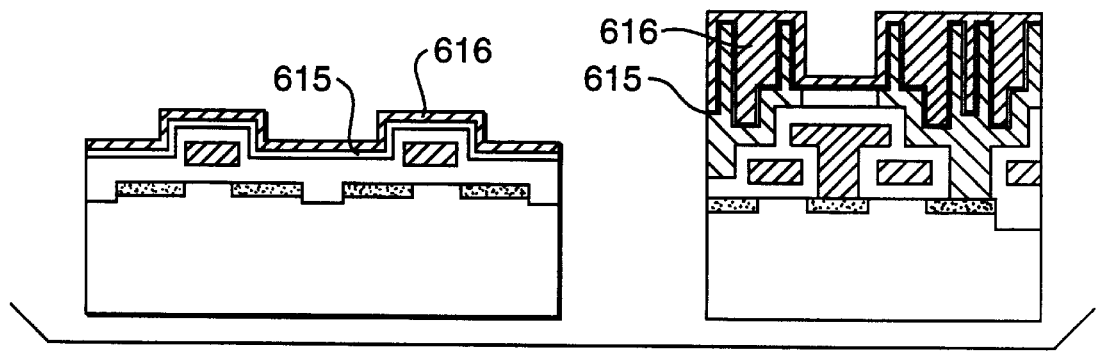

FIG. 22 is a schematic perspective view showing one embodiment of a joint of the arcuate portions according to the present invention. This embodiment illustrates a joint having a structure in which the heights of the arcuate portions of the drive arms 2 having the height t and the arcuate portions at the other end of the drive arms 3 having the arcuate portions 13 circumscribed about the former at their one end are reduced to (t−Δt). In this structure, the height of the arms 4 jointed to the arcuate portions 14 is reduced to (t−Δt). By adopting the present embodiment, it is possible to design a transfer arm mechanism which is given the smaller height at its more distal leading end of the arms so that its load is gradually lowered by receiving the load which is heavier toward the drive source by increasing the height of the arms on the drive source side. In this case, too, it is apparent that the total height of the transfer arm can be under the drive arm height t. According to the present invention, it is possible to assemble a system which has a smaller mass at the more distal leading end of the arms of the transfer robot. As a result, a small-sized transfer arm mechanism of high rigidity can be easily constructed to present a twenty-fourth feature of the present invention in that it is possible to realize a transfer arm of high speed and accuracy.

Figure 25A:
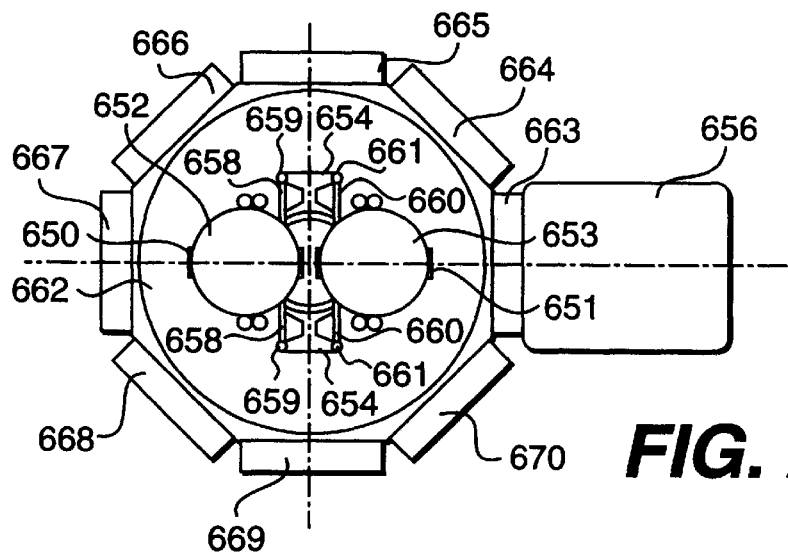
FIGS. 25(a)–25(c) (collectively FIG. 25) are schematic diagrams showing a multi-stage type vacuum process apparatus according to a seventh embodiment of the present invention.
Figure 25B:
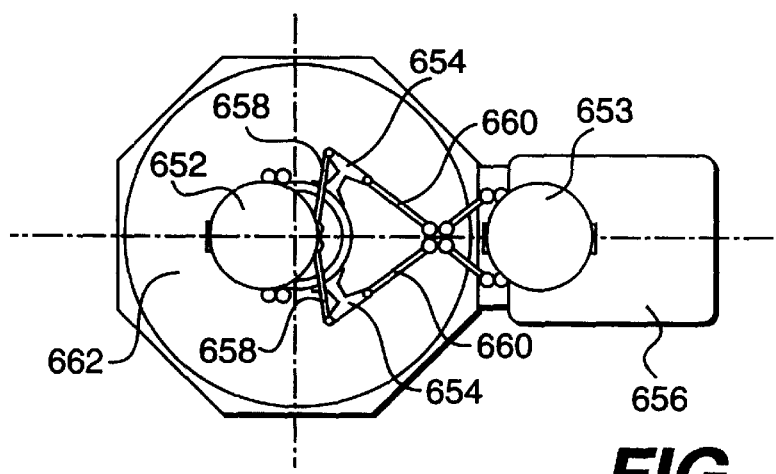
Figure 25C:
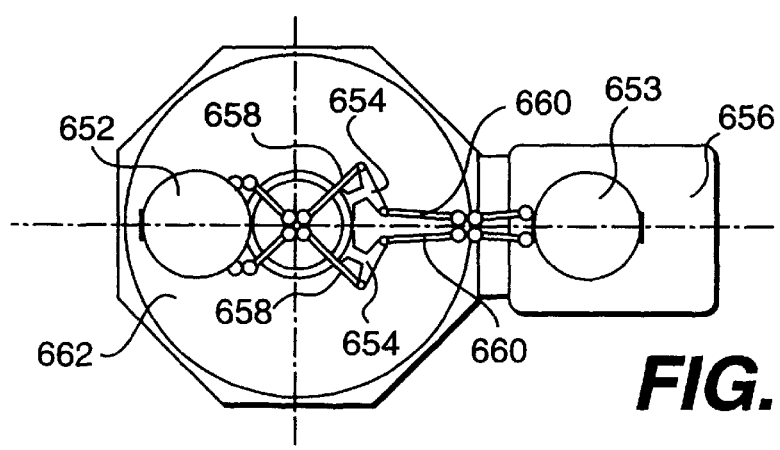

FIGS. 25(a)–25(c) are schematic diagrams showing a multistage vacuum process apparatus according to the seventh embodiment of the present invention. This embodiment is a transfer arm mechanism with two leading end arms 650 and 651 so that it can transfer two substrates 652 and 653 at one time in the transfer chamber. This transfer arm mechanism has a function to move the two leading end arms individually in different directions by two drive arms 654. In order to provide this function, driven arms 658 for moving the leading end arm 650 are joined to the other end of the drive arms 654 through coaxial bearings 659, and drive arms 660 for moving the leading end arm 651 are connected thereto through the coaxial bearings 661. The construction and structure of the plurality of arms from the driven arms 658 and 660 to the leading end arm and their joints are identical to those of the embodiments shown in FIGS. 7 and 24. The present embodiment is a multi-stage vacuum treatment apparatus for treating wafers, having a diameter of 200 mm, one by one, and a process chamber 656 and a plurality of process chambers (not shown) are arranged around a transfer chamber 662 through a plurality of gate valves 663 to 670.

FIGS. 25(a)–25(c) illustrate the following: FIG. 25(a) is a top plan view showing the state in which the drive arms 654 have an open angle of 180 degrees, that is, they are positioned on the center line 671; FIG. 25(b) is a top plan view showing the state in which the drive arms 654 have an open angle of 116 degrees and the substrate 653 is positioned close to the process chamber 656; and FIG. 25(c) is a top plan view showing the state in which the drive arms 654 have an open angle of 54 degrees and the substrate 653 is positioned in the process chamber 656.

In this structure, the center axes of the arcuate portions at one end of the drive arms are aligned with the center axes of the drive source. In the bearings 659, the drive arms 654 and the driven arms 658 are joined in such a way as to built-up with each other through the common rotating shafts. In the bearings 661, also, the drive arms 654 and the driven arms 660 are jointed in such a way as built-up with each other through the common rotation shafts.

When the open angle of the drive arms 654 is 180 degrees (as shown in FIG. 25(a)), the transfer arm can be rotationally moved as a whole on a drive axis by turning the drive arms 654 in the same direction and by the same angle so that they can be so positioned as to confront an arbitrary treatment chamber. As a result, the processed substrate in the process chamber is taken out by one leading end arm, as shown in FIGS. 25(c) and 25(b), and is turned by 180 degrees in the state of FIG. 25(a) so that the unprocessed substrate can be placed in the process chamber, as shown in FIGS. 25(b) and 25(c). It is sufficient that inside diameter of the transfer chamber 662 of the embodiment is more than 560 mm. Although the transfer chamber of the prior art, as shown in FIG. 16, for transferring the same stroke is required to have an internal diameter of 670 mm or more, the grip change of the processed and unprocessed substrates can be efficiently effected with a small internal diameter of the transfer chamber by using the transfer arm mechanism of the present invention, thus presenting a twenty-fifth feature in that the throughput can be further improved.

Figure 26A:
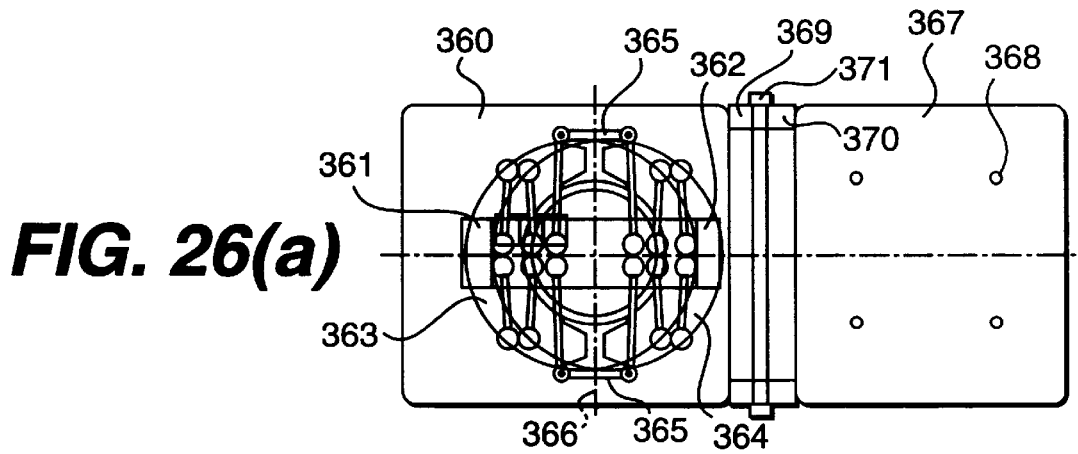
FIGS. 26(a)–26(d) (collectively FIG. 26) are schematic diagrams showing a treatment apparatus according to an eighth embodiment of the present invention.
Figure 26B:
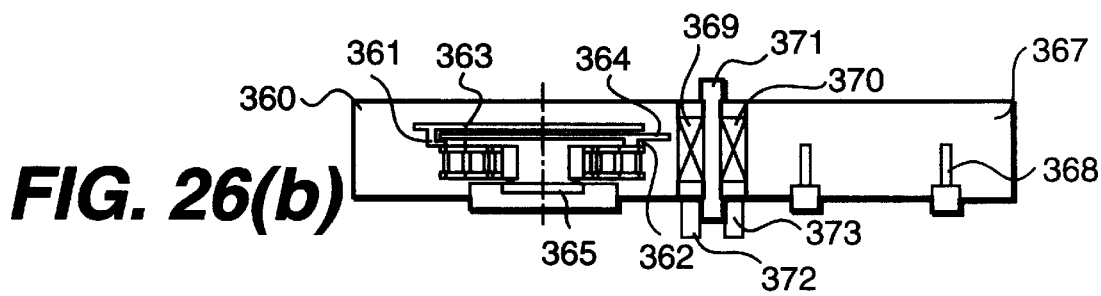

FIGS. 26(a)–26(d) are schematic diagrams showing a treatment apparatus according to an eighth embodiment of the present invention. In this embodiment, a small-sized transfer enclosure 360 equipped with two leading arms 361 and 362 is connected to a process chamber 367 of the process apparatus. FIG. 26(b) is a schematic side elevation showing the insides of the small-sized transfer chamber 360 and the process chamber 367. The small-sized transfer arms are provided in the small-sized transfer chamber 360, and wafers 363 and 364 each having a diameter of 300 mm are mounted on the leading end arms 361 and 362. The small-sized transfer arms are similar to those of the embodiment of FIG. 25 and have a transfer stroke of 450 mm.

Figure 26C:
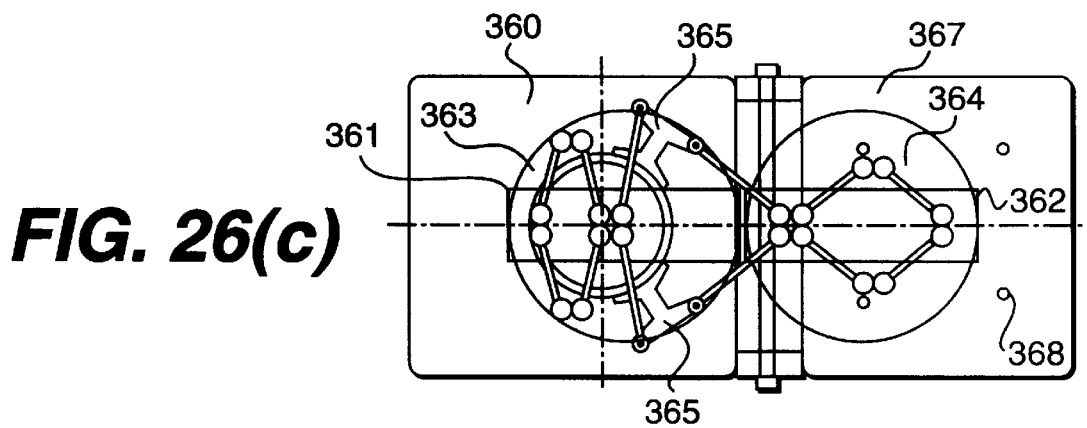
Figure 26D:
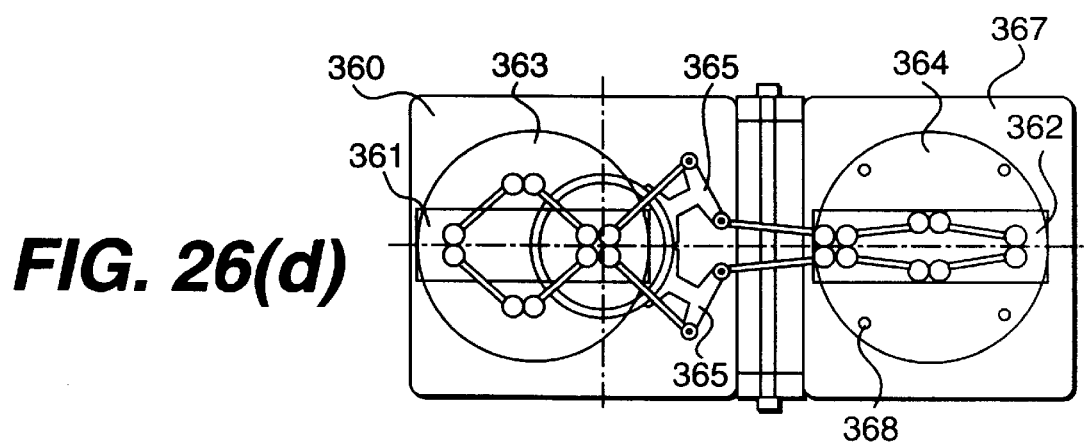

Other that FIG. 26(b), discussed above, the following is illustrated: FIG. 26(a) is a top plan view showing the state that drive arms 365 have an open angle of 180 degrees, that is, they are positioned on a center line 366; FIG. 26(c) is a top plan view showing the state that the drive arms 365 have an open angle of about 110 degrees so that the wafer 364 is now entering the process chamber 367; and FIG. 26(d) is a top plan view showing the state that the drive arms 365 have an open angle of about 90 degrees so that the wafer 364 is positioned in the treatment chamber 367 and transferred to and from a susceptor 368. By closing a gate valve 369, the inside of the small-sized transfer chamber 360 can be filled with a predetermined ambient of vacuum or an inert gas by an ambient keeping means (not shown) such as of a gas occlusion alloy, a small-sized vacuum pump and an inert gas pot. The inside of the process chamber 367 disposed in another position can be filled with an ambient of vacuum or an inert gas by a vacuum pump (not shown) or gas supply piping (not shown), with the gate valve 370 closed. The space defined by the two gate valves and the joint means 371 is cleaned and a predetermined ambient of the vacuum or inert gas is created. Then, the wafer is delivered into the process chamber by using the gate valves 369 and 370 and the opening/closing means 372 and 373. The susceptor 368 in the process chamber moves vertically to transfer the wafer to and from the leading end arms.

By designing the height of the leading end arm 361 to be higher than that of the leading end arm 360, as shown in FIG. 26(b), the leading arms and the wafer or the like are kept from contacting with each other when the open angle of the drive arms 365 is 180 degrees. The following is a list of preferable dimensions: the transfer arms have a total height h of about 15 mm; the leading end arms have a maximum height of about 15 mm; and the small-sized transfer chamber has a height of about 65 mm and an external form of about 400 mm–450 mm. When the open angle of the drive arms 365 is 180 degrees (as shown in FIG. 26(a)), the transfer arms can be rotated around the drive shafts by turning them in the same direction and by the same angle. As a result, there is presented a twenty-sixth feature in that it is possible to realize a small-sized transfer chamber in which the grip of the processed substrate and the unprocessed substrate can be changed when they are transferred.

One embodiment of a semiconductor device produced according to a manufacturing method of the present invention will now be described with reference to the manufacturing steps of a stacked type DRAM (Dynamic Random Access Memory), disclosed on pp. 23 to 31 of the "'94 Latest Semiconductor Process Technology", a special issue of the monthly magazine "Semiconductor World".

The functions of a semiconductor device, such as a DRAM, are usually imparted by repeating the process steps of forming wafer stages, wells, isolations, transistors, bit lines, capacitors and wirings. These process steps are a suitable combination of lithography, etching, heat treatment (oxidation, annealing, diffusion), ion implantation, thin film formation (CVD, sputtering, evaporation), and cleaning (removing the resist, rinsing with solution).

FIGS. 23(a)–23(g) are schematic sections showing one embodiment of the semiconductor device manufacturing method according to the present invention. Examples of the formations of bit lines and capacitors of the DRAM manufacturing method are shown. In particular, they are schematic diagrams showing the sections at the steps at which the element structure changes. In each Figure, the sectional structure of the memory cell part is shown on the left-hand side, and the sectional structure of the peripheral CMOS part is shown on the right-hand side. The manufacture process advances from FIG. 23(a) to FIG. 23(g).

The major processes are the following twenty five processes which are listed in order below in conjunction with the Figures: the first process: deposition of $SiO_2$; the second process: lithography, the third process: etching (FIG. 23-a), the fourth process: deposition of $SiO_2$, the fifth process: deposition of polycide, the sixth process: lithography (of the bit lines), the seventh process: etching (FIG. 23-b), the eighth process: deposition of $SiO_2$, the ninth process: deposition of $Si_3N_4$, the tenth process: deposition of $SiO_2$ (FIG. 23-c), the eleventh process: lithography, the twelfth process: etching, the thirteenth process: formation of poly-Si (for the storage electrodes), the fourteenth process: the deposition of $SiO_2$, the fifteenth process: the etching (as shown in FIG. 23-d), the sixteenth process: the formation of poly-Si (storage electrodes) (FIG. 23-e), the seventeenth process: deposition of $SiO_2$, the eighteenth process: etching, the nineteenth process: etching of poly-Si, the twentieth process: etching of $SiO_2$, the twenty-first process: etching of $Si_3N_4$, the twenty-second process: formation of $Ta_2O_5$ (capacitor insulating film), the twenty-third process: formation of W (poly-Si), the twenty-fourth process: lithography (plates), and the twenty-fifth process: etching.

The materials forming the individual components, as shown in FIG. 23, are as follows: Wafer 601; resist 602; $SiO_2$ (passivation film) 603; $Si_3N_4$ 604; $n^+$-layer 605; $p^+$-layer 606; poly-Si (polycide) 607; $SiO_2$ 608; $Si_3N_4$ 609; $SiO_2$ 610; poly-Si 611; $SiO_2$ 612; poly-Si 613, 614; $Ta_2O_5$ 615; and W (or poly-Si) 616.

By using the semiconductor manufacturing apparatus of the present invention in which there are suitably arranged the individual processes including $SiO_2$ deposition, poly-Si deposition, $Si_3N_4$ deposition, poly-Si etching, $SiO_2$ etching, $Si_3N_4$ etching, $Ta_2O_5$ formation and W formation, there is presented a twenty-seventh feature of the present invention in that the third to fifth processes, the seventh to tenth processes and the thirteenth to twenty-third processes of the foregoing twenty-five processes can be continuously executed while preventing the wafer from being exposed to the atmosphere. As a result, surface control, that is, removal of the natural oxidized film and contamination can be made so that treatments of the clean surface can be performed with a high reproducibility and with a high throughput. Thus, there is presented a twenty-eighth feature of the present invention in that it is possible to provide a semiconductor device of high performance and reliability.

Another semiconductor manufacturing method to which the present invention is applied can prevent the wafer surface from being contaminated by various substances such as natural oxide film or moisture. Thus, the semiconductor manufacturing method requires the surface control of various treatments of the clean surface so that it can be applied to a selective W film formation making use of chemical surface difference and to formation of Al and Cu films of low resistance contacts.

Additionally, the semiconductor manufacturing apparatus of the present invention equipped with process chambers for the poly-Si, oxide film, Al, W, trench, multi-layered resist and resist ashing can easily perform the polycide etching and the oxide film etching, thus presenting a twenty-ninth feature of the present invention in that a flash memory of high performance and reliability can be produced with a high yield.

The present invention should not be limited to the manufacture of semiconductor devices but can also be applied to a production line of a liquid crystal panel using thin film transistors (TFT).

By using the semiconductor manufacturing apparatus of the present invention equipped with the process chambers, where a liquid crystal substrate inserted from a load lock chamber is transferred into a plasma CVD process chamber to which predetermined gases are fed and the ambient in which are controlled in terms of discharge condition, and the liquid crystal substrate is subjected to the filming formation including plasma cleaning, silicon-nitride, amorphous-silicon, doped amorphous-silicon, silicon-dioxide and oxide-nitride, the manufacture can be easily performed in an environment from which the natural oxide film and the moisture is removed, thus presenting a thirtieth feature of the present invention in that a liquid crystal panel of high performance and reliability can be manufactured with a high throughput.

According to the present invention, the substrate can be transferred for the various treatments while maintaining the ambient of the various process chambers. The data of the measurements and tests of the substrate being or having been treated can be transmitted to the central control system so that the history of the substrates and the process chambers can be managed and recorded. As a result, it is possible to construct a system which can self-diagnose the individual treatment chambers and the manufacture apparatus and output proper instructions. According to the present invention, therefore, the substrate can be measured and tested while keeping and controlling the ambient of the various process chambers, thus presenting a thirty-first feature that the reliability of the semiconductor manufacturing apparatus and the steps can be drastically improved.

According to the present invention, the substrate can be transferred in a state that the ambient conditions of the buffer chamber are identical to those of the process chambers, so that its surface can be treated at an atomic layer level and can be transferred from one process chamber to another without releasing molecules and atoms from its surface. The apparatus of the prior art needs a step of evacuation to transfer the substrate, so that a small amount of atoms, and the like, are released from the surface of the substrate, making it difficult to manufacture an element having a new function in a stable manner. According to the present invention, therefore, there is presented a thirty-second feature in that the substrate can be transferred from one process chamber to the next without releasing molecules and atoms from the substrate surface.

It is noted that when an ambient gas different from that in the transfer chamber is sealed in the buffer chamber and a wafer is rotationally moved in the transfer chamber, the non-contact gap of the seal mechanism 520 shown in FIG. 14 is designed to be several microns or less to reduce the conductance. It is, therefore, obvious that the ambient pressure in the buffer chamber can be easily kept higher by several tens of torr than that in the transfer chamber and a simple shut valve is disposed on the opening side of the buffer chamber.

In the case of an etching treatment using chlorine or bromine gases, the substrate surface is liable to adsorb the treating gas. As a result, when the substrate is merely transferred into the next process chamber, cross-contamination with the gas component adsorbed on the substrate occurs. In order to prevent this cross-contamination phenomenon, it is easy, according to the present invention, to reduce the pressure in the buffer chamber to a super-high vacuum thereby to promote the desorption of the adsorbed gas, to feed a neutralization gas into the buffer chamber thereby to inactivate the unnecessary gas component, to clean the inside of the buffer chamber, and to remove plasma-ash inside the buffer chamber. Thus, there is presented a thirty-third feature of the present invention in that the cross-contamination eliminating process can be performed in a short time in the buffer chamber in which a wafer is being transferred.

These advantages are based upon the features of the present invention realizing the buffer chamber of a small capacity, which has a small-sized transfer arm mechanism and can control the ambient independently.

According to the present invention, there is further presented a thirty-fourth feature of the present invention in that a novel engineering material having a desired material characteristic gradient can be manufactured in a special environment by using a multi-treatment apparatus to control the surface of metal and resin and to suppress the fluctuation.

Figure 27A:
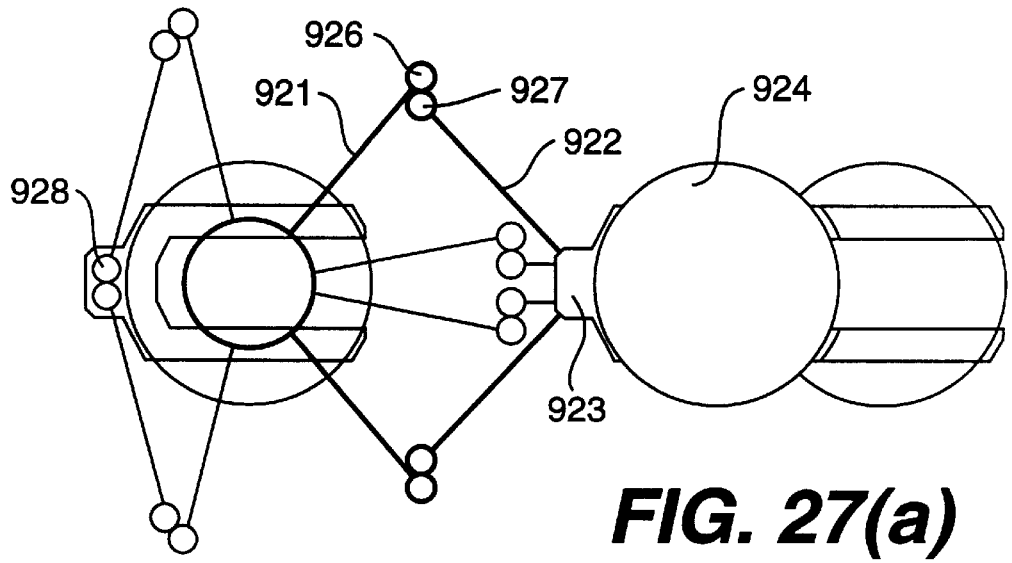
FIGS. 27(a)–27(c) (collectively FIG. 27) are schematic diagrams showing a ninth embodiment of the present invention.
Figure 27B:
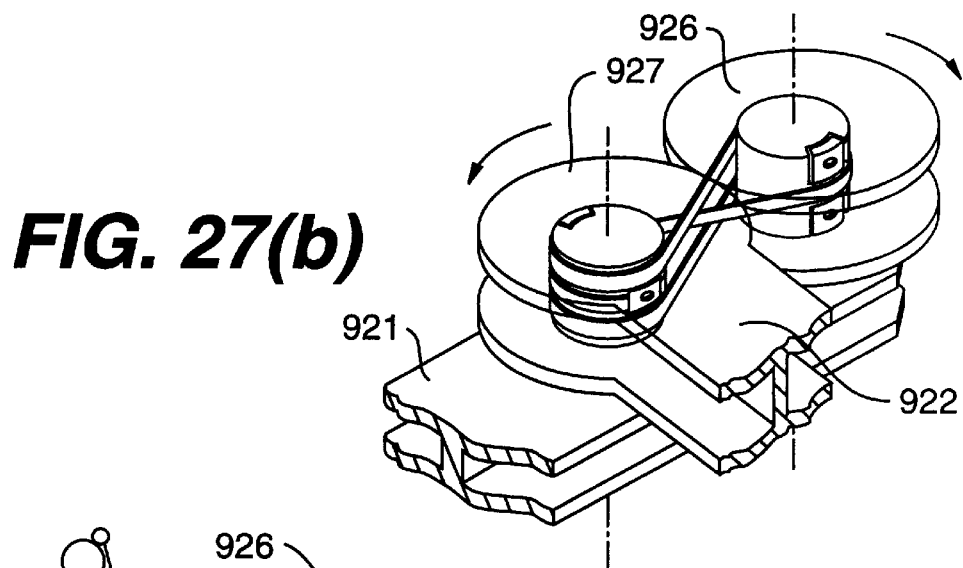
Figure 27C:
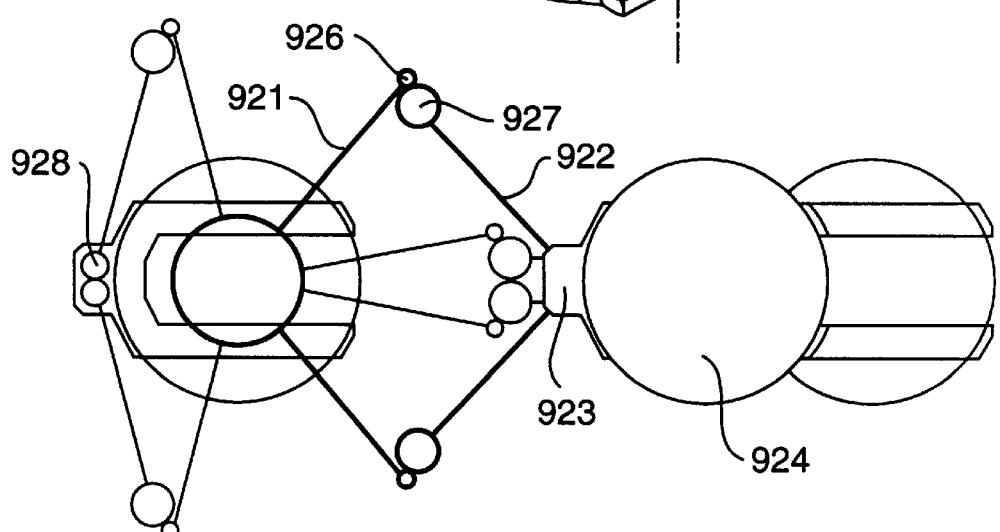
Figure 28A:
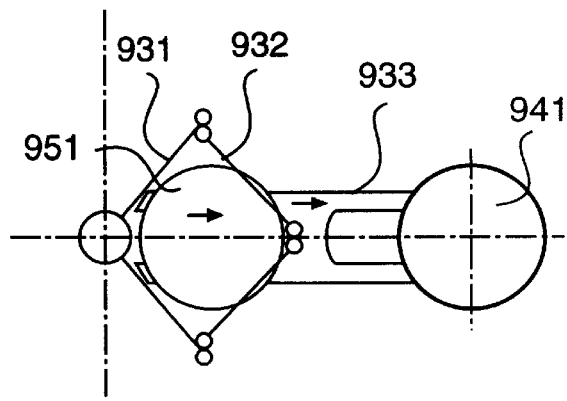
FIGS. 28(a)–28(g) (collectively FIG. 28) are schematic diagrams showing a tenth embodiment of the present invention.
Figure 28B:
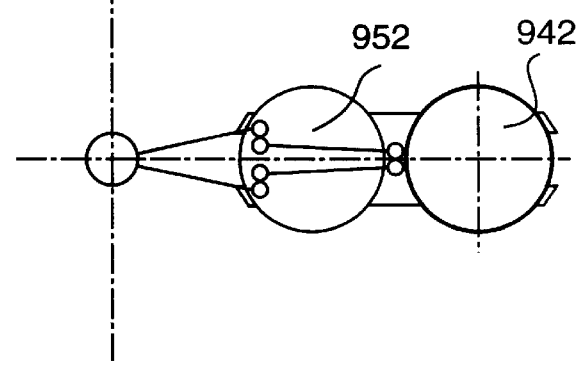
Figure 28C:
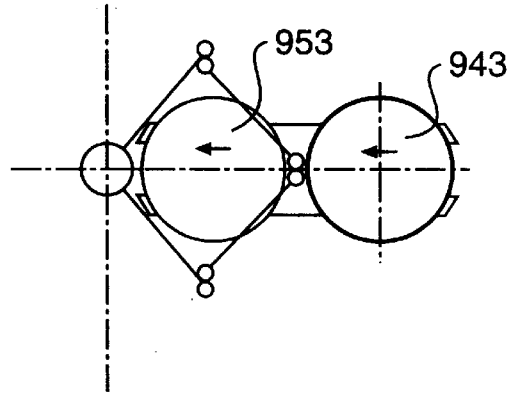
Figure 28D:
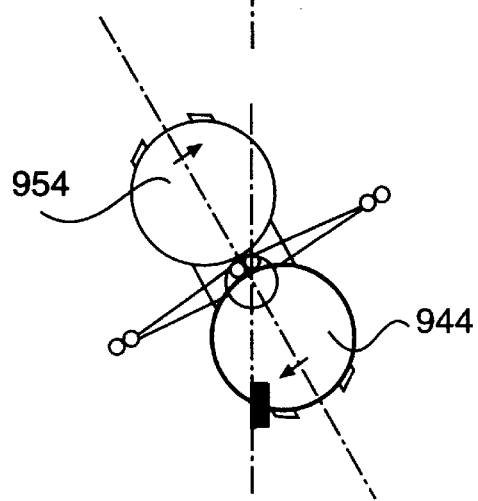
Figure 28E:
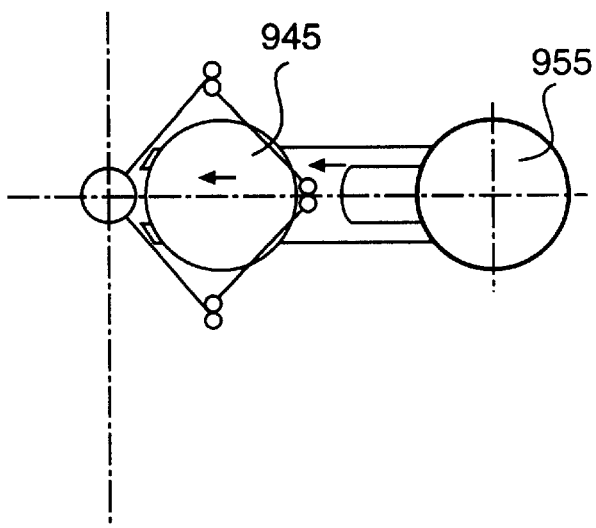
Figure 28F:
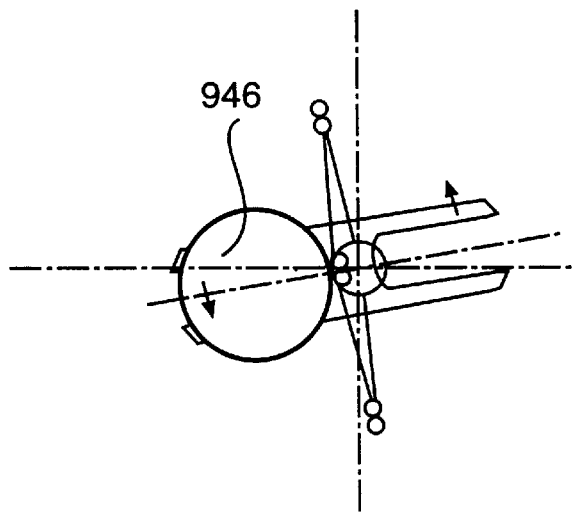
Figure 28G:
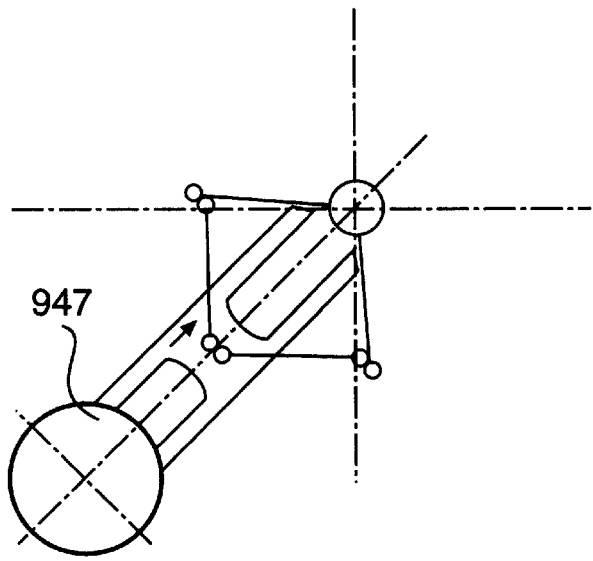

Schematic diagrams of a ninth embodiment of the present invention are shown in FIGS. 27(a)–27(c). This embodiment is a modification of the fifth embodiment of FIG. 13, in which the paired drive arms share the centers of rotation at their one end. In this embodiment, a bearing-less articulated structure is used as the joints of drive arms 921 and driven arms 922.

The states that the turning angle of the drive arms is 10 degrees, 40 degrees and 93 degrees are shown, and the parts other than the turning angle of 40 degrees are shown in a perspective view. FIG. 27(a) shows an example in which arcuate portions 926 and 927 have an equal radius of 17.5 mm. Due to the structure in which the arcuate portion 926 is fixedly mounted on one end of the drive arm 921, as perspectively shown in FIG. 27(b), there is provided an articulated structure in which the drive arms can turn up to an obtuse angle of over 90 degrees. Due to this structure, a wafer 924 can be held with its center substantially aligned with the center of the drive axis, so that the drive arms can be turned synchronously in the same direction to prevent the centrifugal force from being applied to the wafer during the turning motion for changing the axial direction of the transfer. As a result, there is presented a thirty-fifth feature that the arm mechanism can be turned at a high speed to shorten the transfer time.

Additionally, when the paired drive arms are moved in opposite directions until their turning angles become obtuse, a control method is used in which the arms are moved while maintaining the moving velocity and the turning angle of 90 degrees (the opening angle of the paired drive arms is 180 degrees) without stopping. Due to this control method, there is presented a thirty-sixth feature of the present invention in that the transfer control can be smoothed while preventing the so-called "jack-knife" phenomenon of the frogger arm mechanism.

FIG. 27(c) shows an example in which the arcuate portions 926 have a radius of 10 mm whereas the arcuate portions 927 have a radius of 25 mm. Thus, by making the radii of the two arcuate portions different, the inclination of the line joining the center axes of the two arcuate portions can be set arbitrarily when the drive arms are turned in a reverse manner.

In the case of the present embodiment, the stroke of movement can be increased while the turning angle of the drive arms in the opposite directions is small. In both FIGS. 27(a) and 27(c), the sizes of an arcuate portion 928 and a leading end arm 923 are designed to be the same value. The arcuate portion 928 has a radius of 17.5 mm. The distance between the centers of the arcuate portion 928 and the wafer is designed to be 175 mm. In this case, there is realized a structure for achieving a stroke of 775 mm from the turning center of the drive arms. In this structure, the lengths of the arms 921 and 922 and the maximum width formed when the reverse turning angle of the paired drive arms is 90 degrees are 328 mm, 275.5 mm and 691 mm in the case of FIG. 27(a), and 318 mm, 265.5 mm and 656 mm in the case of FIG. 27(c), respectively, so that the maximum width is reduced by 35 mm. As a result, the turning diameter defined by the maximum width of the drive arms of the arm mechanism can be reduced by giving different radii to the arcuate portions 926 and 927. Thus, there is presented a thirty-seventh feature that the foot print of the semiconductor manufacturing apparatus can be reduced (to about 10% in area in the case of the present embodiment).

Schematic diagrams of a tenth embodiment of the present invention are shown in FIGS. 28(a)–28(g). This embodiment is an articulated mechanism which has a leading end arm 933 capable of carrying two wafers simultaneously, in place of the leading end arm of the ninth embodiment shown in FIG. 27(*a*).

One example of the procedure of taking out a treated wafer 941 from a first process chamber (not shown), transferring and setting an untreated wafer 951 in the first process chamber, and transferring and setting the preceding treated wafer in a second process chamber (not shown) is schematically shown in FIGS. 28(*a*)–28(*g*). The wafer and leading end arm being linearly moved or turned is indicated by arrows. Moreover, the positions of movement of a single treated wafer 941 are denoted by numerals 941 to 947, and the positions of movement of a single untreated wafer 951 are denoted by numerals 951 to 955.

The transferring procedure will now be summarized. After the unprocessed wafer 951 has been transferred from a load lock chamber (not shown) to one of the leading end arms 933 capable of carrying two wafers, the leading end arm 933 is moved in the direction indicated by the arrow by turning drive arms 931 in the opposite directions, and inserted below the processed wafer 941 lying on the susceptor (not shown) in the first process chamber (FIG. 28(*a*)). This susceptor is lowered to place the processed wafer 942 on the leading arm (FIG. 28(*b*)). The processed wafer 943 is moved in the direction indicated by the arrow from the first process chamber, and transferred into the not-shown transfer chamber (FIG. 28(*c*)). In order to bring the unprocessed wafer on the leading end arm into a position where the unprocessed wafer confronts the first process chamber, the drive arms are turned in the same direction within the transfer chamber thereby to turn the arm mechanism as a whole in the direction indicated by the arrow (FIG. 28(*d*)). Incidentally, it is important to perform the turning control after the paired drive arms have been stopped through the state that their open angle is 180 degrees so as to more the wafer smoothly without any "jack-knife" phenomenon. Specifically, it is desirable to turn the drive arms, as shown in FIG. 28(*d*), while the transfer of the leading end arm is being so stopped as to offset slightly toward the radially moving side (in this case, toward the unprocessed wafer 954). After the unprocessed wafer has been made to confront the first process chamber, the drive arms are turned in the opposite directions to transfer the unprocessed wafer 955 onto the susceptor in the first process chamber, and the leading end arm is moved backward in the direction indicated by the arrow into the transfer chamber (FIG. 28(*e*)). Next, in order to bring the processed wafer 946 on the leading end arm to a position where the processed wafer 946 confronts the second process chamber (not shown), the drive arms are turned in the same direction to turn the arm mechanism as a whole in the direction indicated by the arrow (FIG. 28(*f*)). After the processed wafer has been made to confront the second process chamber, the drive arms are rotated in the opposite directions to transfer the processed wafer 947 onto the susceptor in the second process chamber, and the leading end arm is moved backward in the direction indicated by the arrow into the transfer chamber (FIG. 28(*g*)). By repeating the procedure thus far described, in the semiconductor manufacturing apparatus equipped with a plurality of process chambers, there is presented a thirty-eighth feature of the present invention in that the processed wafer and the unprocessed wafer can be transferred by the articulated mechanism having a simple structure composed of the paired drive arms and driven arms.

The following remarkable effects can be achieved by the method for manufacturing a semiconductor device according to the present invention, as has been described above. First, there is the effect of improving the reliability remarkably of the vacuum or the process gas ambient by constructing the transfer arm mechanism having no roller bearing or the like requiring lubrication by a motion transmitting method for smoothly rolling the joints composed of the arcuate portions on different center axes.

Second, there is the effect of putting a small-sized transfer arm mechanism capable of retaining a predetermined transfer stroke to practical use without any increase in the height.

Third, there is the effect of improving the reliability of the transfer arm mechanism by the construction of the simple joints for circumscribing the arcuate portions by the restraints by the winding components and for transmitting and supporting the motion.

Fourth, there is the effect of increasing the maintenance interval of the semiconductor manufacturing apparatus, or the like, by using the small-sized transfer arm mechanism to thereby reduce the maintenance time by the structure capable of assembling and adjusting a simple and strong structure easily.

Fifth, there is the effect of lowering the cost of the semiconductor manufacturing apparatus by the structure capable of assembling and adjusting a simple and strong structure easily.

Sixth, there is the effect of exploiting the process area such as of a clean room of a limited area effectively by reducing the floor area of the semiconductor manufacturing apparatus by the small-sized transfer arm mechanism.

Seventh, there is the effect of putting a simple small-sized transfer arm mechanism capable of moving the transfer arms linearly merely by controlling and rotating one axis.

Eighth, there is the effect of putting a small-sized transfer chamber capable of transferring substrates one by one in a short time without any contamination by the small-sized transfer arm mechanism utilizing the small space below a substrate of a large diameter.

Ninth, there is the effect of putting a small-sized transfer arm mechanism capable of moving in a two-dimensional plane merely by the rotational control of one axis by constructing a pair of drive arms their center axes are aligned with each other by joints having a generally arcuate shape.

Tenth, there is the effect of putting a small-sized transfer arm mechanism of high reliability capable of being provided in a buffer chamber exposed to various ambient conditions, by a motion transmitting mechanism having a structure of high ambient resistance conditions such as the baking resistance or the corrosion resistance.

Eleventh, there is the effect of making it possible to manufacture a semiconductor device of high performance by a multi-stage type process apparatus having a small-sized buffer chamber in a transfer chamber.

Twelfth, there is the effect of making it possible to treat wafers in a short time period or to treat them one by one by shortening the time period taken to reset the process, the ambient and the time period of over several hundreds of various semiconductor device manufacturing steps.

Thirteenth, there is the effect of producing a flash memory of high performance and reliability with a high yield by conducting the manufacture steps of etching poly-cide and etching an oxide film continuously.

Fourteenth, there is the effect of making it possible to produce a liquid crystal panel of high performance and reliability with a high throughput by enabling the manufacture in an environment from which are removed natural oxide film, moisture and contamination.

Fifteenth, there is the effect of improving the production yield by preventing a semiconductor device from being contaminated during the manufacture process by a multi-stage process apparatus, a small-sized transfer chamber or various process apparatus for manufacturing semiconductor devices using the small-sized transfer arm mechanism.

Sixteenth, there is the effect of improving the throughput of the manufacture process by decreasing the manufacture steps of the semiconductor device using the semiconductor manufacturing apparatus provide with the small-sized transfer arm mechanism.

Seventeenth, there is the effect of making it possible to produce a semiconductor device of high performance with a high throughput by controlling the surface of a substrate at the atomic level easily and highly accurately in a short time period by transferring the substrate while keeping the ambient conditions of a plurality of process chambers in a constant state.

Eighteenth, there is the effect of providing a semiconductor device of high performance, a liquid crystal display plate or an engineering material by making it possible to provide a semiconductor device or the like featured by high performance and reliability, with a high throughput.

Nineteenth, there is the effect of making it possible to shorten the transfer time period by turning an arm mechanism, while aligning the center of the wafer with that of a drive shaft, by an articulated structure in which the drive arms can turn by an obtuse angle more than 90 degrees.

Twentieth, there is the effect of making a smooth transfer control possible without any "jack-knife" phenomenon by a control method by which the arms are moved while keeping the moving velocity without being stopped in the state that the turning angle is 90 degrees.

Finally, twenty-first, there is the effect of making it possible to transfer a processed wafer and an unprocessed wafer in a short time period by the articulated mechanism which is composed of a pair of drive arms and driven arms and a leading end arm for carrying two wafers in the semiconductor manufacturing device equipped with a plurality of process chambers.

While the present invention has been described above in connection with the preferred embodiments, one of ordinary skill in the art would be enabled by this disclosure to make various modification to these embodiments and still be within the scope and spirit of the present invention as embodied in the appended claims.

What is claimed is:

1. A method comprising the steps of:
   providing a process chamber; and
   transferring a wafer to and from the process chamber using a transfer mechanism having a joint wherein a first arcuate portion and a second arcuate portion are rolled in contact with each other by restraints attracting the arcuate portions toward each other in a direction perpendicular to center axes of the arcuate portions.

2. The method according to claim 1, wherein the transfer mechanism is located in a transfer chamber connected to the process chamber.

3. The method according to claim 2, wherein said step of transferring a wafer to and from the process chamber is accomplished by using forces applied to winding components of the joint.

4. A method of manufacturing a semiconductor device, comprising the steps of:
   processing a semiconductor wafer in a process chamber that is connected to a transfer chamber; and
   transferring said semiconductor wafer into and out of said process chamber by using a transfer arm disposed in said transfer chamber, wherein said transfer arm has a joint wherein a first arcuate portion and a second arcuate portion are rolled in contact with each other by restraints attracting the arcuate portions toward each other in a direction perpendicular to center axes of the arcuate portions.

5. A method of manufacturing a semiconductor device according to claim 4, further comprising the step of cleaning an inside portion of at least one of the transfer chamber, and the process chamber by using an inert gas.

6. A method for manufacturing a semiconductor device according to claim 4, further comprising the steps of:
   starting treatment of the semiconductor wafer under a first ambient condition when the semiconductor wafer is transferred into said process chamber; and
   continuing treatment of the semiconductor wafer under a second ambient condition different from the first ambient condition.

7. A semiconductor wafer transfer enclosure having an inside portion which is kept gas-tight under an ambient condition different from that of an area outside the enclosure, comprising:
   a transfer arm disposed in said enclosure and being capable of transferring a semiconductor wafer and having a joint wherein a first arcuate portion and a second arcuate portion are rolled in contact with each other by restraints attracting the arcuate portions toward each other in a direction perpendicular to center axes of the arcuate portions.

8. A semiconductor manufacturing apparatus comprising:
   a process chamber;
   a transfer chamber positioned near the process chamber; and
   means for transferring an article from said process chamber to said transfer chamber which includes at least two transfer arms interconnected by a joint wherein a first arcuate portion and a second arcuate portion are rolled in contact with each other by restraints attracting the arcuate portions toward each other in a direction perpendicular to center axes of the arcuate portions.

9. The semiconductor manufacturing apparatus according to claim 8, wherein each of said transfer arms has a height h and wherein said joint also has a height h.

10. A method according to claim 1, wherein the first arcuate portion has a first center axis, the second arcuate portion has a second center axis, and said restraints are formed using band-shaped winding components which are wound around the first center axis portion and the second center axis portion.

11. A method according to claim 4, wherein the first arcuate portion has a first center axis, the second arcuate portion has a second center axis, and said restraints are formed using band-shaped winding components which are wound around the first center axis portion and the second center axis portion.

12. A method according to claim 7, wherein the first arcuate portion has a first center axis, the second arcuate portion has a second center axis, and said restraints are formed using band-shaped winding components which are wound around the first center axis portion and the second center axis portion.

13. A method according to claim 8, wherein the first arcuate portion has a first center axis, the second arcuate portion has a second center axis, and said restraints are formed using band-shaped winding components which are wound around the first center axis portion and the second center axis portion.

14. A method according to claim 1, wherein the first arcuate portion has a first center axis, the second arcuate portion has a second center axis, and the first center axis is rotated by a drive source.

15. A method according to claim 14, wherein the first arcuate portion has a first center axis, the second arcuate portion has a second center axis, and the first center axis is rotated by a drive source.

16. A method according to claim 7, wherein the first arcuate portion has a first center axis, the second arcuate portion has a second center axis, and the first center axis is rotated by a drive source.

17. A method according to claim 8, wherein the first arcuate portion has a first center axis, the second arcuate portion has a second center axis, and the first center axis is rotated by a drive source.

* * * * *